United States Patent
Chiang et al.

(10) Patent No.: US 11,729,987 B2
(45) Date of Patent: Aug. 15, 2023

(54) MEMORY ARRAY SOURCE/DRAIN ELECTRODE STRUCTURES

(71) Applicant: Taiwan Semiconductor Manufacturing Co., Ltd., Hsinchu (TW)

(72) Inventors: Kuo-Chang Chiang, Hsinchu (TW); Hung-Chang Sun, Kaohsiung (TW); Sheng-Chih Lai, Hsinchu (TW); TsuChing Yang, Taipei (TW); Yu-Wei Jiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 99 days.

(21) Appl. No.: 17/119,409

(22) Filed: Dec. 11, 2020

(65) Prior Publication Data

US 2021/0408045 A1 Dec. 30, 2021

Related U.S. Application Data

(60) Provisional application No. 63/046,002, filed on Jun. 30, 2020.

(51) Int. Cl.
*H10B 51/20* (2023.01)
*H01L 27/12* (2006.01)
(Continued)

(52) U.S. Cl.
CPC ............ *H10B 51/20* (2023.02); *G11C 11/223* (2013.01); *H01L 27/1225* (2013.01); *H01L 29/66742* (2013.01); *H01L 29/7869* (2013.01)

(58) Field of Classification Search
CPC .......... H01L 29/66742; H01L 29/7869; H01L 29/792; H01L 29/78391; H01L 27/11587;
(Continued)

(56) References Cited

U.S. PATENT DOCUMENTS 6,204,158 B1    3/2001  Hendrix et al.
8,530,976 B1 *  9/2013  Ratnakumar ....... H01L 29/7833
                                                    257/407
(Continued)

FOREIGN PATENT DOCUMENTS

KR    20150038352 A    4/2015
KR    20150118395 A    10/2015
(Continued)

OTHER PUBLICATIONS

Kim et al., "Synergistic Improvement of Long-Term Plasticity in Photonic Synapses Using Ferroelectric Polarization in Hafnia-Based Oxide-Semiconductor Transistors" Advanced Materials, Feb. 2020, 32, Pohang, Korea, pp. 1-6.
(Continued)

*Primary Examiner* — Natalia A Gondarenko
(74) *Attorney, Agent, or Firm* — Slater Matsil, LLP

(57) ABSTRACT

A memory cell includes a thin film transistor over a semiconductor substrate, the thin film transistor including: a memory film contacting a word line; and an oxide semiconductor (OS) layer contacting a source line and a bit line, wherein the memory film is disposed between the OS layer and the word line, wherein the source line and the bit line each comprise a first conductive material touching the OS layer, and wherein the first conductive material has a work function less than 4.6. The memory cell further includes a dielectric material separating the source line and the bit line.

20 Claims, 63 Drawing Sheets

(51) Int. Cl.
*H01L 29/786* (2006.01)
*H01L 29/66* (2006.01)
*G11C 11/22* (2006.01)

(58) Field of Classification Search
CPC .............. H01L 27/1159; H01L 27/1237; H01L 27/124; H01L 27/1122; H01L 27/11519; H01L 27/11521; H01L 2924/01029; H01L 2924/0132–0133; H01L 2924/13069; H01L 2924/1438; H01L 27/11597; H01L 27/1225; H01L 27/1229; H01L 27/11582; H01L 29/40117; H01L 29/40114; H01L 29/66833; H01L 27/1052; H01L 27/1085; H01L 27/10855; H01L 27/1128; H01L 27/11507; H01L 27/1157; H01L 27/1524; H01L 27/11529; H01L 27/11524; H01L 27/11556; H01L 27/11578; H10B 51/10; H10B 51/20; H10B 51/30; H10B 51/40; H10B 51/50; H10B 43/10; H10B 43/20; H10B 43/27
USPC ................. 257/43, 326, 329, 368, E29.262
See application file for complete search history.

(56) References Cited

U.S. PATENT DOCUMENTS

| | | | |
|---|---|---|---|
| 9,318,315 | B2 | 4/2016 | Mueller et al. |
| 10,367,003 | B2 | 7/2019 | Kang et al. |
| 10,910,393 | B2 * | 2/2021 | Lai .................... H01L 27/11578 |
| 2004/0026725 | A1 | 2/2004 | Gnadinger |
| 2008/0258140 | A1 * | 10/2008 | Lee .................... H01L 21/02554 257/43 |
| 2008/0258141 | A1 * | 10/2008 | Park .................. H01L 29/78621 257/E33.013 |
| 2010/0133601 | A1 | 6/2010 | Miyazaki et al. |
| 2010/0330738 | A1 | 12/2010 | Uchiyama et al. |
| 2011/0180796 | A1 | 7/2011 | Yamazaki et al. |
| 2011/0215317 | A1 | 9/2011 | Yamazaki et al. |
| 2012/0181534 | A1 | 7/2012 | Hatano |
| 2012/0228687 | A1 | 9/2012 | Noda |
| 2013/0083588 | A1 | 4/2013 | Takemura |
| 2013/0320344 | A1 * | 12/2013 | Kim .................... H01L 29/4908 257/57 |
| 2015/0037934 | A1 | 2/2015 | Yamazaki |
| 2015/0132944 | A1 | 5/2015 | Park |
| 2015/0206978 | A1 | 7/2015 | Miki et al. |
| 2015/0311256 | A1 | 10/2015 | Rabkin et al. |
| 2015/0357343 | A1 | 12/2015 | Ishida et al. |
| 2016/0336068 | A1 | 11/2016 | Yamazaki et al. |
| 2017/0077308 | A1 | 3/2017 | Yamazaki et al. |
| 2017/0179026 | A1 | 6/2017 | Toyama et al. |
| 2017/0221910 | A1 | 8/2017 | Chen et al. |
| 2017/0236848 | A1 | 8/2017 | Yamazaki |
| 2017/0337884 | A1 | 11/2017 | Kurokawa |
| 2017/0345940 | A1 * | 11/2017 | Suzuki ................ H01L 29/7869 |
| 2018/0130823 | A1 | 5/2018 | Kim |
| 2018/0145180 | A1 | 5/2018 | Koezuka et al. |
| 2018/0151583 | A1 | 5/2018 | Lupino et al. |
| 2018/0151588 | A1 | 5/2018 | Tsutsumi et al. |
| 2018/0269210 | A1 | 9/2018 | Tezuka et al. |
| 2018/0315794 | A1 | 11/2018 | Kamalanathan et al. |
| 2018/0350837 | A1 | 12/2018 | Yoo et al. |
| 2019/0074286 | A1 | 3/2019 | Singh et al. |
| 2019/0148393 | A1 | 5/2019 | Lue |
| 2019/0326308 | A1 | 10/2019 | Pu et al. |
| 2020/0018541 | A1 | 1/2020 | Villanueva et al. |
| 2020/0075631 | A1 * | 3/2020 | Dong .................. H01L 29/7827 |
| 2020/0091171 | A1 | 3/2020 | Tokuhira et al. |
| 2020/0098776 | A1 | 3/2020 | Sugisaki et al. |
| 2020/0105635 | A1 | 4/2020 | Yu et al. |
| 2020/0185411 | A1 | 6/2020 | Herner et al. |
| 2020/0212068 | A1 * | 7/2020 | Lee .................... H01L 29/42372 |
| 2020/0227727 | A1 | 7/2020 | Li |
| 2021/0066348 | A1 | 3/2021 | Prasad et al. |
| 2021/0074727 | A1 | 3/2021 | Prasad et al. |
| 2021/0082955 | A1 | 3/2021 | Rajashekhar et al. |
| 2021/0174856 | A1 | 6/2021 | Chen et al. |
| 2021/0175253 | A1 | 6/2021 | Han et al. |
| 2021/0327890 | A1 | 10/2021 | Makala et al. |
| 2021/0408044 | A1 * | 12/2021 | Chiang ................ G11C 11/2255 |

FOREIGN PATENT DOCUMENTS

| | | |
|---|---|---|
| KR | 20180059271 A | 6/2018 |
| KR | 20190036077 A | 4/2019 |
| TW | 201244065 A | 11/2012 |
| TW | 201517236 A | 5/2015 |
| TW | 201631627 A | 9/2016 |
| TW | 201703264 A | 1/2017 |
| TW | 201727836 A | 8/2017 |
| TW | 201804615 A | 2/2018 |
| TW | 201830586 A | 8/2018 |
| TW | 201843811 A | 12/2018 |
| TW | 201904029 A | 1/2019 |
| TW | 201931577 A | 8/2019 |
| TW | I673831 B | 10/2019 |
| TW | 201942980 A | 11/2019 |
| TW | 202010102 A | 3/2020 |
| TW | 202013684 A | 4/2020 |
| WO | 0209191 A2 | 1/2002 |
| WO | 2018004581 A1 | 1/2018 |
| WO | 2018136734 A1 | 7/2018 |
| WO | 2019125352 A1 | 6/2019 |
| WO | 2019152226 A1 | 8/2019 |

OTHER PUBLICATIONS

Wei, et al., Chemical solution deposition of ferroelectric Sr:HfO2 film from inorganic salt precursors Journal of Alloys and Compounds, 731 (2018), China, available online Sep. 25, 2017, pp. 546-553.

* cited by examiner

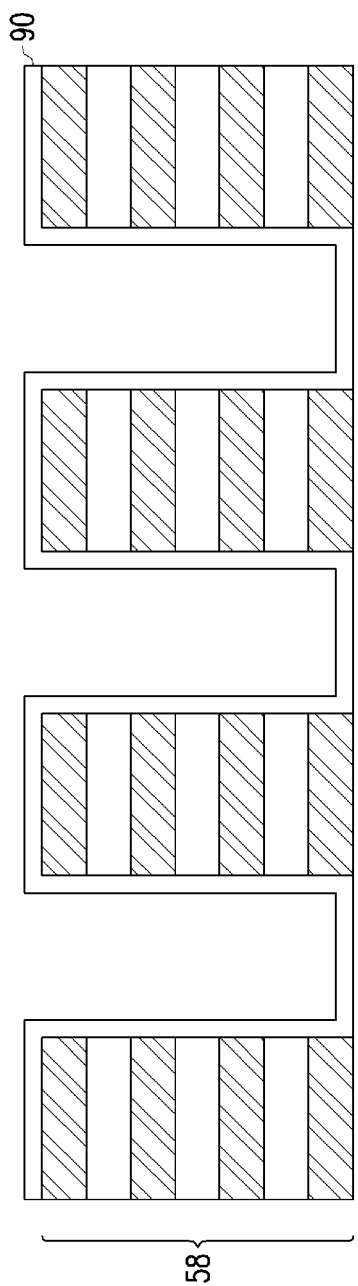

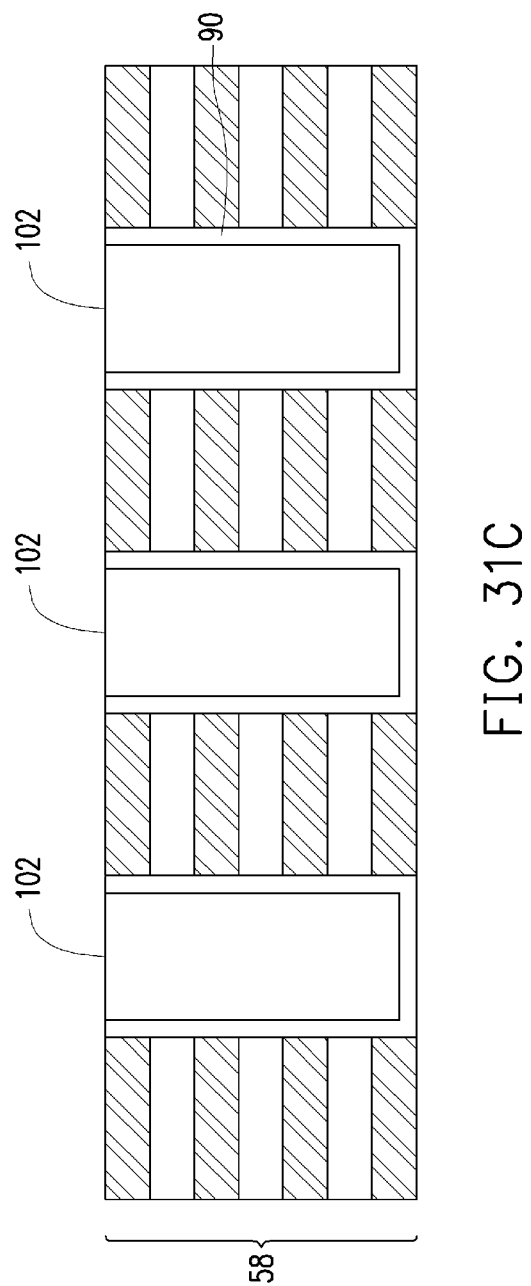

US 11,729,987 B2

MEMORY ARRAY SOURCE/DRAIN ELECTRODE STRUCTURES

PRIORITY CLAIM AND CROSS-REFERENCE

This application claims the benefit of U.S. Provisional Application No. 63/046,002, filed on Jun. 30, 2020, which application is hereby incorporated herein by reference.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is Ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3A, 3B, 4, 5, 6, 7, 8, 9, 10, 11, 12A, 12B, 13, 14, 15, 16, 17A, 17B, 18A, 18B, 19A, 19B, 20, 21, 22, 23A, 23B, 23C, 24A, 24B, 25A, 25B, 26A, 26B, 27A, 27B, 28, 29A, 29B, 30A, 30B, 30C, and 30D illustrate varying views of manufacturing a memory array in accordance with some embodiments.

FIGS. 31A, 31B, 31C illustrate varying views of a memory array in accordance with some embodiments.

DETAILED DESCRIPTION

Figure 1A:
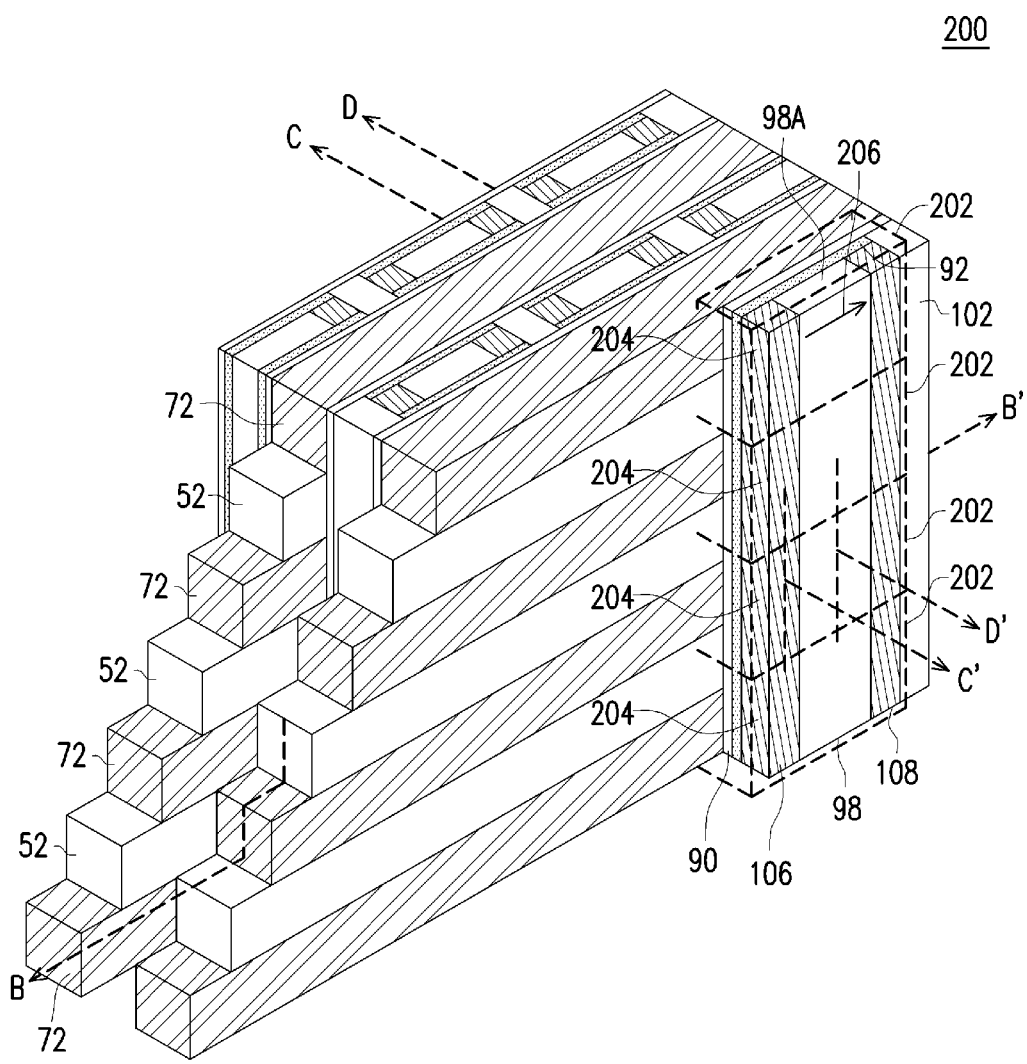
FIGS. 1A, 1B, and 1C illustrate a perspective view, a circuit diagram, and a top down view of a memory array in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a 3D memory array with a plurality of vertically stacked memory cells. Each memory cell includes thin film transistor (TFT) having a word line region acting as a gate electrode, a bit line region acting as a first source/drain electrode, and a source line region acting as a second source/drain electrode. Each TFT further includes an insulating memory film (e.g., as a gate dielectric) and an oxide semiconductor (OS) channel region.

Figure 1B:
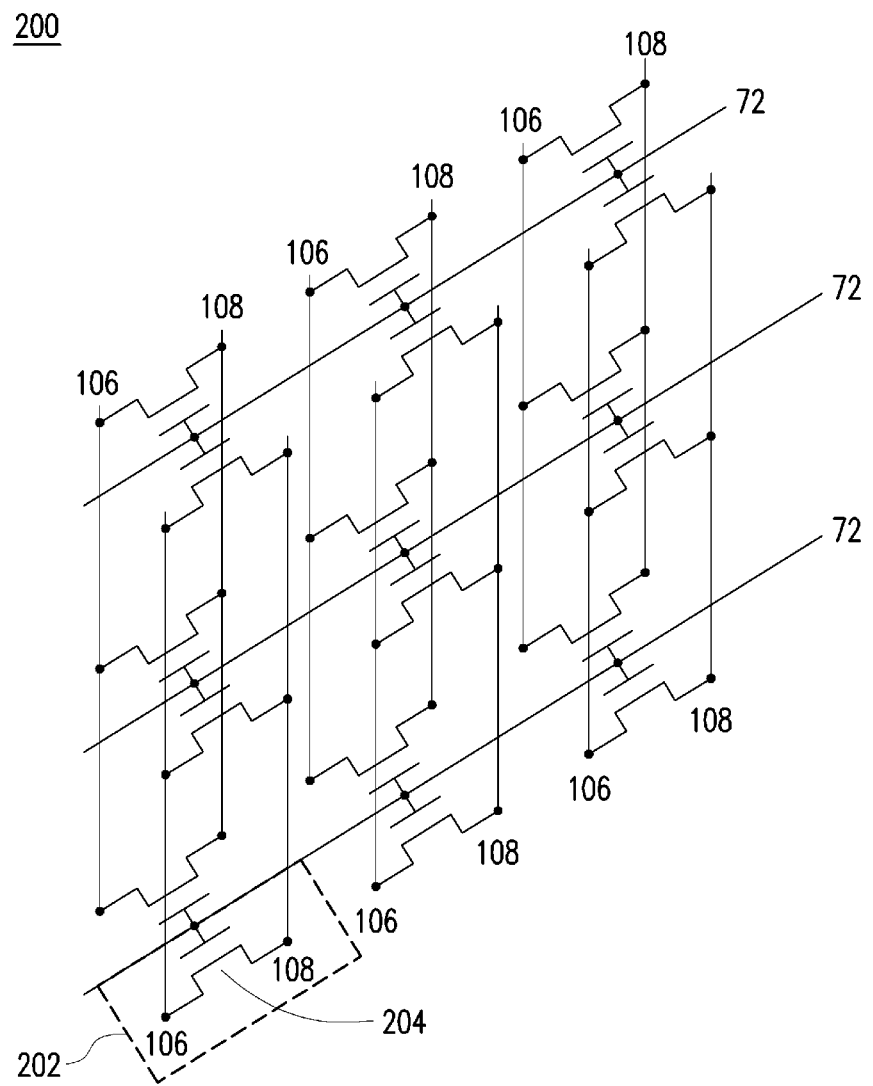
Figure 1C:
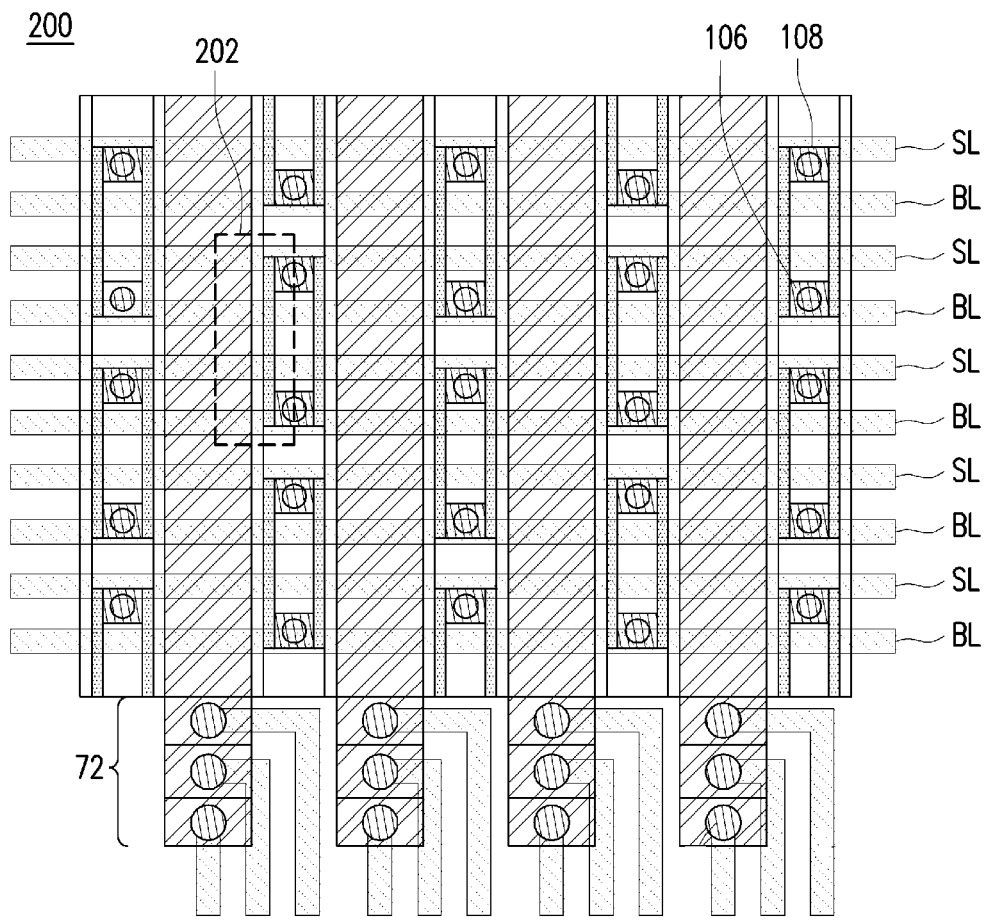

FIGS. 1A, 1B, and 1C illustrate examples of a memory array according to some embodiments. FIG. 1A illustrates an example of a portion of the memory array 200 in a three-dimensional view; FIG. 1B illustrates a circuit diagram of the memory array 200; and FIG. 1C illustrates a top down view of the memory array 200 in accordance with some embodiments. The memory array 200 includes a plurality of memory cells 202, which may be arranged in a grid of rows and columns. The memory cells 202 may further stacked vertically to provide a three dimensional memory array, thereby increasing device density. The memory array 200 may be disposed in the back end of line (BEOL) of a semiconductor die. For example, the memory array may be disposed in the interconnect layers of the semiconductor die, such as, above one or more active devices (e.g., transistors) formed on a semiconductor substrate. In some embodiments, the memory array may be disposed in a top metal layer of the interconnect layers, such as above all other interconnect layers in the semiconductor die. In other embodiments, the memory array may be disposed in an intermediate metal layer of the interconnect layers, and the semiconductor die may include, for example, additional interconnect layers above and below the memory array.

In some embodiments, the memory array 200 is a flash memory array, such as a NOR flash memory array, or the like. Each memory cell 202 may include a thin film transistor (TFT) 204 with an insulating, memory film 90 as a gate dielectric. In some embodiments, a gate of each TFT 204 is electrically coupled to a respective word line, a first source/drain region of each TFT 204 is electrically coupled to a respective bit line, and a second source/drain region of each TFT 204 is electrically coupled to a respective source line, which electrically couples the second source/drain region to ground. The memory cells 202 in a same horizontal row of the memory array 200 may share a common word line while the memory cells 202 in a same vertical column of the memory array 200 may share a common source line and a common bit line.

The memory array 200 includes a plurality of vertically stacked conductive lines 72 (e.g., word lines) with dielectric layers 52 disposed between adjacent ones of the conductive lines 72. The conductive lines 72 extend in a direction parallel to a major surface of an underlying substrate (not explicitly illustrated in FIGS. 1A and 1B). The conductive lines 72 may have a staircase configuration such that lower conductive lines 72 are longer than and extend laterally past endpoints of upper conductive lines 72. For example, in FIG. 1A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 200, and conductive contacts may be made to an exposed portion of each of the conductive lines 72.

The memory array 200 further includes a plurality of conductive lines 106 (e.g., bit lines(BLs, see also FIG. 1C)) and conductive lines 108 (e.g., source lines (SLs, see also FIG. 1C)). The conductive lines 106 and 108 may each extend in a direction perpendicular to the conductive lines 72. A dielectric material 98 is disposed between and isolates adjacent ones of the conductive lines 106 and the conductive lines 108.

Pairs of the conductive lines 106 and 108 along with an intersecting conductive line 72 define boundaries of each memory cell 202, and a dielectric material 102 is disposed between and isolates adjacent pairs of the conductive lines 106 and 108. In some embodiments, the conductive lines 108 are electrically coupled to ground. Although FIG. 1A illustrates a particular placement of the conductive lines 106 relative the conductive lines 108, it should be appreciated that the placement of the conductive lines 106 and 108 may be flipped in other embodiments.

In some embodiments, conductive lines 106 and 108 maybe formed of a material that reduces contact resistance in the memory cells 202. For example, in some embodiments, the conductive lines 106 and 108 may comprise a low work function material (e.g., less than 4.6). As part of forming the conductive lines 106 and 108, an annealing process may be performed to form a poly-crystalline, metal-comprising region in the channel region at a boundary between the OS layer 92 and the conductive lines 106 and 108. As a result, the poly-crystalline region touching the conductive lines 106 and 108 may be a low resistivity region regardless of the phase (e.g., crystalline or amorphous) of remaining portions of the OS layer 92, thereby reducing contact resistance in the TFTs 204. In some embodiments, the conductive lines 106 and 108 may comprise a copper-based alloy with a low resistivity with a reduced tendency to oxidize (e.g., less susceptible to oxidation than pure copper). In embodiments where the conductive lines 106 and 108 comprise a copper based alloy with low resistivity, current driving may further be improved in the TFTs 204.

In some embodiments, at least portions of the conductive lines 106 and 108 in contact with the OS layer 92 may be a low work function material capable of inducing surface metallization of the OS layer 92 to reduce contact resistance at interfaces between the OS layer 92 and the conductive lines 106/108. In some embodiments, the conductive lines 106 and 108 may comprise an alloy at an interface with the OS layer 92, and the alloy may have a low resistivity with a reduced tendency to oxidize (e.g., less susceptible to oxidation than pure copper). Various embodiments may achieve advantages. For example, as part of forming the conductive lines 106/108, an annealing process may be performed to form a poly-crystalline, metal oxide region in the OS layer 92 at a boundary between the OS layer 92 and the conductive lines 106/108. The poly-crystalline regions may be formed by the interactive between the low work function material and the OS layer 92, which is triggered by the annealing process. As a result, the poly-crystalline region touching the conductive lines 106/108 may be a low resistivity region regardless of the phase (e.g., crystalline or amorphous) of remaining portions of the OS layer 92, thereby reducing contact resistance. In embodiments where the conductive lines 106 and 108 comprise a copper based alloy with low resistivity, current driving may further be improved.

As discussed above, the memory array 200 may also include an oxide semiconductor (OS) layer 92. The OS layer 92 may provide channel regions for the TFTs 204 of the memory cells 202. For example, when an appropriate voltage (e.g., higher than a respective threshold voltage ($V_{th}$) of a corresponding TFT 204) is applied through a corresponding conductive line 72, a region of the OS layer 92 that intersects the conductive line 72 may allow current to flow from the conductive lines 106 to the conductive lines 108 (e.g., in the direction indicated by arrow 206). The OS layer 92 may have a relatively low hydrogen concentration, such as in a range of about $10^{20}$ to about $10^{22}$ atoms per cubic centimeter as measured by Time-of-Flight Secondary Ion Mass Spectrometry (ToF-SIMS) analysis. As a result, stability of the TFTs 204 may be improved compared to TFTs with OS layers having a higher concentration of hydrogen.

A memory film 90 is disposed between the conductive lines 72 and the OS layer 92, and the memory film 90 may provide gate dielectrics for the TFTs 204. In some embodiments, the memory film 90 comprises a ferroelectric material, such as a hafnium oxide, hafnium zirconium oxide, silicon-doped hafnium oxide, or the like. Accordingly, the memory array 200 may also be referred to as a ferroelectric random access memory (FERAM) array. Alternatively, the memory film 90 may be a multilayer structure comprising a layer of $SiN_x$ between two $SiO_x$ layers (e.g., an ONO structure), a different ferroelectric material, a different type of memory layer (e.g., capable of storing a bit), or the like.

In embodiments where the memory film 90 comprises a ferroelectric material, the memory film 90 may be polarized in one of two different directions, and the polarization direction may be changed by applying an appropriate voltage differential across the memory film 90 and generating an appropriate electric field. The polarization may be relatively localized (e.g., generally contained within each boundaries of the memory cells 202), and a continuous region of the memory film 90 may extend across a plurality of memory cells 202. Depending on a polarization direction of a particular region of the memory film 90, a threshold voltage of a corresponding TFT 204 varies, and a digital value (e.g., 0 or 1) can be stored. For example, when a region of the memory film 90 has a first electrical polarization direction, the corresponding TFT 204 may have a relatively low threshold voltage, and when the region of the memory film 90 has a second electrical polarization direction, the corresponding TFT 204 may have a relatively high threshold voltage. The difference between the two threshold voltages may be referred to as the threshold voltage shift. A larger threshold voltage shift makes it easier (e.g., less error prone) to read the digital value stored in the corresponding memory cell 202.

To perform a write operation on a memory cell 202 in such embodiments, a write voltage is applied across a portion of the memory film 90 corresponding to the memory cell 202. The write voltage can be applied, for example, by applying appropriate voltages to a corresponding conductive line 72 (e.g., the word line) and the corresponding conductive lines 106/108 (e.g., the bit line/source line). By applying the write voltage across the portion of the memory film 90, a polarization direction of the region of the memory film 90 can be changed. As a result, the corresponding threshold voltage of the corresponding TFT 204 can also be switched from a low threshold voltage to a high threshold voltage or vice versa, and a digital value can be stored in the memory cell 202. Because the conductive lines 72 intersect the conductive lines 106 and 108, individual memory cells 202 may be selected for the write operation.

To perform a read operation on the memory cell 202, a read voltage is applied to the corresponding conductive line 72 (e.g., the world line/gate electrodes of the TFT 204), and a current is applied to a corresponding conductive line 106 (e.g., the bit line). The read voltage may be between the low and high threshold voltages of the TFT 204. Depending on the polarization direction of the corresponding region of the FE material 90, the TFT 204 of the memory cell 202 may or may not be turned on. As a result, the conductive line 106 may or may not be discharged through the conductive line 108 (e.g., a source line that is coupled to ground), and the digital value stored in the memory cell 202 can be determined. Because the conductive lines 72 intersect the conductive lines 106 and 108, individual memory cells 202 may be selected for the read operation.

FIG. 1A further illustrates reference cross-sections of the memory array 200 that are used in later figures. Cross-section B-B' is along a longitudinal axis of conductive lines 72 and in a direction, for example, parallel to the direction of current flow of the TFTs 204. Cross-section C-C' is perpendicular to cross-section B-B' and is parallel to a longitudinal axis of the conductive lines 72. Cross-section C-C' extends through the conductive lines 106. Cross-section D-D' is parallel to cross-section C-C' and extends through the dielectric material 102. Subsequent figures refer to these reference cross-sections for clarity.

Figure 2:
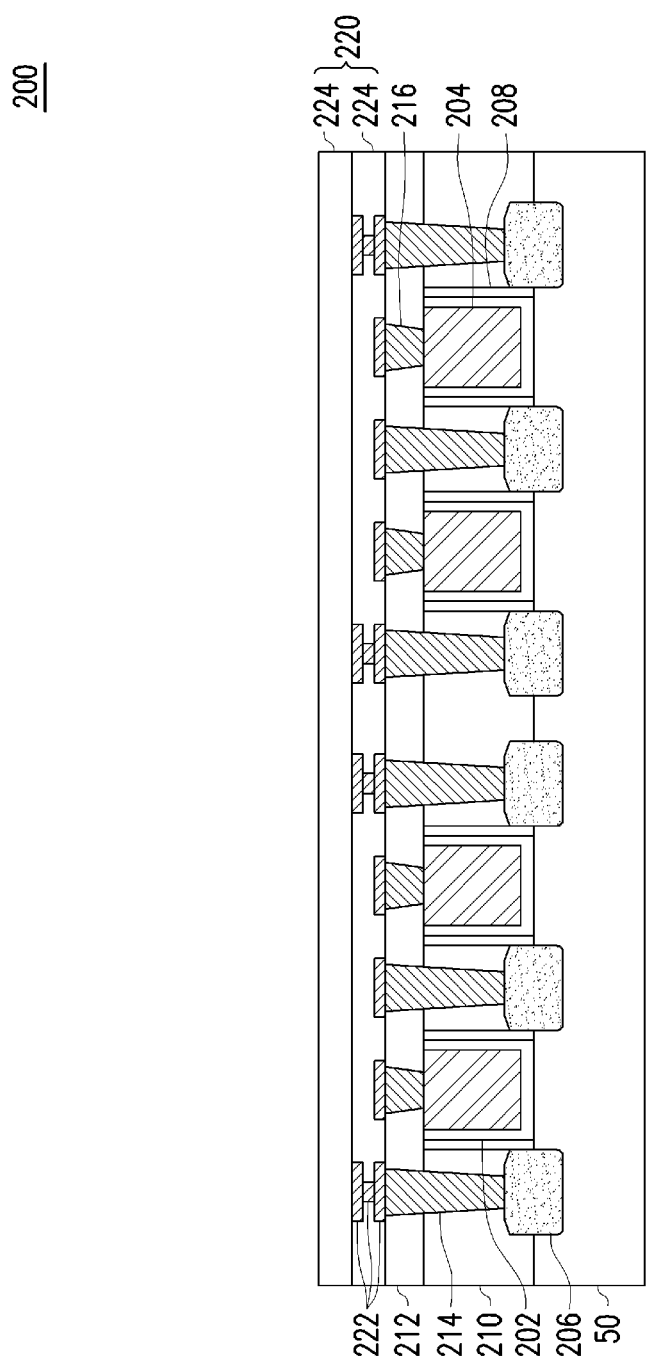

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 50. The circuits include active devices (e.g., transistors) at a top surface of the substrate 50. The transistors may include gate dielectric layers 203 over top surfaces of the substrate 50 and gate electrodes 205 over the gate dielectric layers 203. Source/drain regions 207 are disposed in the substrate 50 on opposite sides of the gate dielectric layers 203 and the gate electrodes 204. Gate spacers 208 are formed along sidewalls of the gate dielectric layers 202 and separate the source/drain regions 207 from the gate electrodes 205 by appropriate lateral distances. In some embodiments, the transistors may be planar field effect transistors (FETs), fin field effect transistors (finFETs), nano-field effect transistors (nanoFETs), or the like.

A first ILD 210 surrounds and isolates the source/drain regions 207, the gate dielectric layers 203, and the gate electrodes 205 and a second ILD 212 is over the first ILD 210. Source/drain contacts 214 extend through the second ILD 212 and the first ILD 210 and are electrically coupled to the source/drain regions 207 and gate contacts 216 extend through the second ILD 212 and are electrically coupled to the gate electrodes 205. An interconnect structure 220, including one or more stacked dielectric layers 224 and conductive features 222 formed in the one or more dielectric layers 224, is over the second ILD 212, the source/drain contacts 214, and the gate contacts 216. Although FIG. 2 illustrates two stacked dielectric layers 224, it should be appreciated that the interconnect structure 200 may include any number of dielectric layers 224 having conductive features 222 disposed therein. The interconnect structure 220 may be electrically connected to the gate contacts 216 and the source/drain contacts 214 to form functional circuits. In some embodiments, the functional circuits formed by the interconnect structure 220 may comprise logic circuits, memory circuits, sense amplifiers, controllers, input/output circuits, image sensor circuits, the like, or combinations thereof. Although FIG. 2 discusses transistors formed over the substrate 50, other active devices (e.g., diodes or the like) and/or passive devices (e.g., capacitors, resistors, or the like) may also be formed as part of the functional circuits.

Figure 3A:
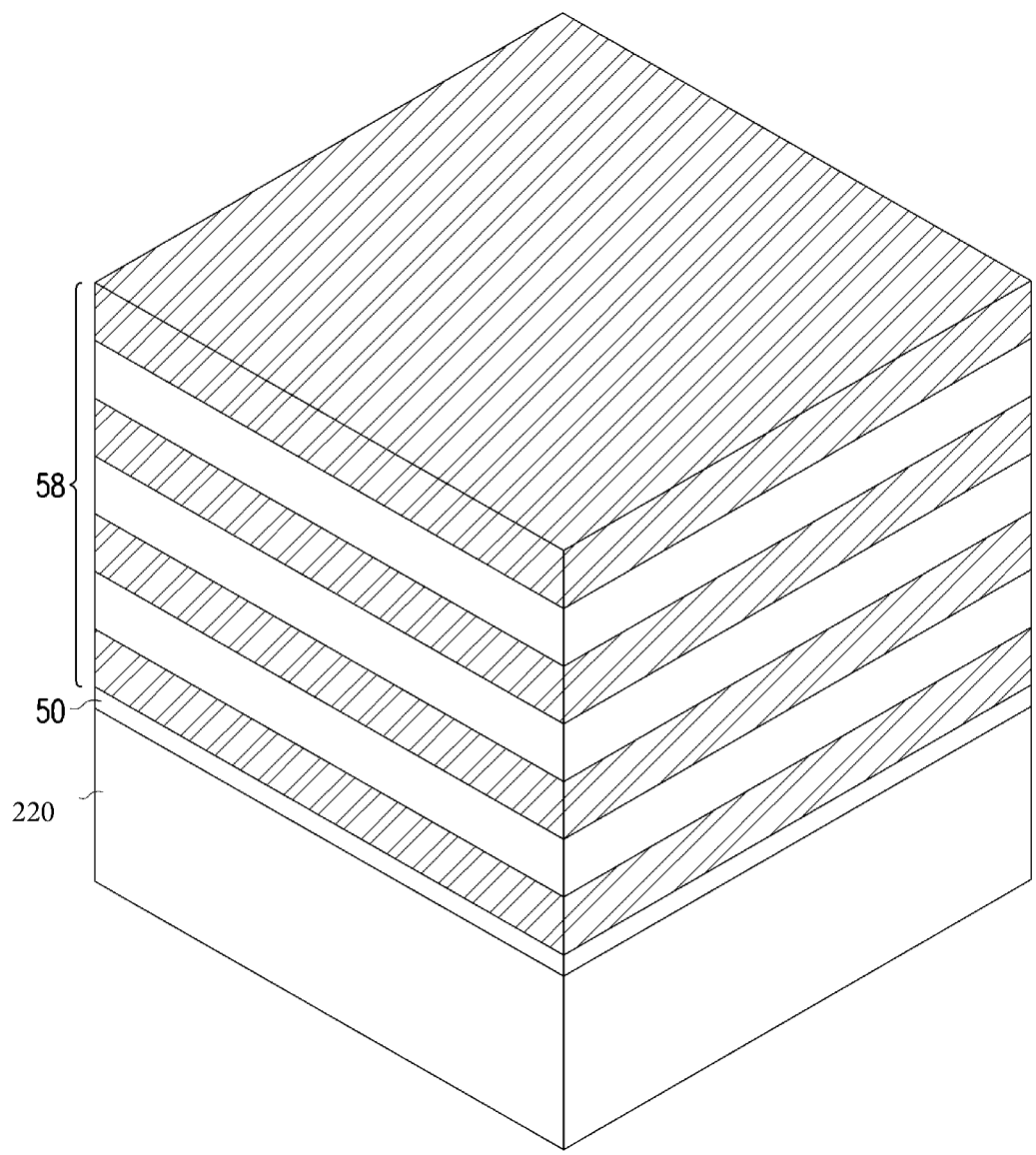
Figure 3B:
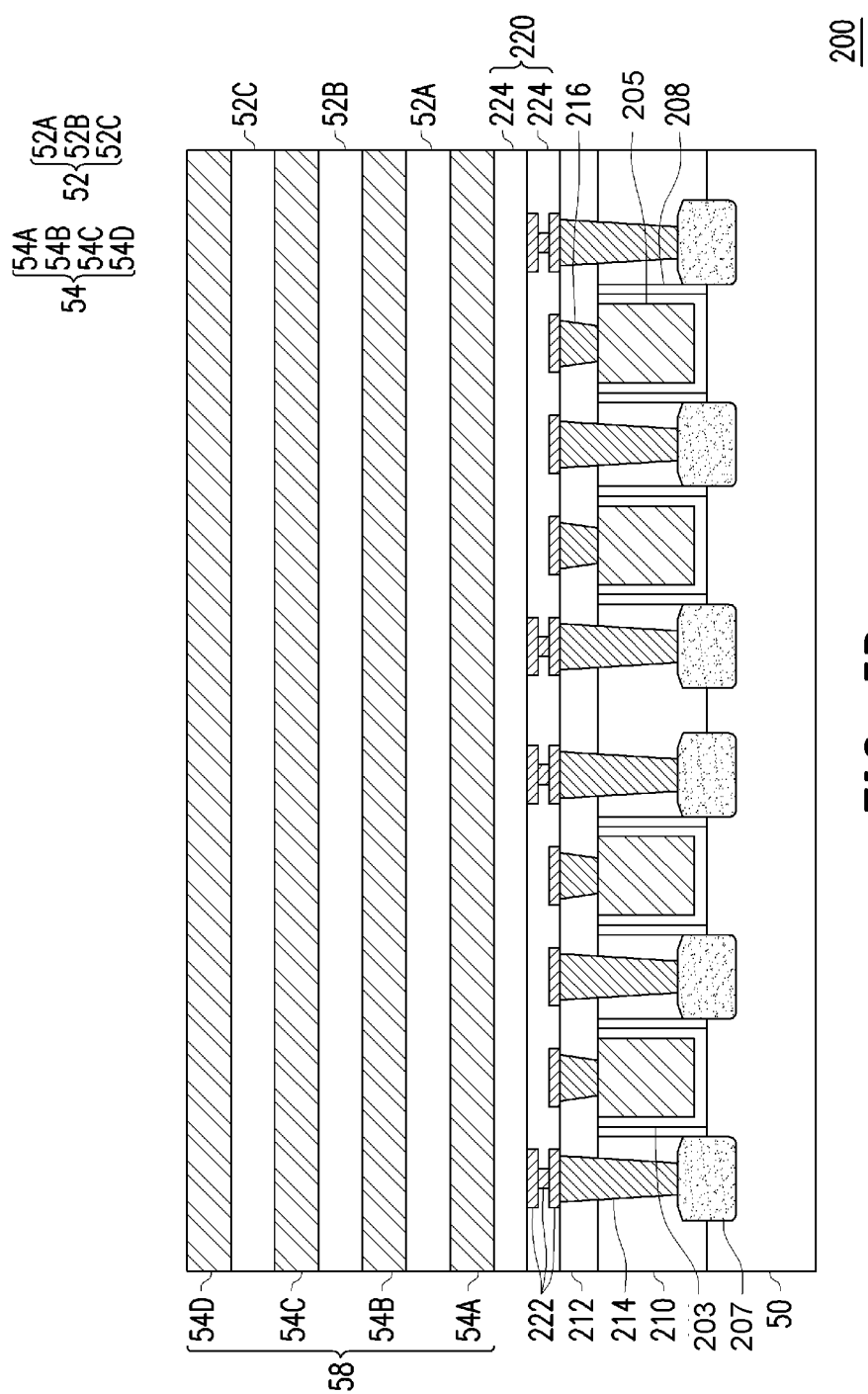

In FIGS. 3A and 3B, a multi-layer stack 58 is formed over the structure of FIG. 2. The substrate 50, the transistors, the ILDs, and the interconnect structure 220 may be omitted from subsequent drawings for the purposes of simplicity and clarity. Although the multi-layer stack 58 is illustrated as contacting the dielectric layers 224 of the interconnect structure 220, any number of intermediate layers may be disposed between the substrate 50 and the multi-layer stack 58. For example, the multi-layer stack 58 may be above the interconnect structure 220, and one or more additional interconnect layers comprising conductive features in insulting layers (e.g., low-k dielectric layers) may be disposed between the substrate 50 and the multi-layer stack 58. In some embodiments, the conductive features may be patterned to provide power, ground, and/or signal lines for the active devices on the substrate 50 and/or the memory array 200 (see FIGS. 1A and 1B).

The multi-layer stack 58 includes alternating layers of conductive lines 72A-D (collectively referred to as conductive layers 54) and dielectric layers 52A-C (collectively referred to as dielectric layers 52). The conductive layers 54 may be patterned in subsequent steps to define the conductive lines 72 (e.g., word lines). The conductive layers 54 may comprise a conductive material, such as, copper, titanium, titanium nitride, tantalum, tantalum nitride, tungsten, ruthenium, aluminum, combinations thereof, or the like, and the dielectric layers 52 may comprise an insulating material, such as silicon oxide, silicon nitride, silicon oxynitride, combinations thereof, or the like. The conductive layers 54 and dielectric layers 52 may be each formed using, for example, chemical vapor deposition (CVD), atomic layer deposition (ALD), physical vapor deposition (PVD), plasma enhanced CVD (PECVD), or the like. Although FIGS. 3A and 3B illustrate a particular number of conductive layers 54 and dielectric layers 52, other embodiments may include a different number of conductive layers 54 and dielectric layers 52.

FIGS. 4 through 12B are views of intermediate stages in the manufacturing a staircase structure of the memory array 200, in accordance with some embodiments. FIGS. 4 through 11 and 12B are illustrated along reference cross-section B-B' illustrated in FIG. 1. FIG. 12A is illustrated in a three-dimensional view.

Figure 4:
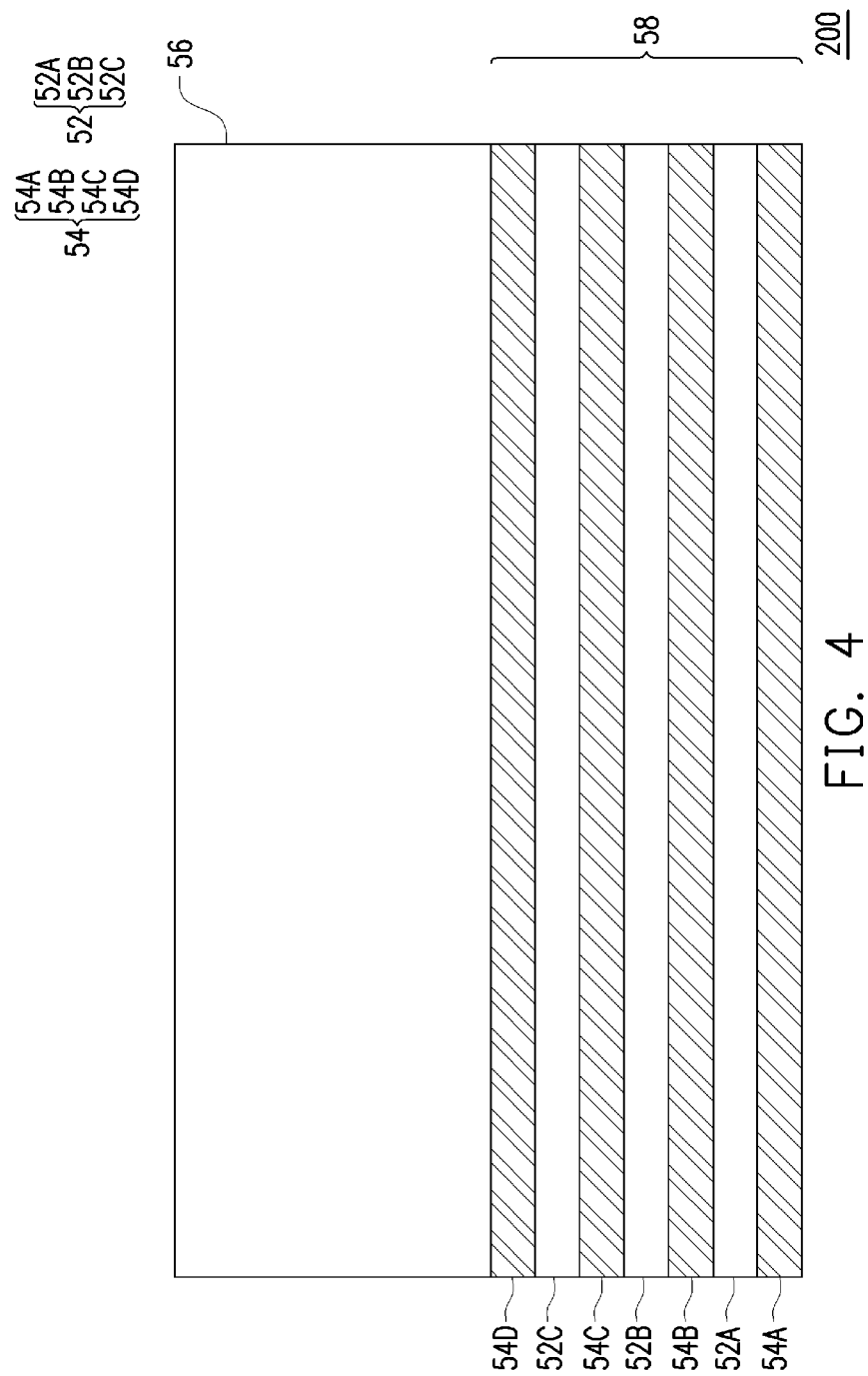

In FIG. 4 a photoresist 56 is formed over the multi-layer stack 58. As discussed above, the multi-layer stack 58 may comprise alternating layers of the conductive layers 54 (labeled 54A, 54B, 54C, and 54D) and the dielectric layers 52 (labeled 52A, 52B, and 52C). The photoresist 56 can be formed by using a spin-on technique.

Figure 5:
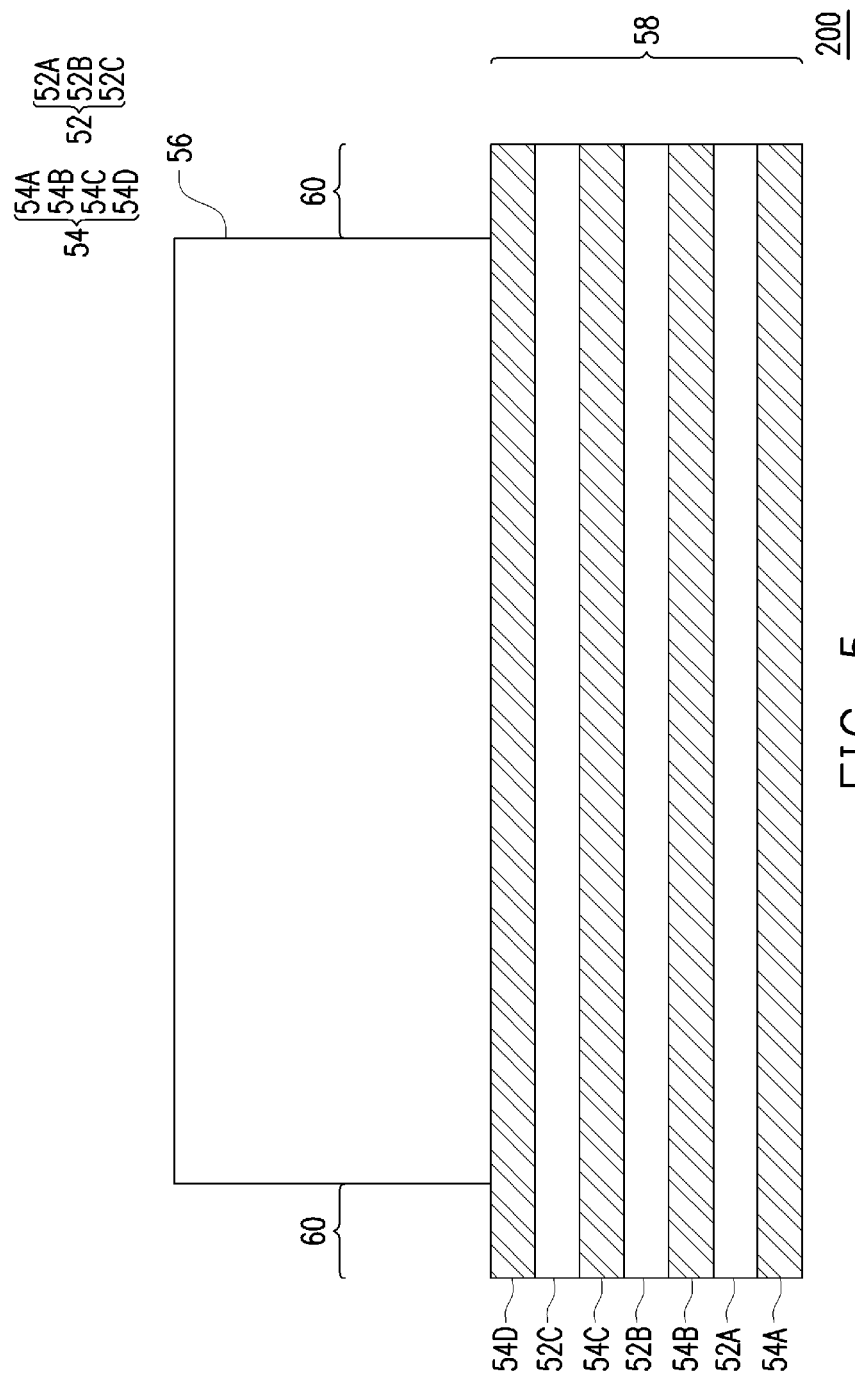
Figure 6:
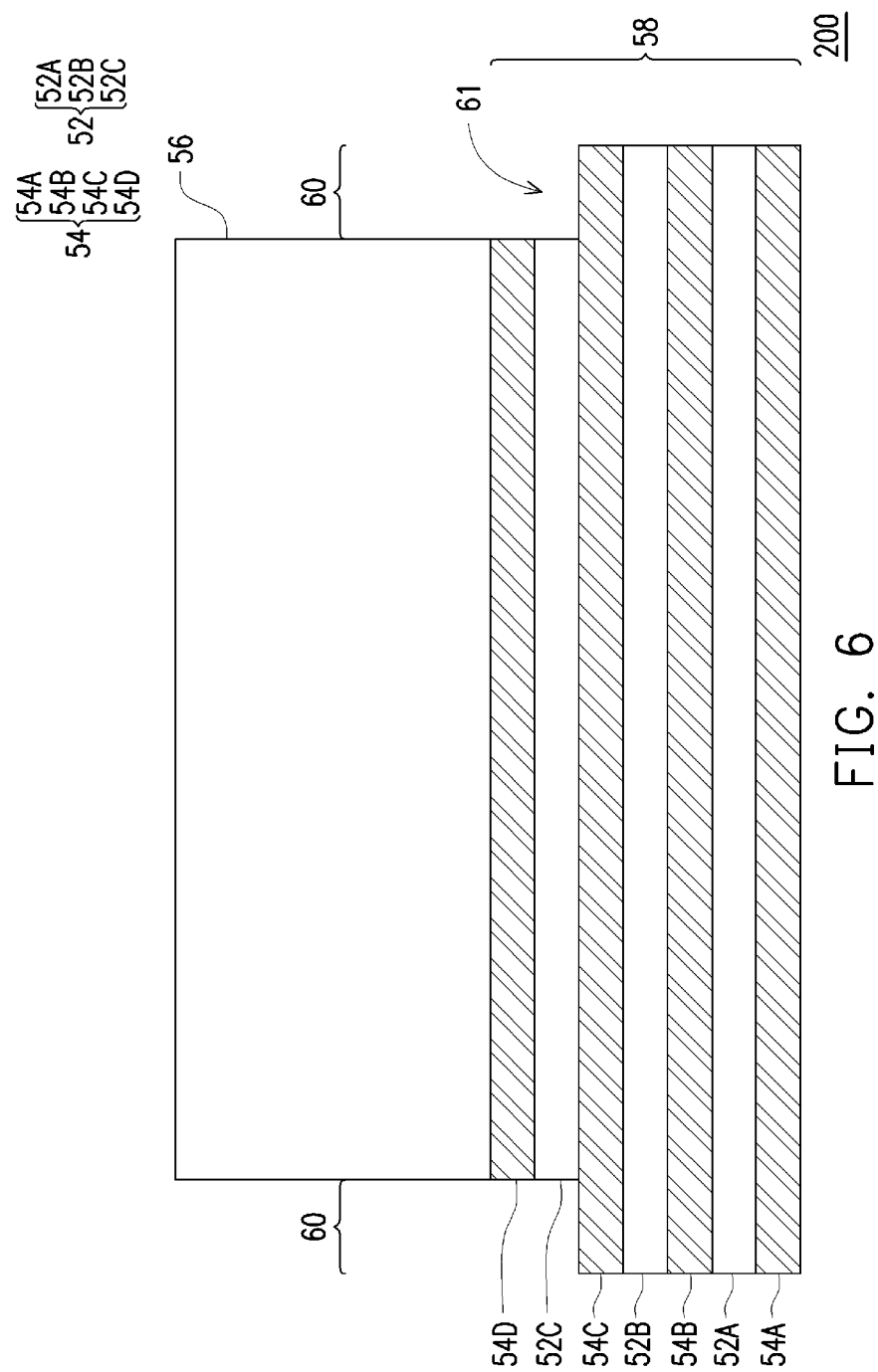

In FIG. 5, the photoresist 56 is patterned to expose the multi-layer stack 58 in regions 60 while masking remaining portions of the multi-layer stack 58. For example, a topmost layer of the multi-layer stack 58 (e.g., conductive layer 54D) may be exposed in the regions 60. The photoresist 56 may be patterned using acceptable photolithography techniques In FIG. 6, the exposed portions of the multi-layer stack 58 in the regions 60 are etched using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may remove portions of the conductive layer 54D and dielectric layer 52C in the regions 60 and define openings 61. Because the conductive layer 54D and the dielectric layer 52C have different material compositions, etchants used to remove exposed portions of these layers may be different. In some embodiments, the dielectric layer 52C acts as an etch stop layer while etching the conductive layer 54D, and the conductive layer 54C acts as an etch stop layer while etching dielectric layer 52C. As a result, the portions of the conductive layer 54E and the conductive layer 54D may be selectively removed without removing remaining layers of the multi-layer stack 58, and the openings 61 may be extended to a desired depth. Alternatively, a timed etch processes may be used to stop the etching of the openings 61 after the openings 61 reach a desired depth. In the resulting structure, the conductive layer 54C is exposed in the regions 60.

Figure 7:
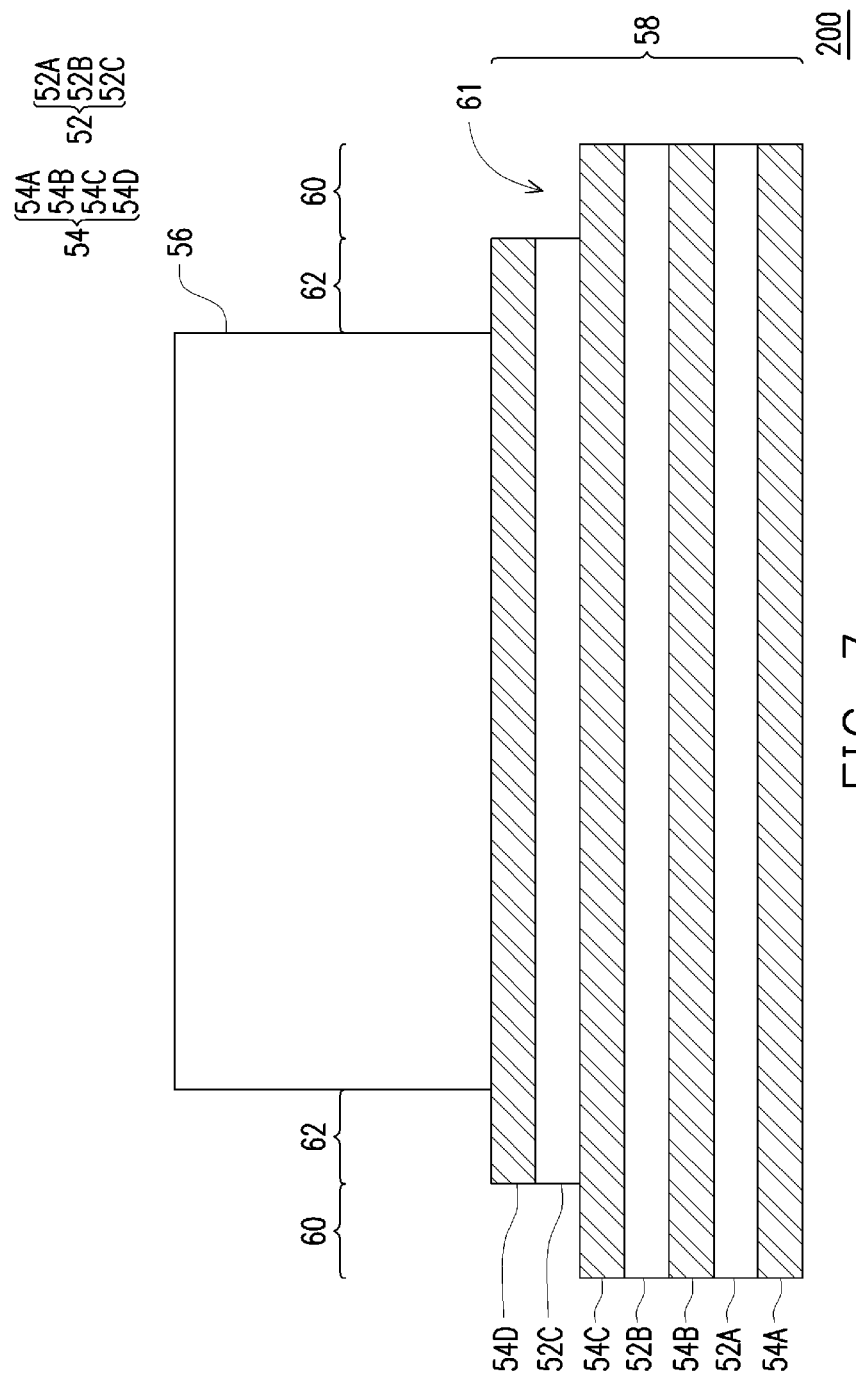

In FIG. 7, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60 and 62 may be exposed. For example, a top surface of the conductive layer 54C may be exposed in the regions 60, and a top surface of the conductive layer 54D may be exposed in the regions 62.

Figure 8:
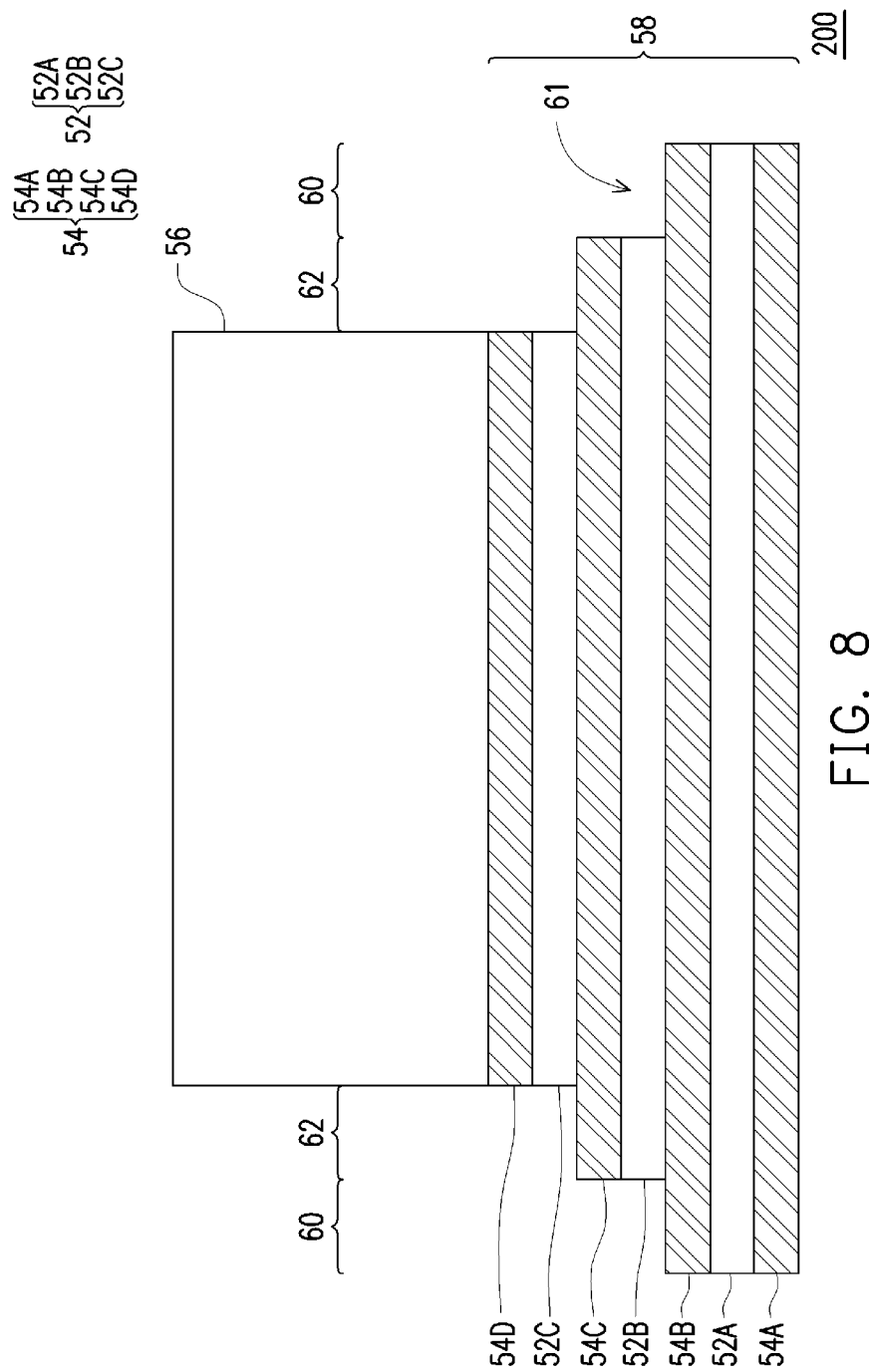

In FIG. 8, portions of the conductive layer 54D, the dielectric layer 52C, the conductive layer 54C, and the dielectric layer 52B in the regions 60 and 62 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. Because the conductive layers 54D/54C and the dielectric layers 52C/52B have different material compositions, etchants used to remove exposed portions of these layers may be different. In some embodiments, the dielectric layer 52C acts as an etch stop layer while etching the conductive layer 54D; the conductive layer 54C acts as an etch stop layer while etching dielectric layer 52C; the dielectric layer 52B acts as an etch stop layer while etching the conductive layer 54C; and the conductive layer 54B acts as an etch stop layer while etching the dielectric layer 52B. As a result, portions of the conductive layers 54D/54C and the dielectric layer 52C/52B may be selectively removed without removing remaining layers of the multi-layer stack 58, and the openings 61 may be extended to a desired depth. Further, during the etching processes, unetched portions of the conductive layers 54 and dielectric layers 52 act as a mask for underlying layers, and as a result a previous pattern of the conductive layer 54D and dielectric layer 52C (see FIG. 7) may be transferred to the underlying conductive layer 54C and dielectric layer 52B. In the resulting structure, the conductive layer 54B is exposed in the regions 60, and the conductive layer 54C is exposed in the regions 62.

Figure 9:
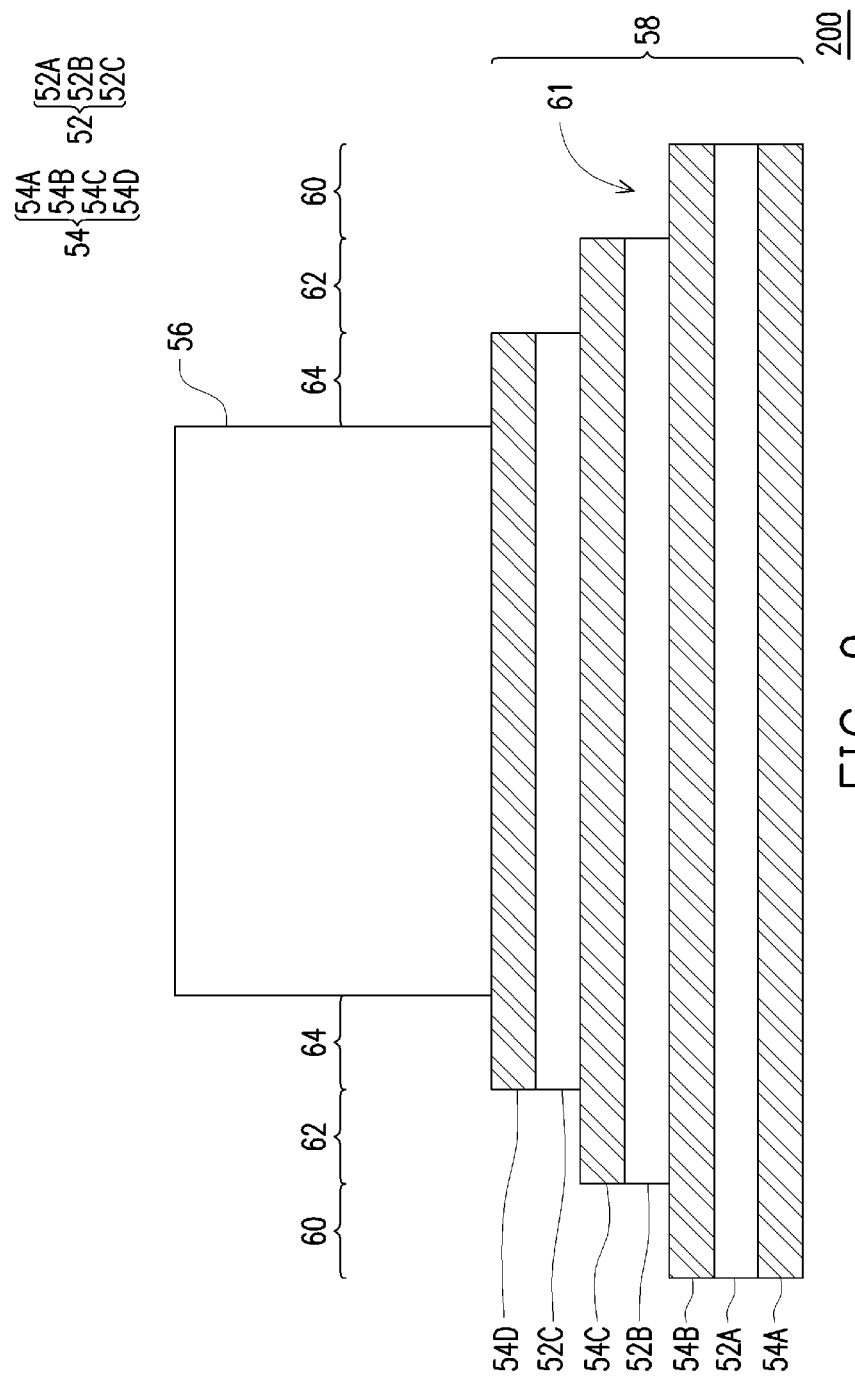

In FIG. 9, the photoresist 56 is trimmed to expose additional portions of the multi-layer stack 58. The photoresist can be trimmed using acceptable photolithography techniques. As a result of the trimming, a width of the photoresist 56 is reduced, and portions the multi-layer stack 58 in regions 60, 62, and 64 may be exposed. For example, a top surface of the conductive layer 54B may be exposed in the regions 60; a top surface of the conductive layer 54C may be exposed in the regions 62; and a top surface of the conductive layer 542D may be exposed in the regions 64.

Figure 10:
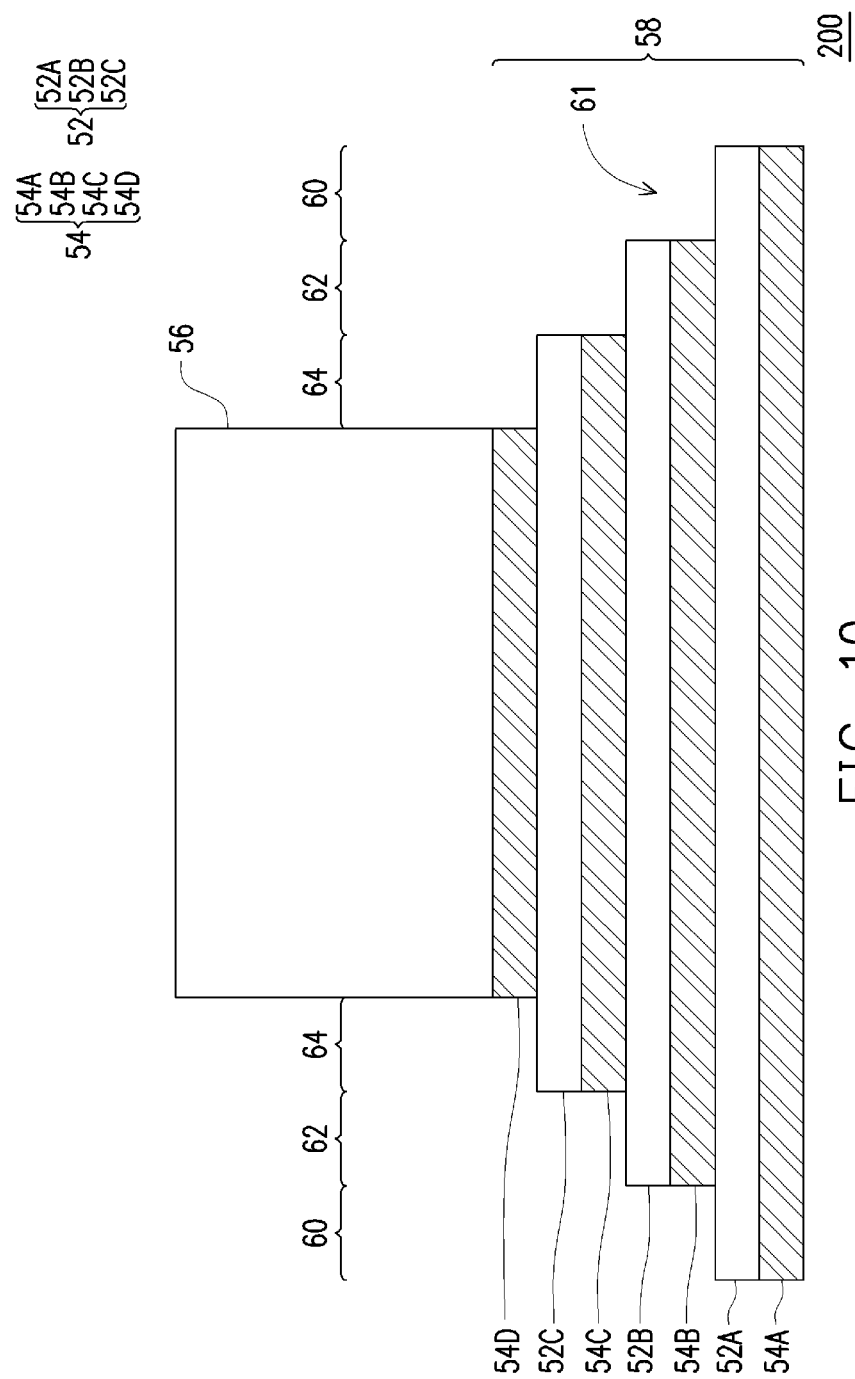

In FIG. 10, portions of the conductive layers 54D, 54C, and 54B in the regions 60, 62, and 64 are removed by acceptable etching processes using the photoresist 56 as a mask. The etching may be any acceptable etch process, such as by wet or dry etching, a reactive ion etch (RIE), neutral beam etch (NBE), the like, or a combination thereof. The etching may be anisotropic. The etching may extend the openings 61 further into the multi-layer stack 58. In some embodiments, the dielectric layer 52C acts as an etch stop layer while etching the conductive layer 54D; the dielectric layer 52B acts as an etch stop layer while etching the conductive layer 54C; and the dielectric layer 52A acts as an etch stop layer etching the conductive layer 54B. As a result, portions of the conductive layers 54D, 54C, and 54B may be selectively removed without removing remaining layers of the multi-layer stack 58, and the openings 61 may be extended to a desired depth. Further, during the etching processes, each of the dielectric layers 52 act as a mask for underlying layers, and as a result a previous pattern of the dielectric layers 52C/52B (see FIG. 9) may be transferred to the underlying conductive layers 54C/54B. In the resulting structure, the dielectric layer 52A is exposed in the regions 60; the dielectric layer 52B is exposed in the regions 62; and the dielectric layer 52C is exposed in the regions 64.

Figure 11:
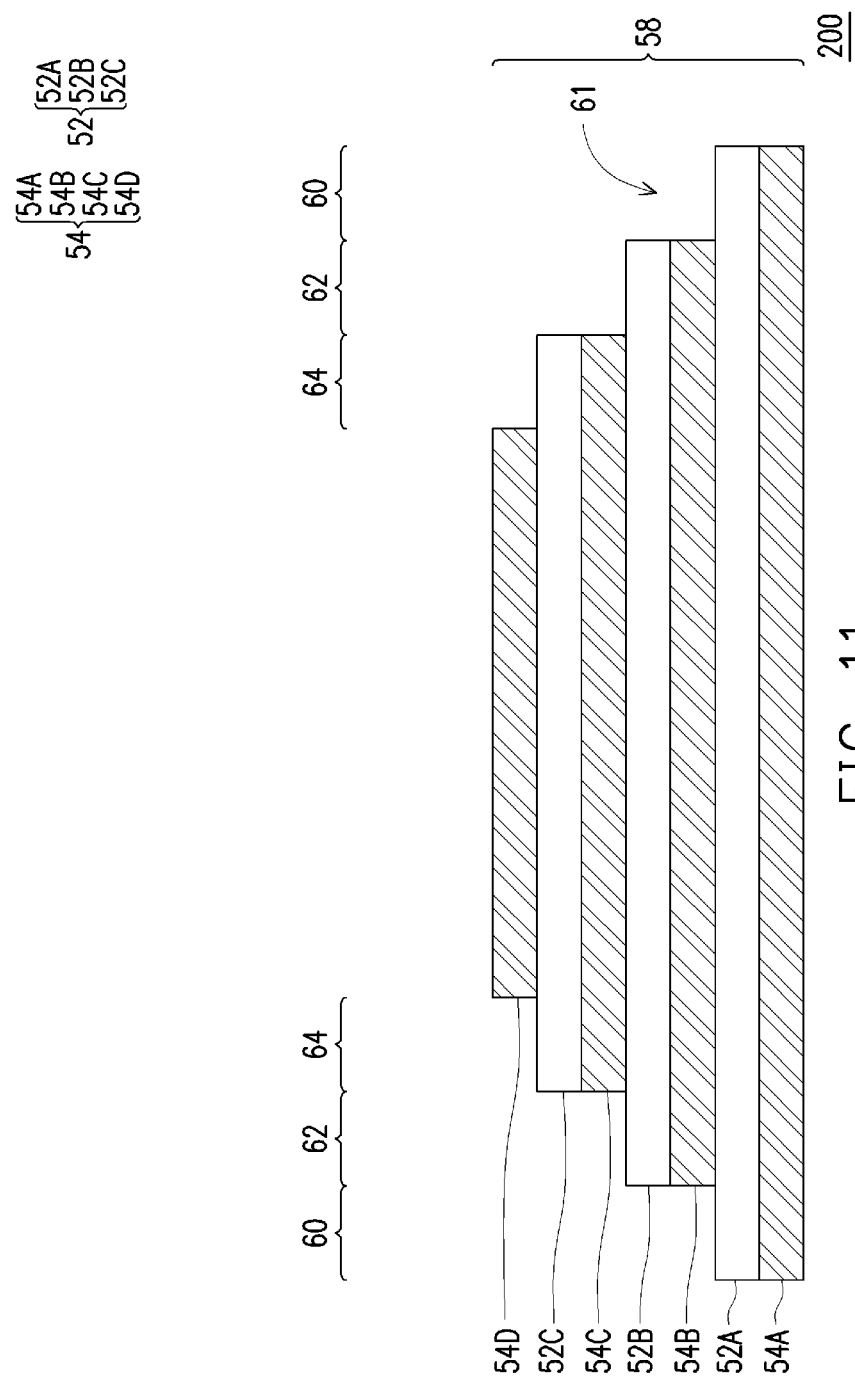
Figure 12A:
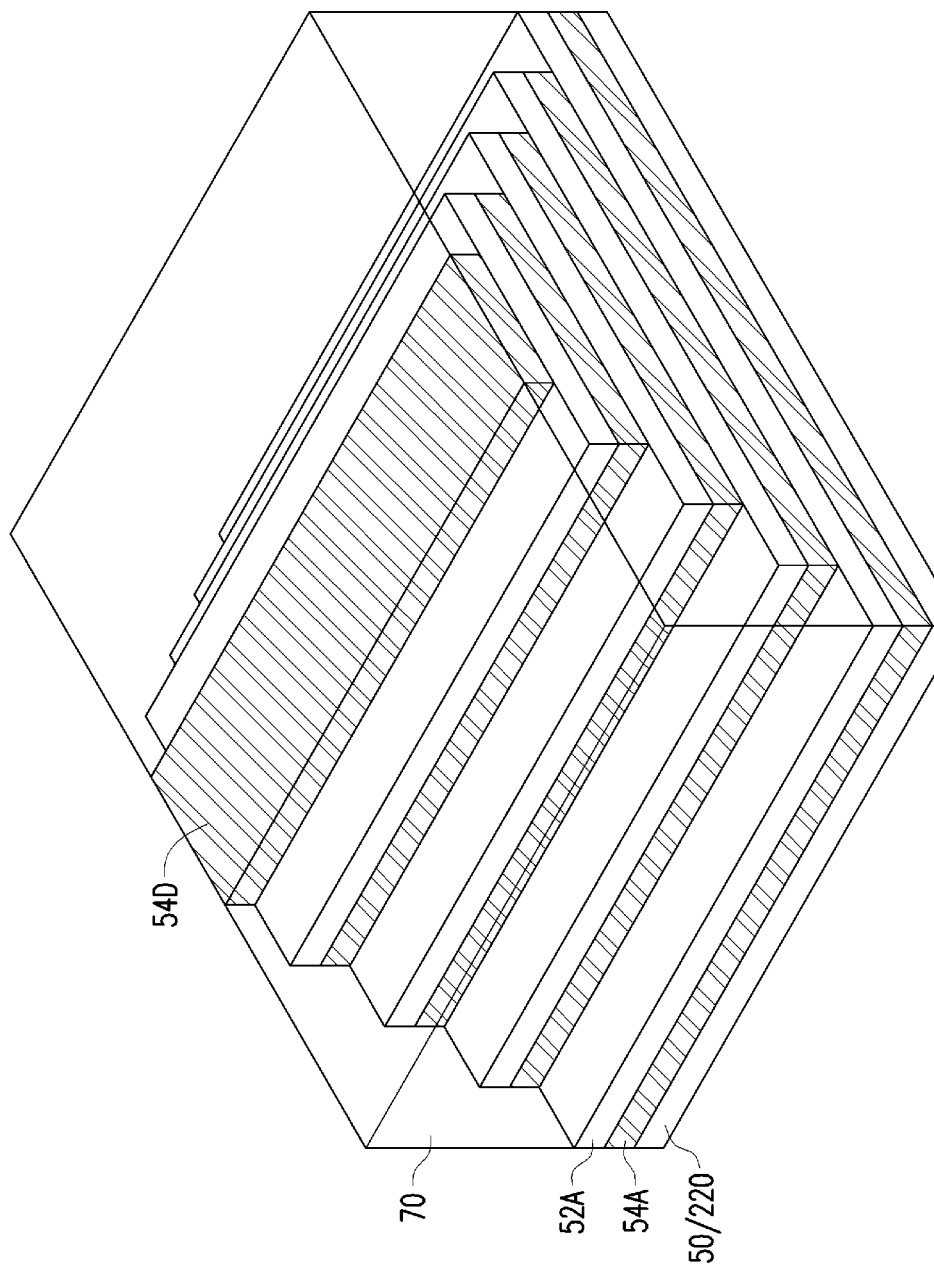
Figure 12B:
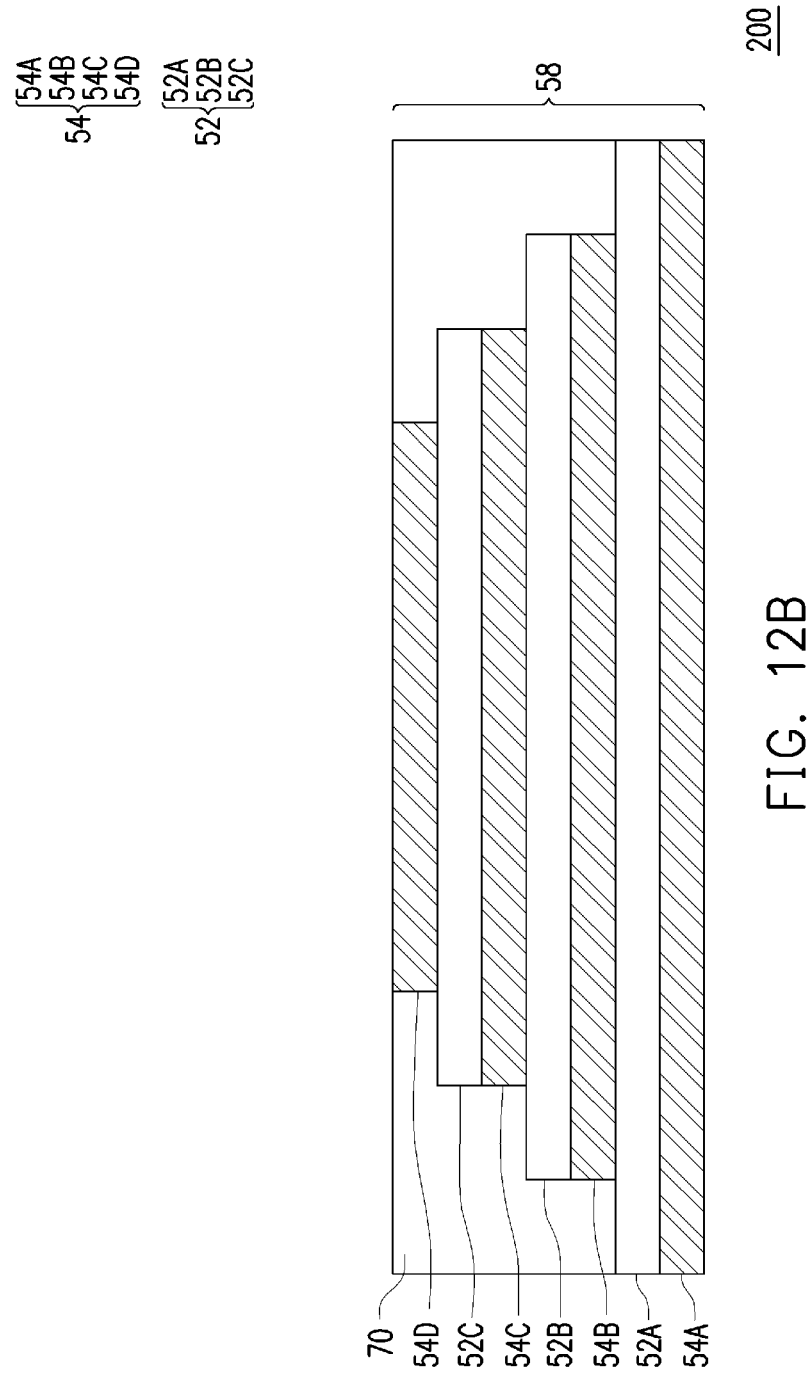

In FIG. 11, the photoresist 56 may be removed, such as by an acceptable ashing or wet strip process. Thus, a staircase structure 68 is formed. The staircase structure comprises a stack of alternating ones of the conductive layers 54 and the dielectric layers 52. Lower conductive layers 54 are wider and extend laterally past upper conductive layers 54, and a width of each of the conductive layers 54 increases in a direction towards the substrate 50. For example, the conductive layer 54A may longer than the conductive layer 54B; the conductive layer 54B may be longer than the conductive layer 54C; and the conductive layer 54C may be longer than the conductive layer 54D. As a result, conductive contacts can be made from above the staircase structure 68 to each of the conductive layers 54 in subsequent processing steps.

In FIG. 12, an inter-metal dielectric (IMD) 70 is deposited over the multi-layer stack 58. The IMD 70 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), borondoped phospho-silicate glass (BPSG), undoped silicate glass (USG), or the like. Other insulation materials formed by any acceptable process may be used. The IMD 70 extends along sidewalls of the conductive layers 54 as well as sidewalls of the dielectric layers 52. Further, the IMD 70 may contact top surfaces of each of the dielectric layers 52.

As further illustrated in FIG. 12, a removal process is then applied to the IMD 70 to remove excess dielectric material over the multi-layer stack 58. In some embodiments, a planarization process such as a chemical mechanical polish (CMP), an etch-back process, combinations thereof, or the like may be utilized. The planarization process exposes the multi-layer stack 58 such that top surfaces of the multi-layer stack 58 and IMD 70 are level after the planarization process is complete.

FIGS. 13 through 17B are views of intermediate stages in the manufacturing of the memory array 200, in accordance with some embodiments. In FIGS. 13 through 17B the multi-layer stack 58 is formed and trenches are formed in the multi-layer stack 58, thereby defining the conductive lines 72. The conductive lines 72 may correspond to word lines in the memory array 200, and the conductive lines 72 may further provide gate electrodes for the resulting TFTs of the memory array 200. FIG. 17A is illustrated in a three-dimensional view. FIGS. 13 through 16 and 17B are illustrated along reference cross-section C-C' illustrated in FIG. 1A.

Figure 13:
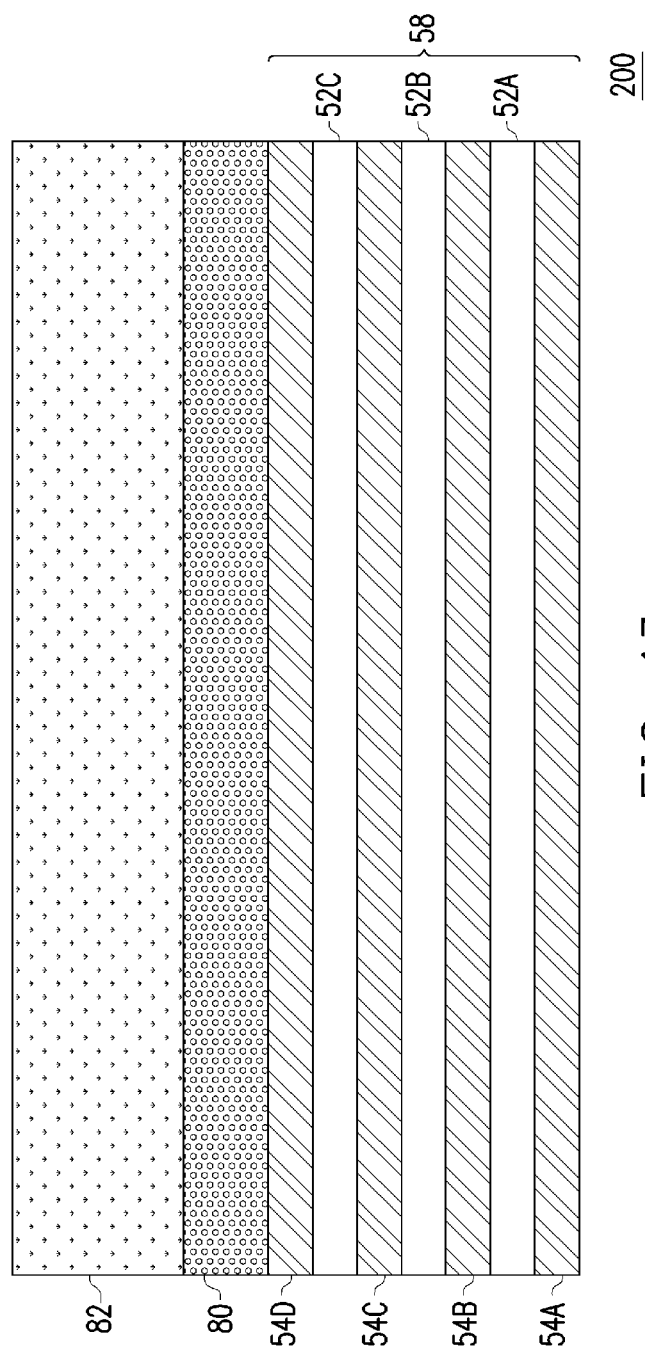

In FIG. 13, a hard mask 80 and a photoresist 82 are deposited over the multi-layer stack 58. The hard mask layer 80 may include, for example, silicon nitride, silicon oxynitride, or the like, which may be deposited by CVD, PVD, ALD, PECVD, or the like. The photoresist 82 can be formed by using a spin-on technique, for example.

Figure 14:
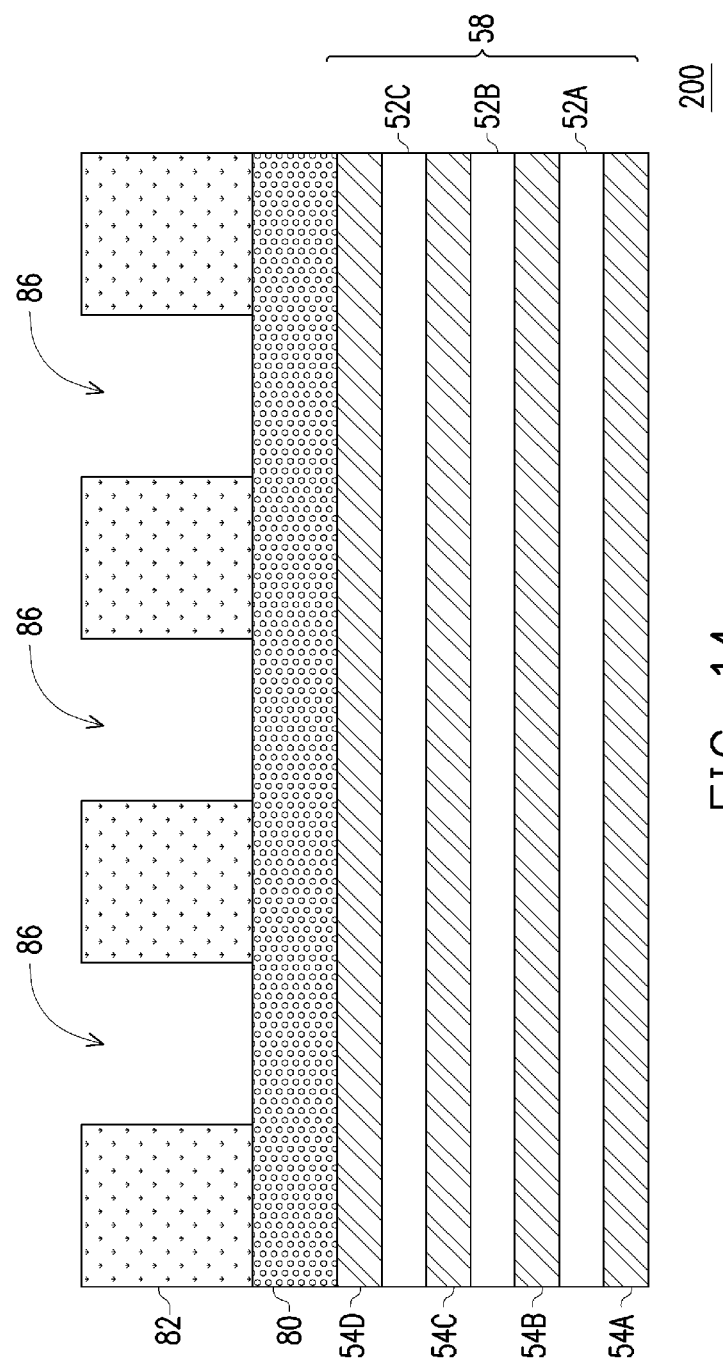

In FIG. 14, the photoresist 82 is patterned to form trenches 86. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the form trenches 86.

Figure 15:
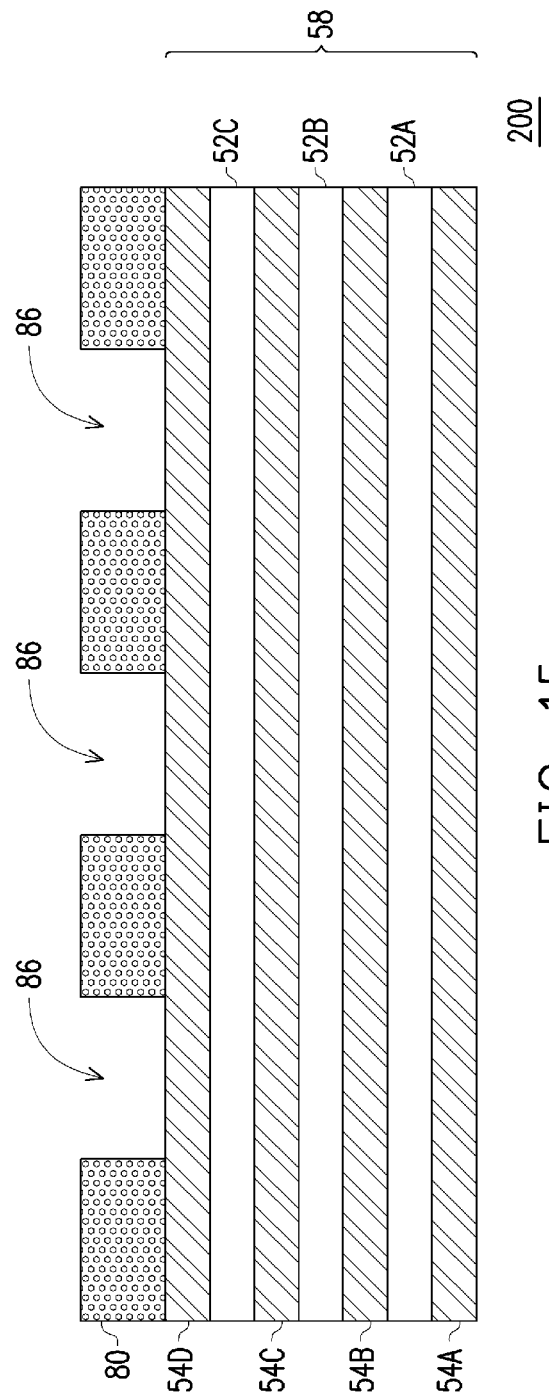

In FIG. 15, a pattern of the photoresist 82 is transferred to the hard mask 84 using an acceptable etching process, such as by wet or dry etching, a reactive ion etch (RIE), neutral beam etch (NBE), the like, or a combination thereof. The etching may be anisotropic. Thus, trenches 86 are formed extending through the hard mask 84. The photoresist 82 may be removed by an ashing process, for example.

Figure 16:
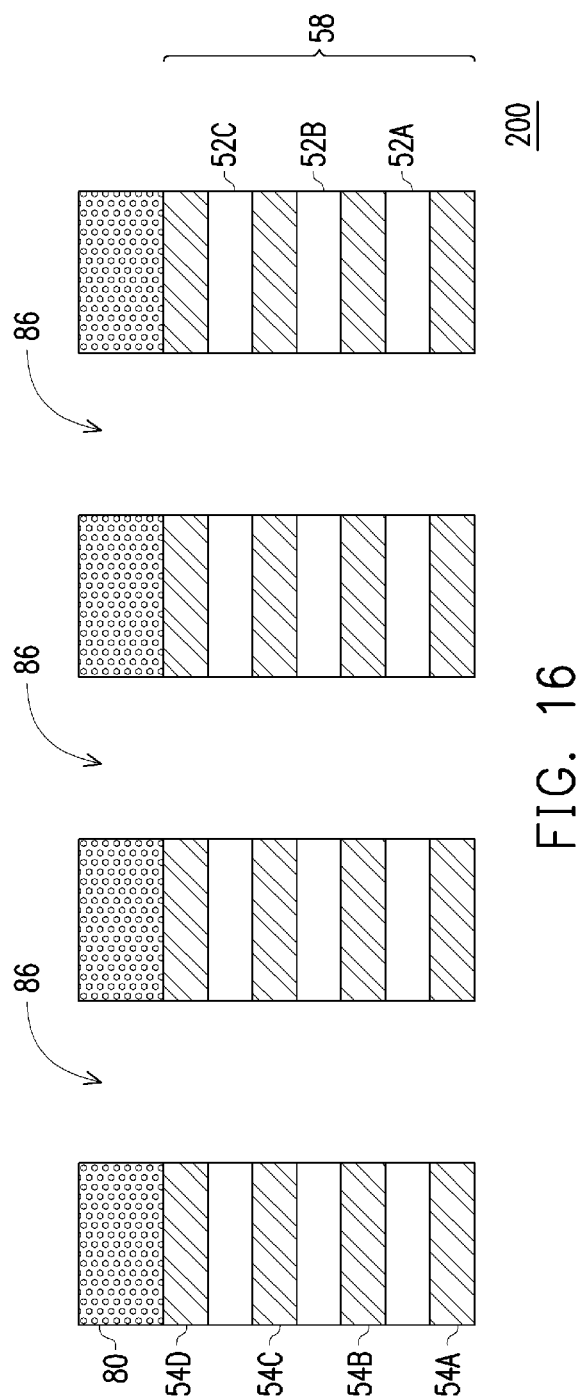
Figure 17A:
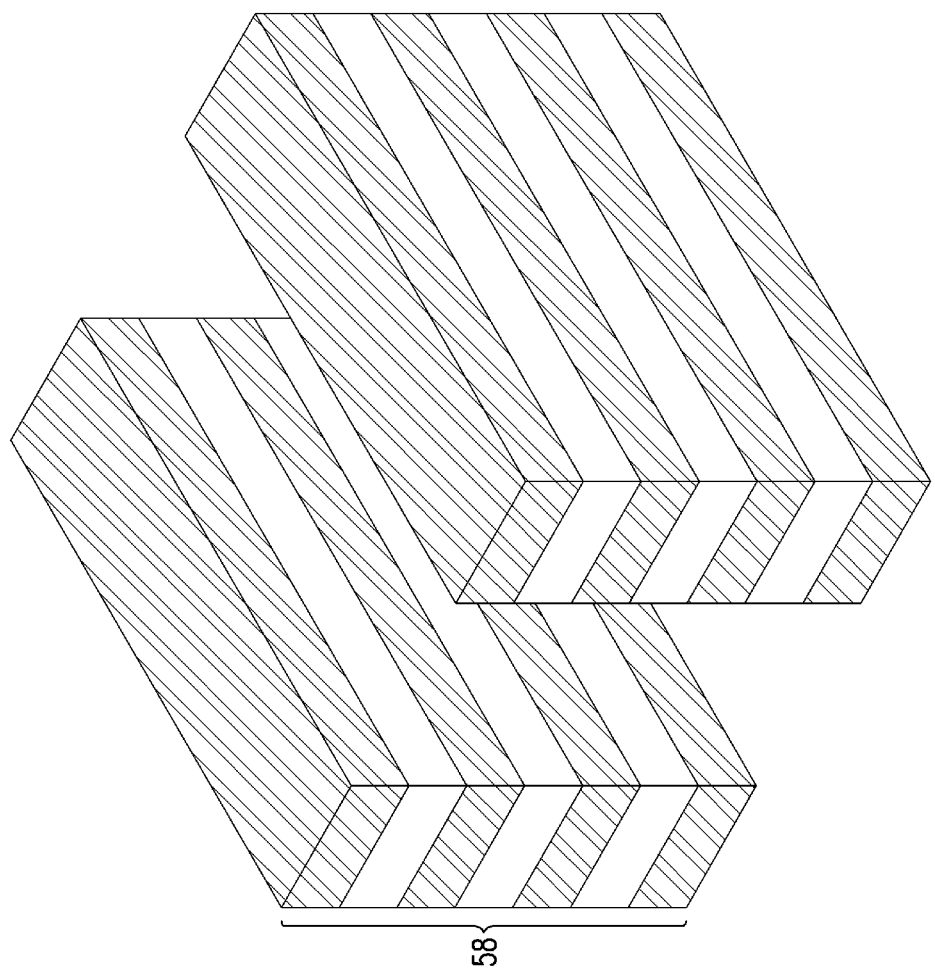
Figure 17B:
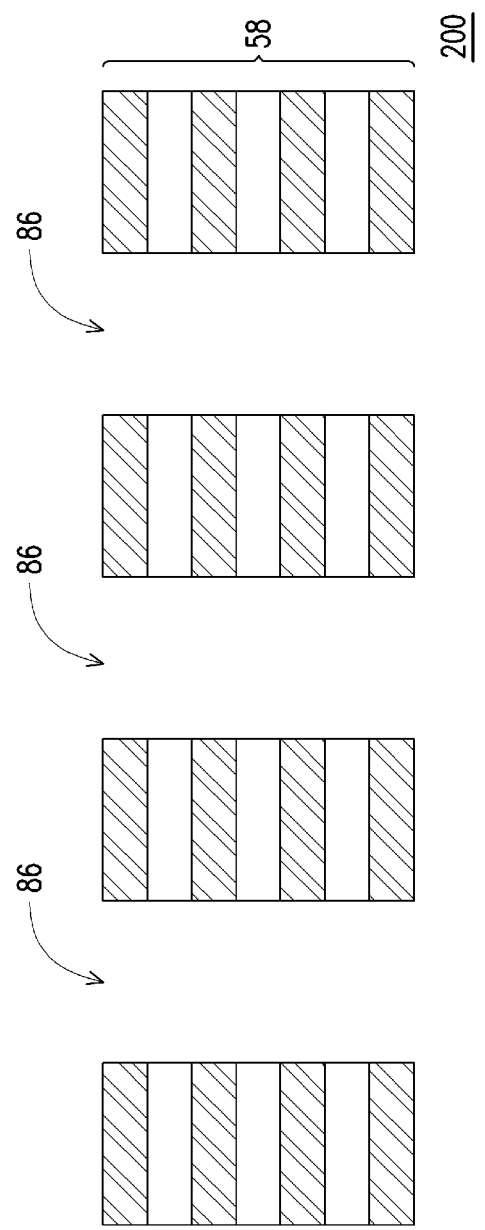

In FIG. 16, a pattern of the hard mask 84 is transferred to the multi-layer stack 58 using one or more acceptable etching processes, such as by wet or dry etching, a reactive ion etch (RIE), neutral beam etch (NBE), the like, or a combination thereof. The etching processes may be anisotropic. Thus, trenches 86 extended through the multi-layer stack 58, and the conductive lines 72 (e.g., word lines) are formed from the conductive layers 54. By etching trenches 86 through the conductive layers 54, adjacent conductive lines 72 can be separated from each other. Subsequently, in FIGS. 17A and 17B, the hard mask 84 may then be removed by an acceptable process, such as a wet etching process, a dry etching process, a planarization process, combinations thereof, or the like. Due to the staircase shape of the multi-layered stack 58 (see e.g., FIG. 12), the conductive lines 72 may have varying lengths that increase in a direction towards the substrate 50. For example, the conductive lines 72A may be longer than the conductive lines 72B; the conductive lines 72B may be longer than the conductive lines 72C; and the conductive lines 72C may be longer than the conductive lines 72D.

Figure 18A:
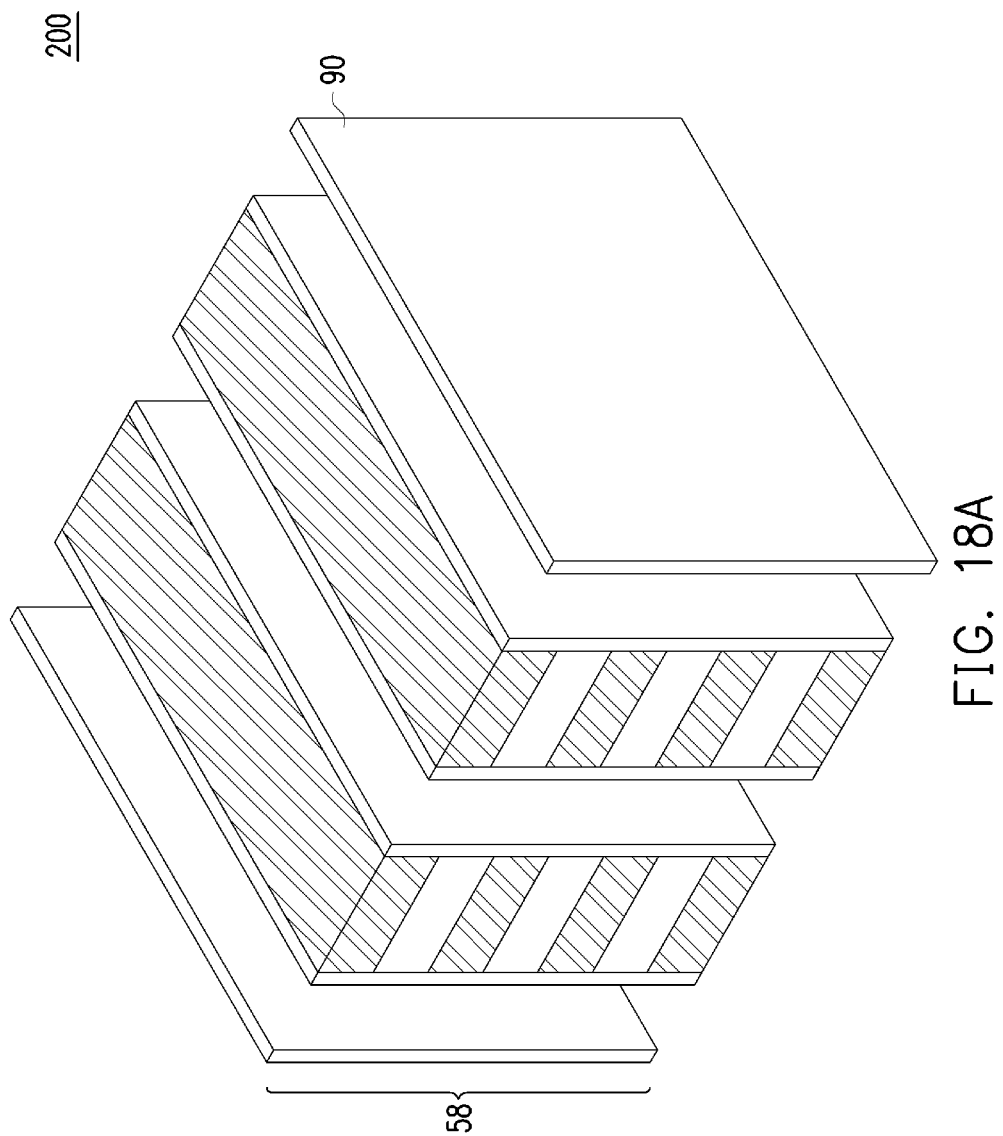
Figure 23A:
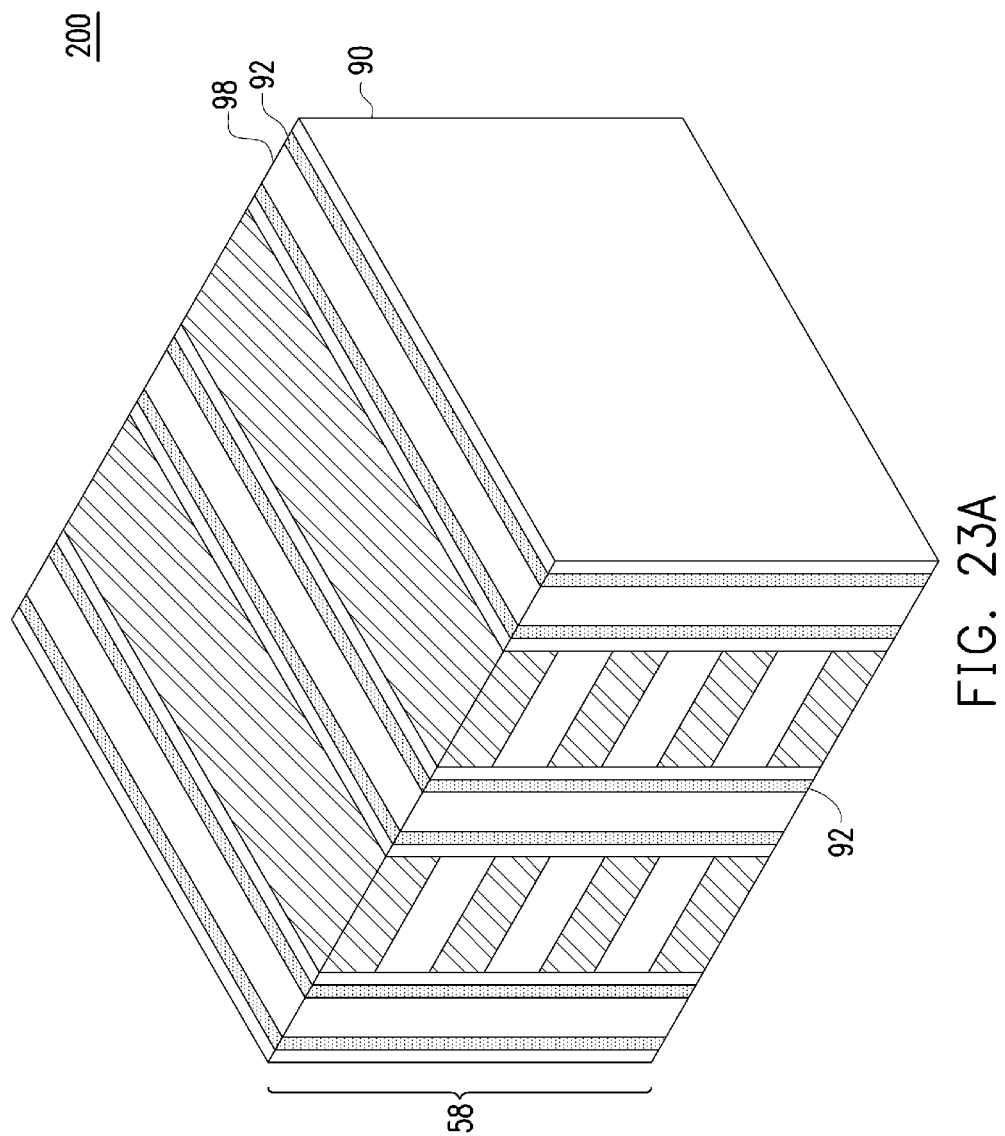
Figure 23B:
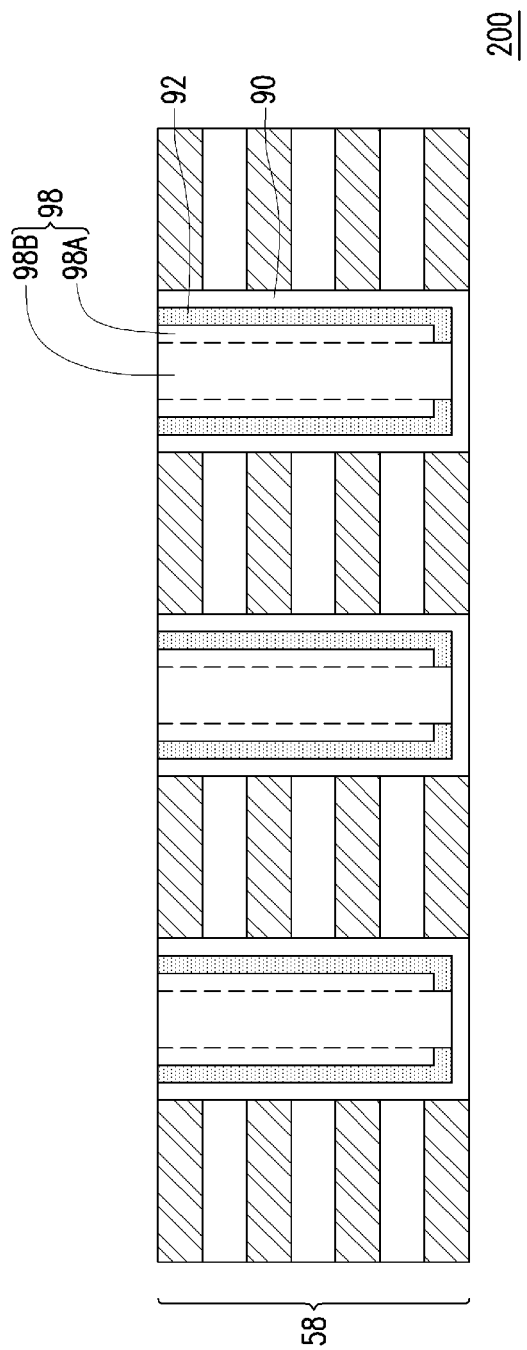
Figure 23C:
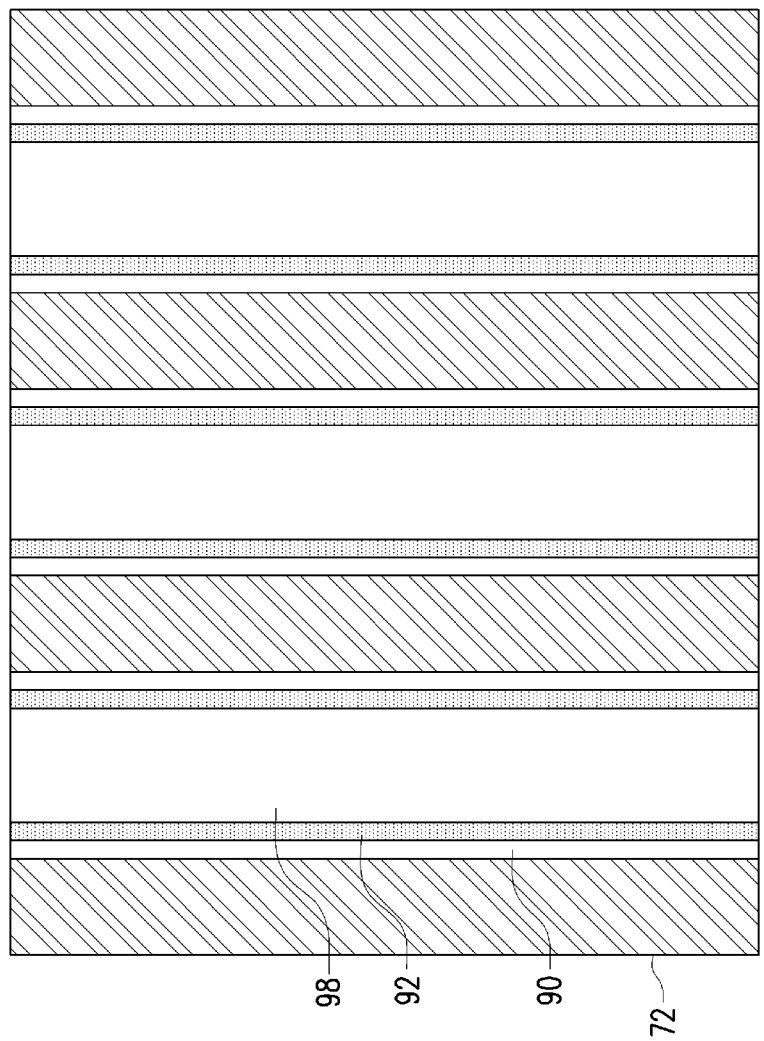

FIGS. 18A through 23C illustrate forming and patterning channel regions for the TFTs 204 (see FIG. 1A) in the trenches 86. FIGS. 18A, 18A, and 23A are illustrated in a three-dimensional view. In FIGS. 18B, 19B, 20, 21, 22A, 22B, and 23B cross-sectional views are provided along line C-C' of FIG. 1A. FIG. 23C illustrates a corresponding top-down view of the TFT structure.

In FIGS. 18A and 18B, a memory film 90 is conformally deposited in the trenches 86. The memory film 90 may have a material that is capable of storing a bit, such as material capable of switching between two different polarization directions by applying an appropriate voltage differential across the memory film 90. For example, the polarization of the memory film 90 may change due to an electric field resulting from applying the voltage differential.

For example, the memory film 90 may be a high-k dielectric material, such as a hafnium (Hf) based dielectric material, or the like. In some embodiments, the memory film 90 comprises a ferroelectric material, such as, hafnium oxide, hafnium zirconium oxide, silicon-doped hafnium oxide, or the like. In other embodiments, the memory 90 may be a multilayer structure comprising a layer of $SiN_x$ between two $SiO_x$ layers (e.g., an ONO structure). In still other embodiments, the memory film 90 may comprise a different ferroelectric material or a different type of memory material. The memory film 90 may be deposited by CVD, PVD, ALD, PECVD, or the like to extend along sidewalls and a bottom surface of the trenches 86. After the memory film 90 is deposited, an annealing step (e.g., at a temperature range of about 300° C. to about 600° C.) in may be performed to achieve a desired crystalline phase, improve film quality, and reduce film-related defects/impurities for the memory film 90. In some embodiments, the annealing step may further be below 400° C. to meet a BEOL thermal budget and reduce defects that may result in other features from high-temperature annealing processes.

Figure 19A:
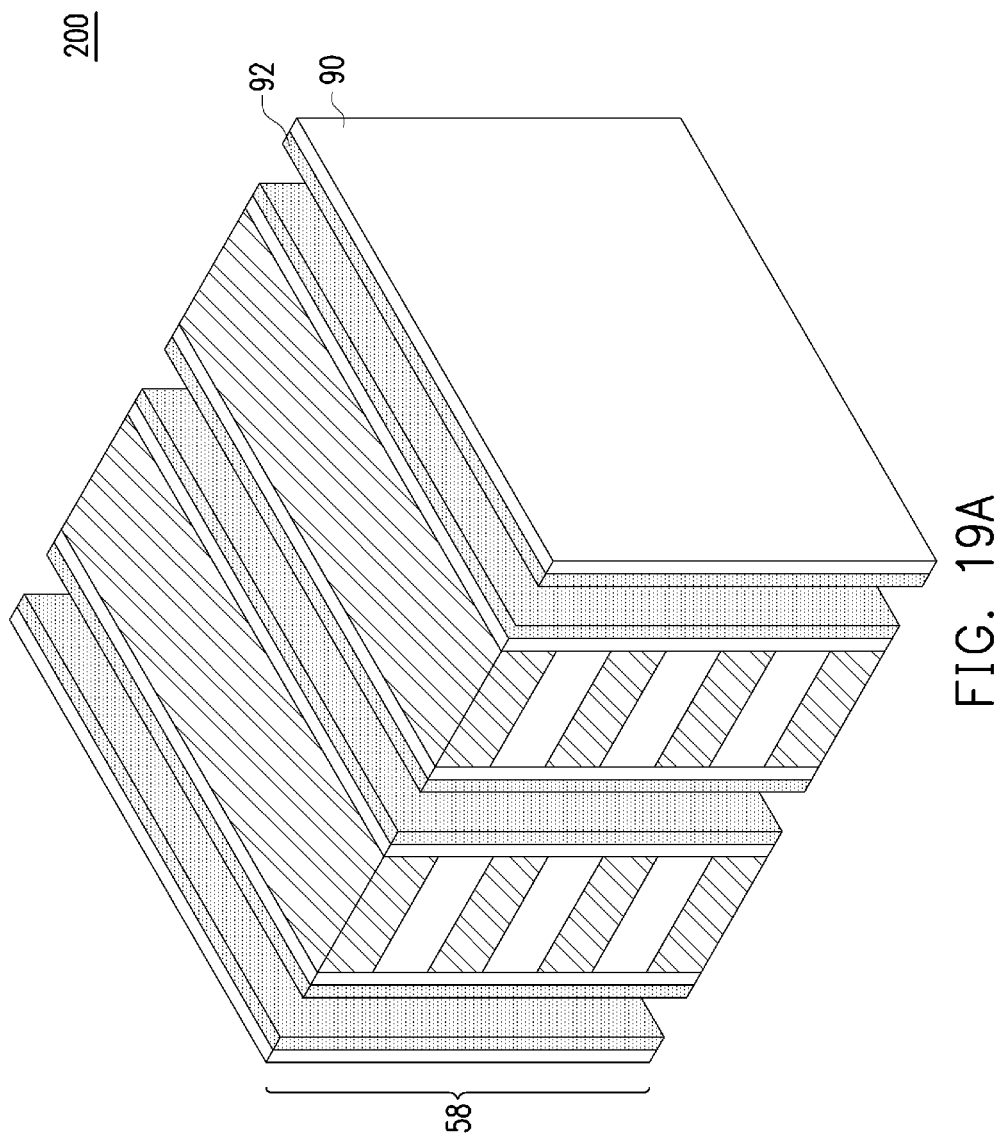
Figure 19B:
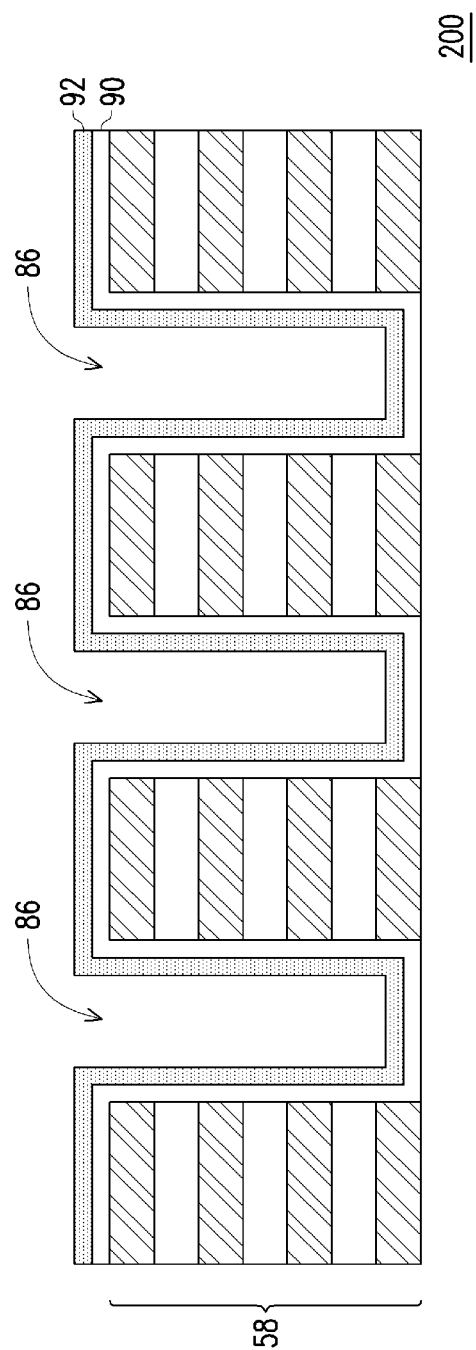

In FIGS. 19A and 19B, the OS layer 92 is conformally deposited in the trenches 86 over the memory film 90. The OS layer 92 comprises a material suitable for providing a channel region for a TFT (e.g., TFTs 204, see FIG. 1A). In some embodiments, the OS layer 92 comprises an indium-comprising material, such as $In_xGa_yZn_zMO$, where M may be Ti, Al, Ag, Si, Sn, or the like. X, Y, and Z may each be any value between 0 and 1. In other embodiments, a different semiconductor material may be used for the OS layer 92. The OS layer 92 may be deposited by CVD, PVD, ALD, PECVD, or the like. The OS layer 92 may extend along sidewalls and a bottom surface of the trenches 86 over the FE layer 90. After the OS layer 92 is deposited, an annealing step (e.g., at a temperature range of about 300° C. to about 450° C.) in oxygen-related ambient may be performed to activate the charge carriers of the OS layer 92.

Figure 20:
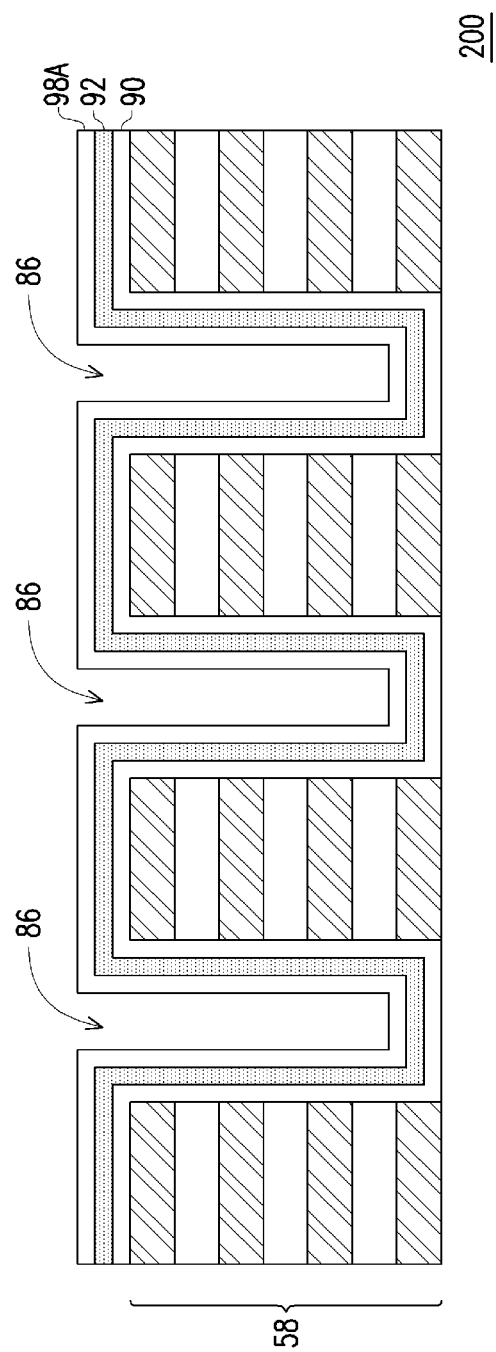

In FIG. 20, a dielectric material 98A is deposited on sidewalls and a bottom surface of the trenches 86 and over the OS layer 92. The dielectric material 98A may comprise, for example, silicon oxide, silicon nitride, silicon oxynitride, or the like, which may be deposited by CVD, PVD, ALD, PECVD, or the like.

Figure 21:
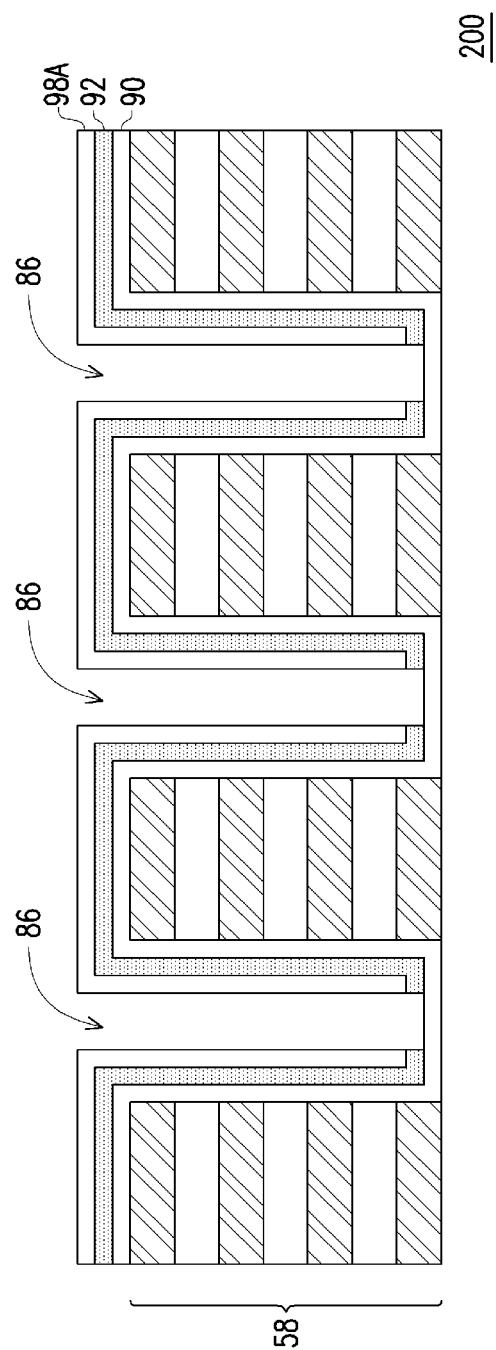
Figure 22:
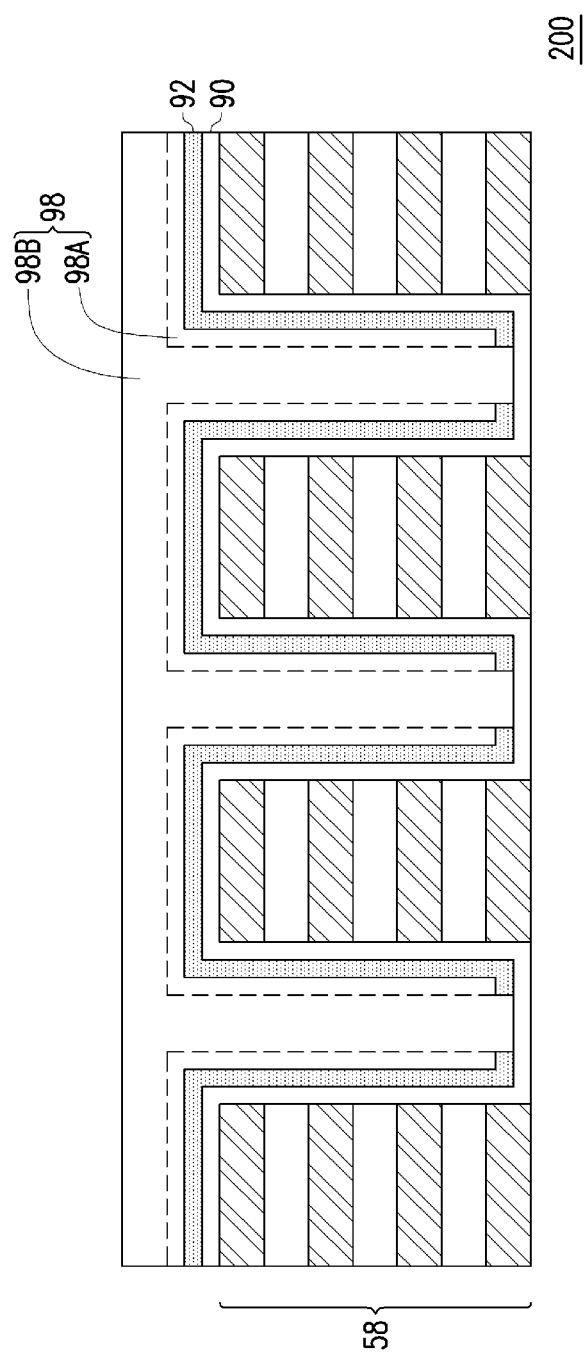

In FIG. 21, bottom portions of the dielectric material 98A in the trenches 86 are removed using a combination of photolithography and etching, for example. The etching may be any acceptable etch process, such as by wet or dry etching, a reactive ion etch (RIE), neutral beam etch (NBE), the like, or a combination thereof. The etching may be anisotropic.

Subsequently, as also illustrated by FIG. 21, the dielectric material 98A may be used as an etch mask to etch through a bottom portion of the OS layer 92 in the trenches 86. The etching may be any acceptable etch process, such as by wet or dry etching, a reactive ion etch (RIE), neutral beam etch (NBE), the like, or a combination thereof. The etching may be anisotropic. Etching the OS layer 92 may expose portions of the memory film 90 on a bottom surface of the trenches 86. Thus, portions of the OS layer 92 on opposing sidewalls of the trenches 86 may be separated from each other, which improves isolation between the memory cells 202 of the memory array 200 (see FIG. 1A).

In FIGS. 22A and 22B, an additional dielectric material 98B may be deposited to fill remaining portions of the trenches 86. The dielectric material 98B may comprise, for example, silicon oxide, silicon nitride, silicon oxynitride, or the like, which may be deposited by CVD, PVD, ALD, PECVD, or the like. In some embodiments, the dielectric material 98B may have a same material composition and be formed using a same process as the dielectric material 98A. Alternatively, the dielectric material 98B may have a different material composition and/or be formed by a different process than the dielectric material 98A.

In FIGS. 23A through 23C, a removal process is then applied to the dielectric material 98, the OS layer 92, and the memory film 90 to remove excess material over the multi-layer stack 58. In some embodiments, a planarization process such as a chemical mechanical polish (CMP), an etch-back process, combinations thereof, or the like may be utilized. The planarization process exposes the multi-layer stack 58 such that top surface of the multi-layer stack 58 is level after the planarization process is complete. FIG. 23C illustrates a corresponding top-down view of the structure illustrated in FIG. 23A.

FIGS. 24A through 29B illustrate intermediate steps of manufacturing conductive lines 106 and 108 (e.g., source lines and bit lines) in the memory array 200. The conductive lines 106 and 108 may further provide source/drain electrodes for TFTs 204 in the memory array (see FIGS. 1A-1C). The conductive lines 106 and 108 may comprise a material with a relatively low work function that is capable of inducing surface metallization of the OS layer 92 to reduce contact resistance in the TFTs 204. The conductive lines 106 and 108 may extend along a direction perpendicular to the conductive lines 72 such that individual cells of the memory array 200 may be selected for read and write operations. FIGS. 24A, 25A, 26A, and 27A illustrates a cross-sectional view along cross-section C-C' of FIG. 1A; FIGS. 24B, 25B, 26B, 27B, 28, and 29B illustrate a corresponding top down view; and FIG. 29A illustrate a cross-sectional view along cross-section D-D' of FIG. 1A.

Figure 24A:
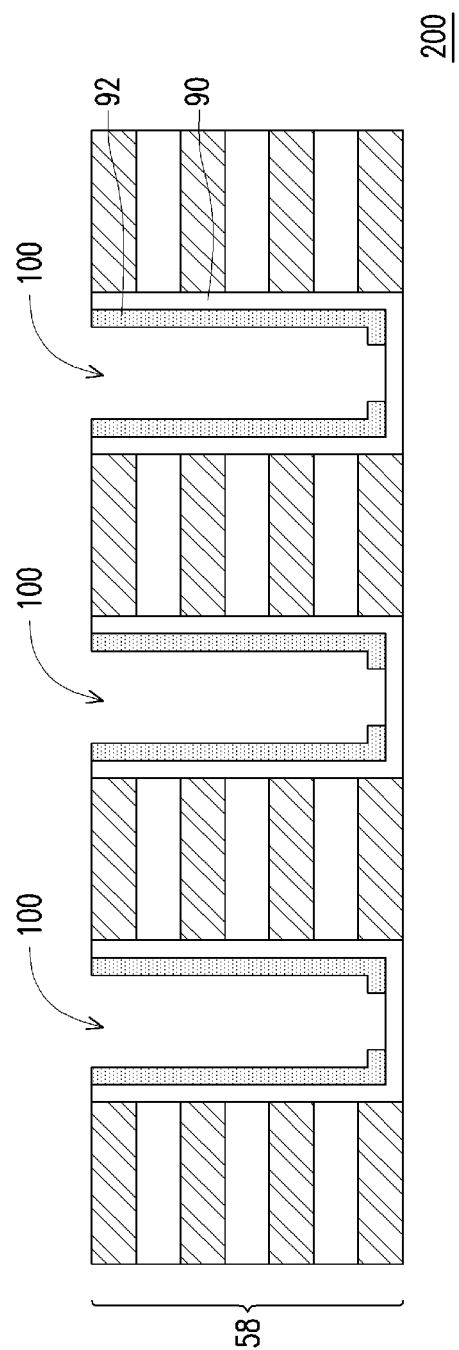
Figure 24B:
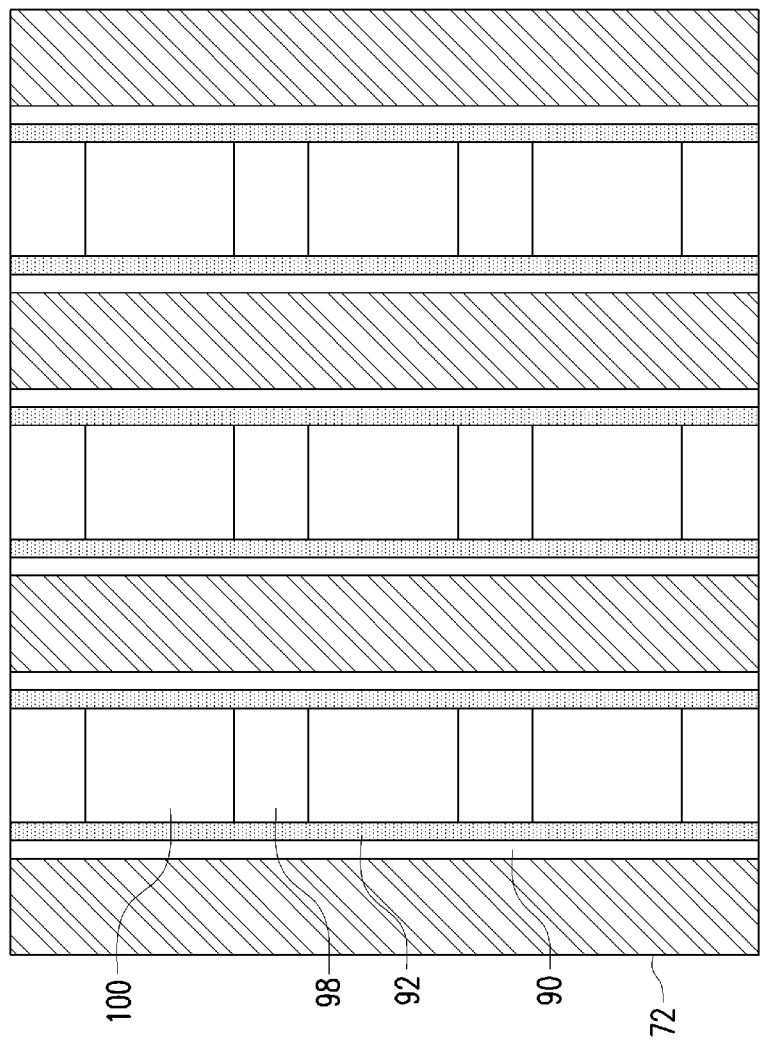

In FIGS. 24A and 24B, trenches 100 are patterned through the dielectric material 98 (including the dielectric material 98A and the dielectric material 98B). Patterning the trenches 100 may be performed through a combination of photolithography and etching, for example. The trenches 100 may be disposed between opposing sidewalls of the OS layer 92 and expose a top surface of the memory film 90 through the OS layer 92.

Figure 25A:
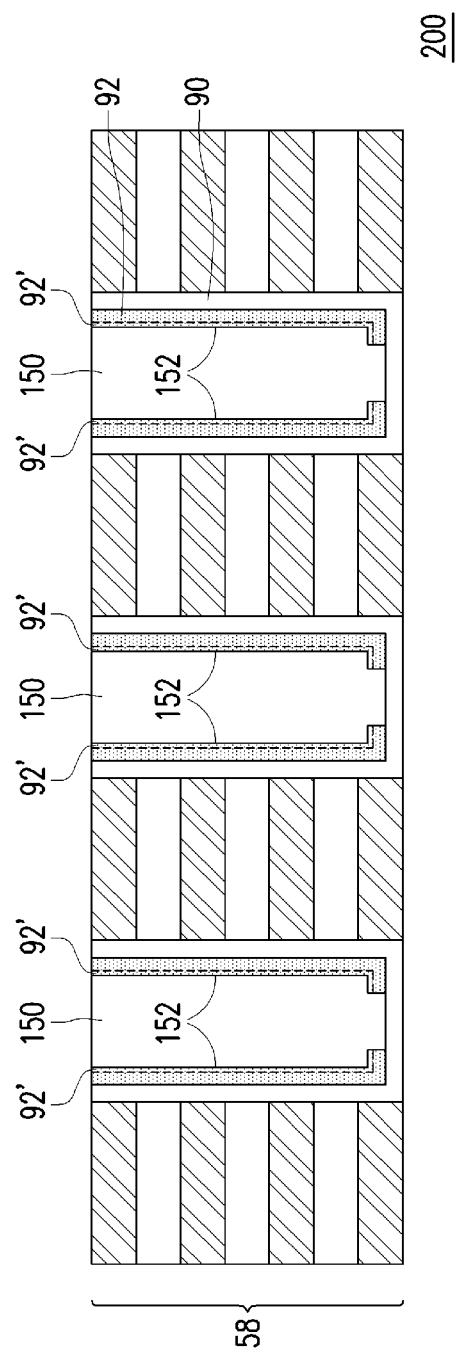
Figure 25B:
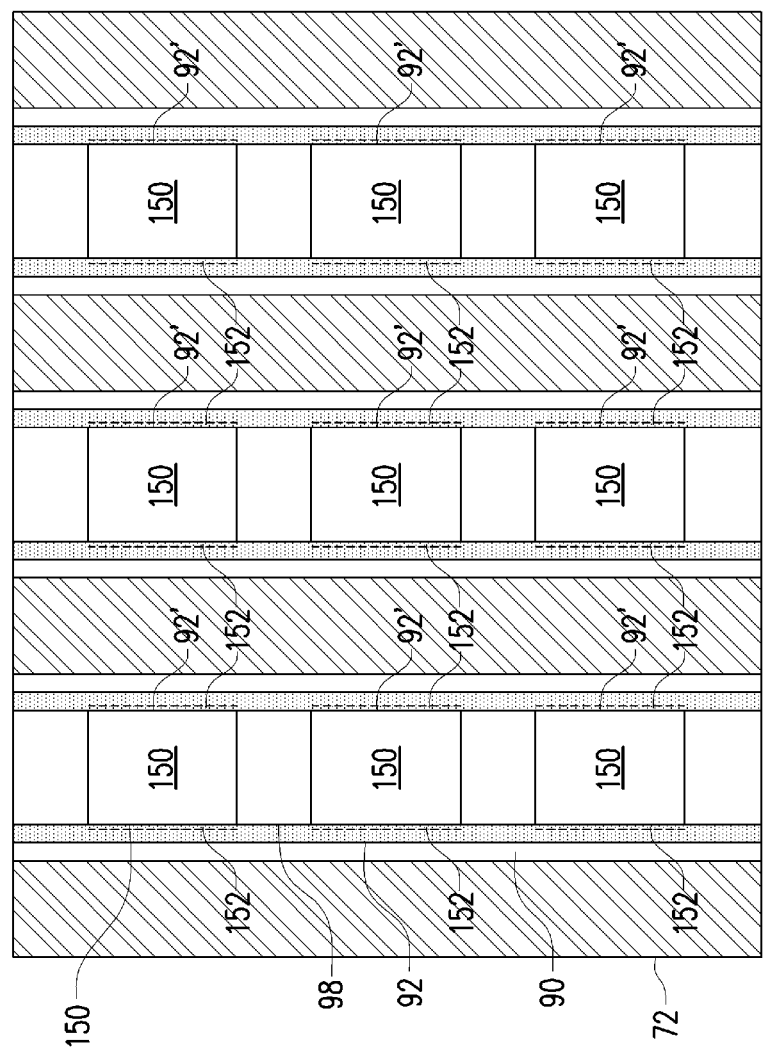

In FIGS. 25A and 25B, a conductive material 150 is formed in the trenches 100 on sidewalls of the OS layer 92. The conductive material 150 may have a relatively low work function, such as a work function less than about 4.6. For example, the conductive material 150 may comprise titanium, iridium, ruthenium, a conductive oxide (e.g., a ceramic such as LaNiO, InSnO, InZnO, CdSnO, aluminum-doped ZnO, F—SnO, or the like), or the like. It has been observed that when the conductive material 150 has a low work function (e.g., in the above range), the conductive material 150 is capable of inducing surface metallization of the OS layer 92 to reduce contact resistance at the interfaces between the OS layer 92 and the conductive material 150. It further has been observed that by providing a conductive material 150 with a low work function (e.g., less than 4.6), a barrier height between the conductive material 150 and the OS layer 92 may be reduced, and electron tunneling speed may be increased. The conductive material 150 may be deposited by CVD, PVD, ALD, PECVD, or the like.

After the conductive material 150 is deposited, an annealing process may be performed to induce surface metallization of the OS layer 92 at the interfaces 152 between the OS layer 92 and the conductive material 150. In some embodiments, the annealing process may be a temperature of at least about 300° C., which is sufficient to induce surface metallization of the OS layer 92. As a result of the annealing process, a poly-crystalline region 92' may be formed at the interfaces 152 between the OS layer 92 and the conductive material 150. For example, the poly-crystalline region 92' may be formed by a reaction between the $InO_a$ component of the OS layer 92 and the metal component of the conductive material 150 (denoted as M' below). The reaction may be expressed according to equations (1) and (2) where a and b are each integers between 0 and 1, and Vo represents film-generated defects (e.g., oxygen vacancies and/or deficiencies in the film).

$$InO_a + M' \longrightarrow M'O_b + InO_{a-b} + Vo \qquad (1)$$

$$Vo \longrightarrow Vo^{2+} + 2e^- \qquad (2)$$

As indicated above, the poly-crystalline region may comprise a metal oxide, and a metal element of the metal oxide may be the same as a metal element of the conductive material 150. A thickness of poly-crystalline region 92' (e.g., a depth into the OS layer 92 that the poly-crystalline region 92' extends) may be in a range of about 1 nm to about 10 nm, or in a range of about 1 nm to about 5 nm, in some embodiments. It has been observed that by having a relatively thin poly-crystalline region (e.g., in the above ranges), electrons can tunnel more easily across the boundary between the conductive material 150 and the OS layer 92. In other embodiments, the poly-crystalline region may have a different thickness. A remainder of the OS layer 92 (e.g., outside of the poly-crystalline region 92') may remain in a same crystalline stage as prior to the annealing process. For example, the remainder of the OS layer 92 may remain amorphous.

As also illustrated in FIGS. 25A and 25B, a removal process is then applied to the conductive material 150 to remove excess material over the multi-layer stack 58. In some embodiments, a planarization process such as a CMP, an etch-back process, combinations thereof, or the like may be utilized. The planarization process exposes the multi-layer stack 58 such that the top surfaces of the multi-layer stack 58, the memory film 90, the OS layer 92, and the conductive material 150 are level after the planarization process is complete.

Figure 31A:
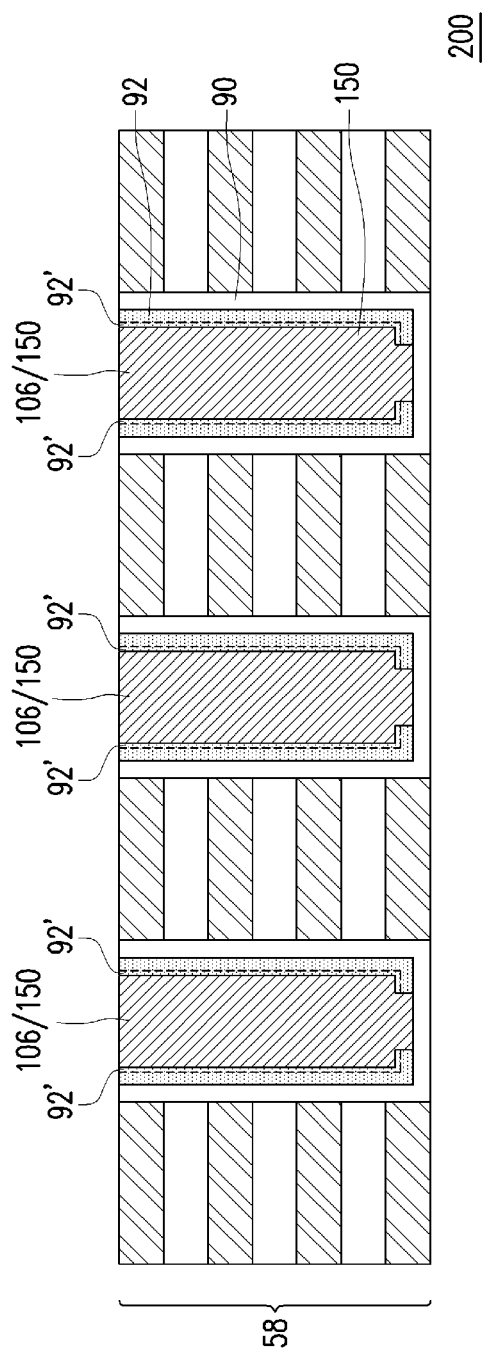
Figure 31B:
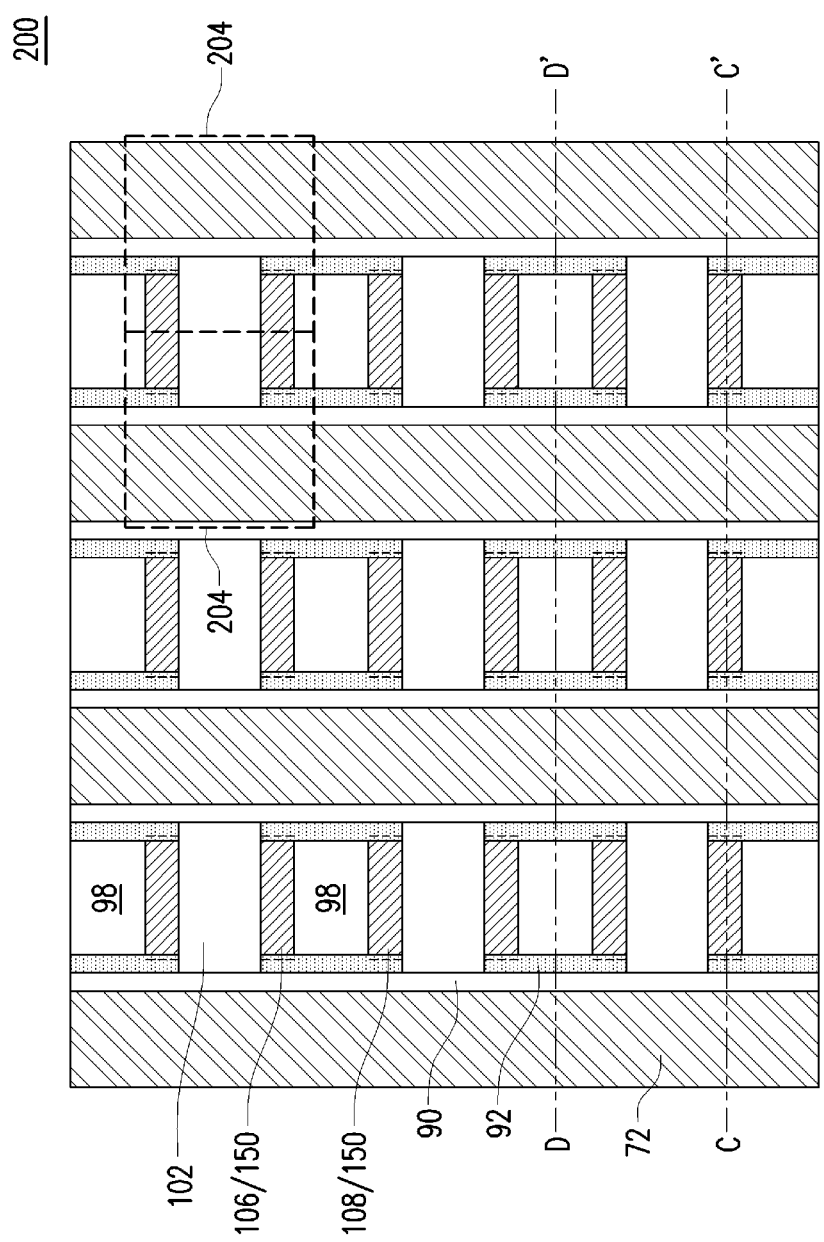

FIGS. 26A through 27B illustrate manufacturing steps where center portions of the conductive material is replaced with a different conductive material. As a result, the conductive lines 106 and 108 (see FIG. 28) may comprise two different materials (e.g., the conductive material 150 and the conductive material 156, described below). The steps illustrated in FIGS. 26A through 27B are optional and may be omitted in some embodiments. In such embodiments, the conductive lines 106 and 108 may only comprise the conductive material 150 as illustrated by FIGS. 31A through 31C.

Figure 26A:
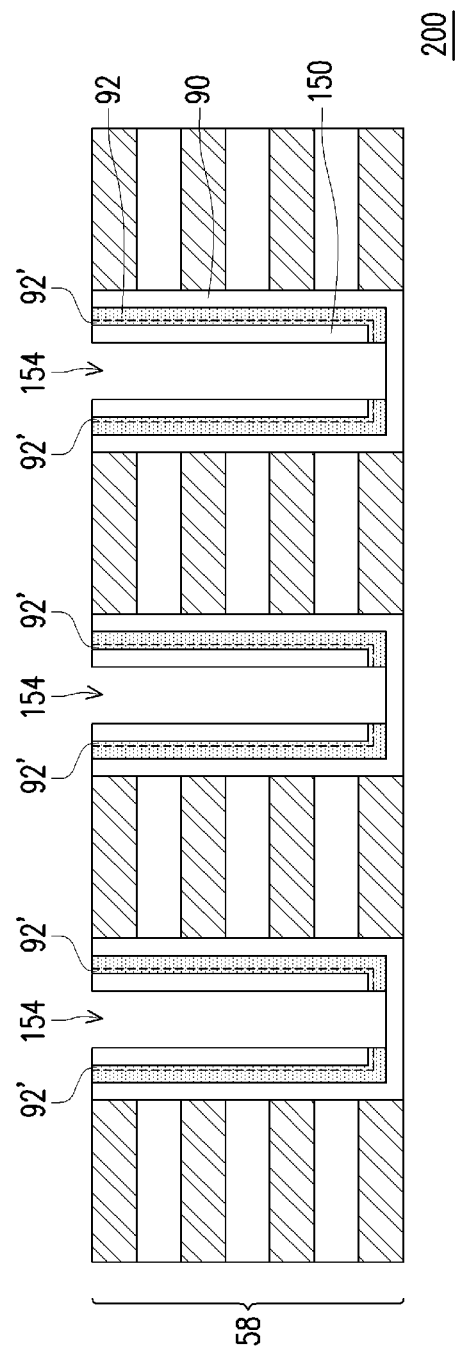
Figure 26B:
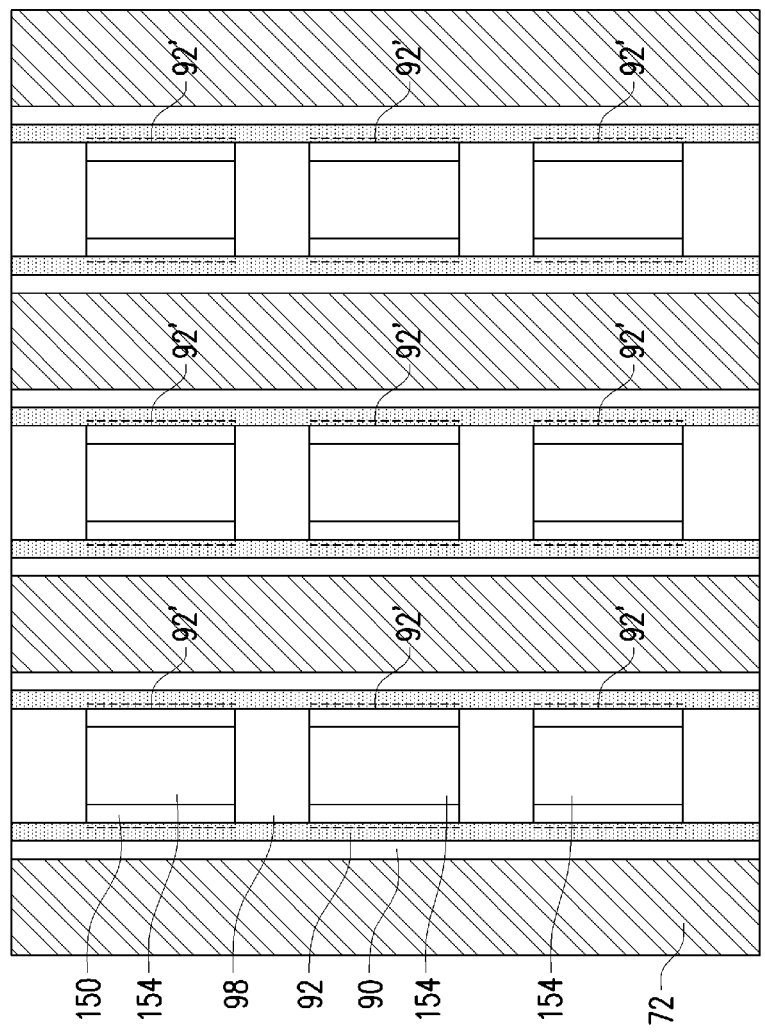

In FIGS. 26A and 26B, trenches 154 are patterned through the conductive material 150. Patterning the trenches 154 may be performed through a combination of photolithography and etching, for example. The trenches 100 may be disposed between opposing sidewalls of the conductive material 150, and remaining portions of the conductive material 150 may be disposed between the trenches 100 and the OS layer 92. The trenches 154 extends through the conductive material 150 and the OS layer 92 to expose the underlying memory film 90.

Figure 27A:
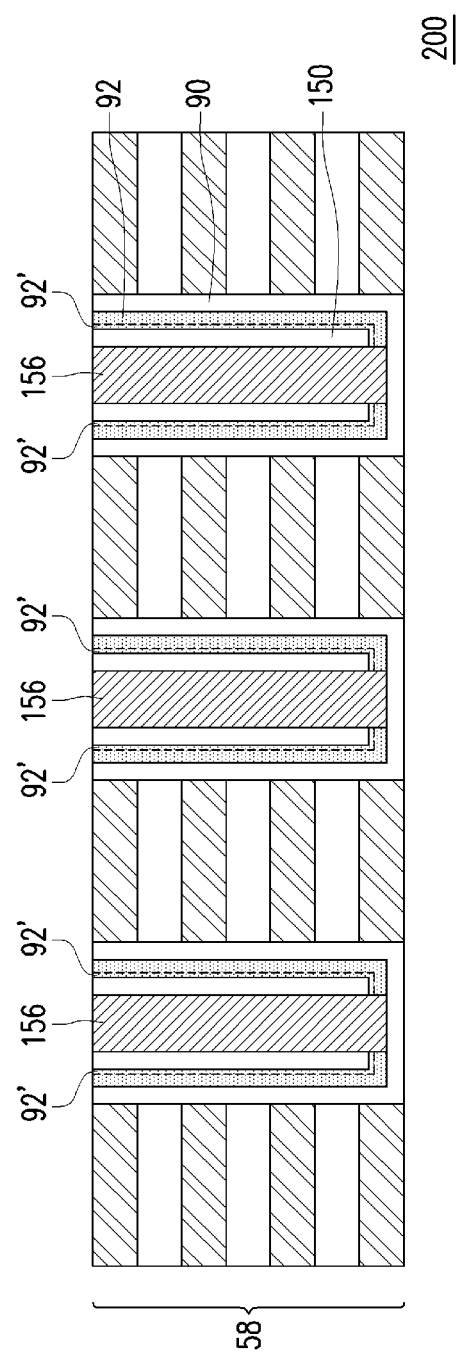
Figure 27B:
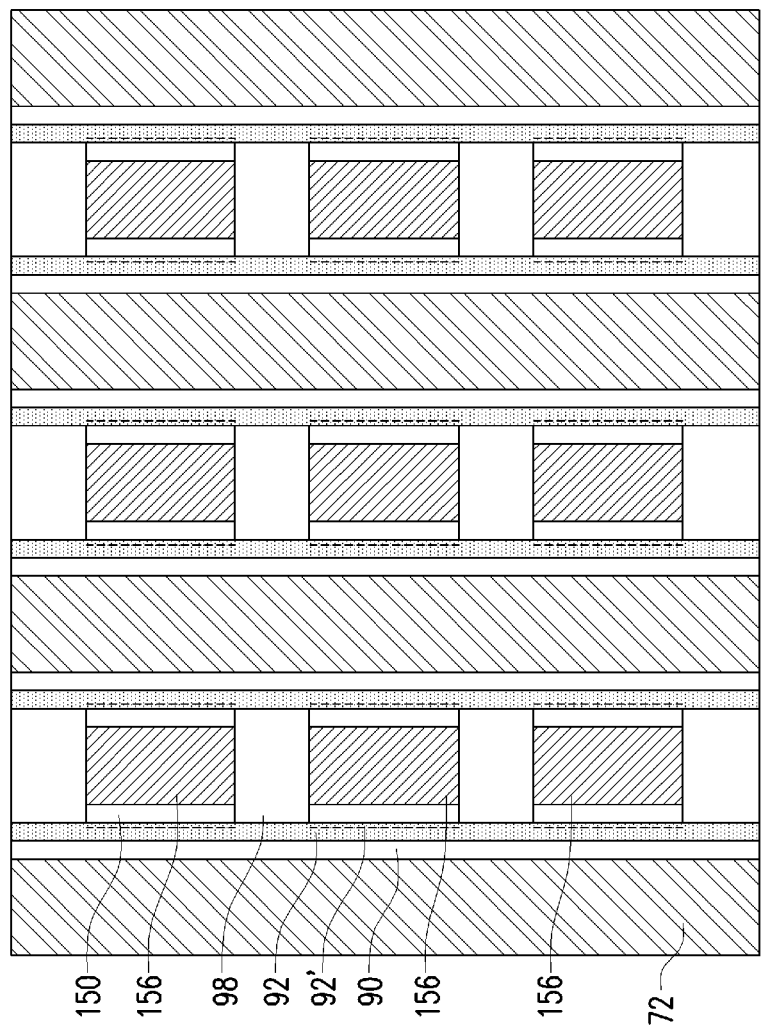
Figure 27C:
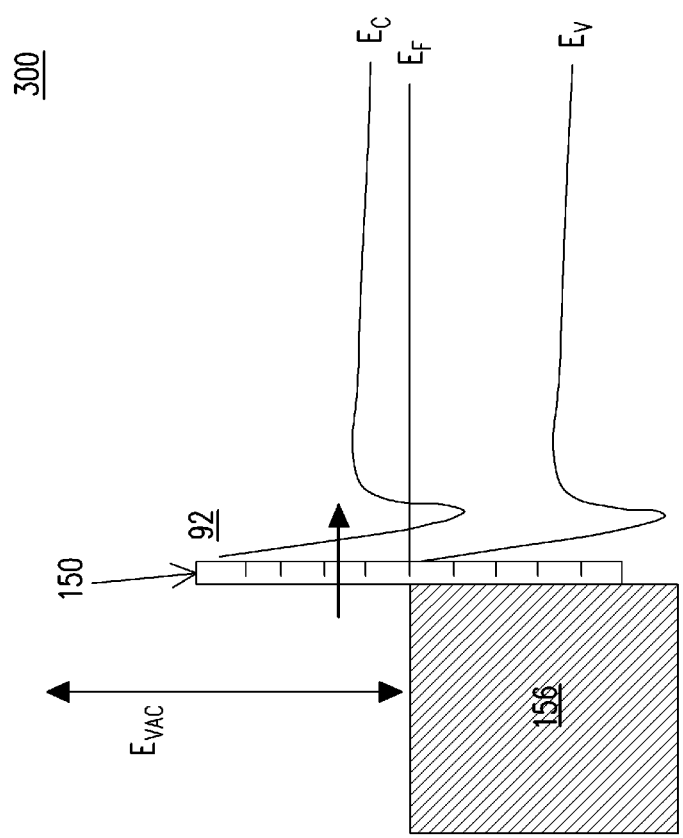
FIG. 27C illustrates characteristics of a device in accordance with some embodiments.

In FIGS. 27A and 27B, a conductive material 156 is deposited the fill the trenches 154. The conductive material 156 may be disposed and contact opposing portions of the conductive material 150. In some embodiments, the conductive material 156 may have a relatively low work function, such as a work function less than about 5 eV. For example, the conductive material 156 may comprise TiN, W, Ti, MoTi, CuMgAl, Ru, Al, Ta, TaN, CuMn, CuAlZn, combinations thereof, or the like. The conductive material 156 may be deposited by CVD, PVD, ALD, PECVD, or the like. It has been observed that by providing a conductive material 156 with a low work function (e.g., in the above range), a barrier height between the conductive material 156 and the conductive material 150/the OS layer 92 may be reduced, and electron tunneling speed may be increased. After deposition, a planarization process such as a CMP, an etch-back process, combinations thereof, or the like may be utilized. The planarization process exposes the multi-layer stack 58 such that the top surfaces of the multi-layer stack 58, the memory film 90, the OS layer 92, the conductive material 150, and the conductive material 156 are level after the planarization process is complete.

As a result of forming the low work function (e.g., less than about 4.6), conductive material 150 and the poly-crystalline regions 92' in the OS layer 92, electrons can directly tunnel from the conductive material 156, through the conductive material 150, and across the channel regions of the OS layer 92. For example, as a result of forming the conductive material according to various embodiments, the OS layer 92 may include a low resistivity region (e.g., the poly-crystalline regions 92') regardless of the phase of the OS layer 92 (e.g., crystalline or amorphous). As a result, contact resistance can be reduced. This reduced resistivity and improved electron tunneling is illustrated by the band-gap diagram 300 of FIG. 27C, which illustrates a conduction band ($E_C$), a valance band ($E_V$), a Femi-level ($E_F$), and a vacuum energy level ($E_{VAC}$) of the conductive material 156, the conductive material 150, and the OS layer 92. The valence band and conduction band are the bands closest to the Fermi level and determine the electrical conductivity of the material. Further, the valence band is the highest range of electron energies in which electrons are normally present at absolute zero temperature while the conduction band is the lowest range of vacant electronic states. Further, the conductive material 150 and/or the conductive material 156 may be less susceptible to undesired oxidation than, for example, pure copper. Thus, device performance deterioration due to oxidation can be avoided.

Figure 28:
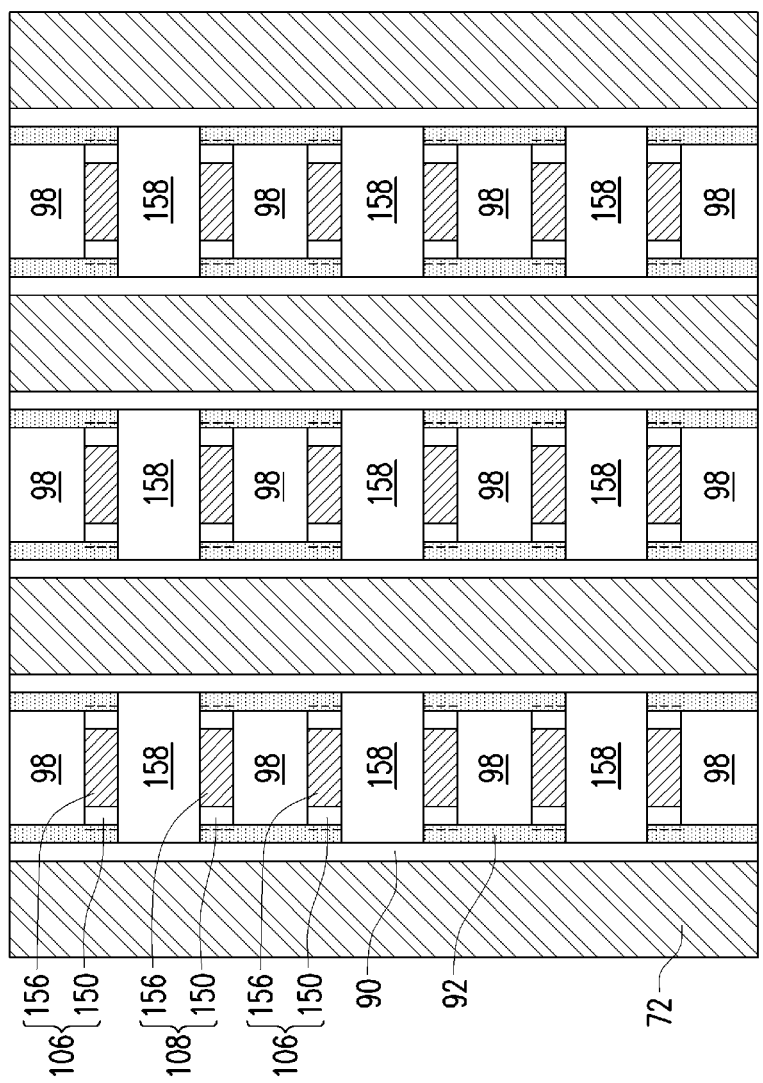

In FIG. 28, trenches 158 are patterned through the conductive material 150, the conductive material 156, and the OS layer 92. Patterning the trenches 158 may be performed through a combination of photolithography and etching, for example. The trenches 158 may be disposed between opposing sidewalls of the memory film 90. As a result, the conductive lines 106 and 108 are defined from remaining portions of the conductive material 150 and the conductive material 156. Each of the conductive lines 106 is separated from an adjacent conductive line 108 by the dielectric material 98, and pairs of conductive lines 106/108 are separated by the trenches 158. Discrete portions of the OS layer 92 extends continuously from a respective conductive line 106 to a respective conductive line 108. The conductive lines 106 may correspond to bit lines in the memory array, and the conductive lines 108 may correspond to source lines in the memory array 200. Further, the conductive lines 106/108 may provide source/drain electrodes for TFTs 204 (see FIGS. 29A and 29B) in the memory array 200.

Figure 29A:
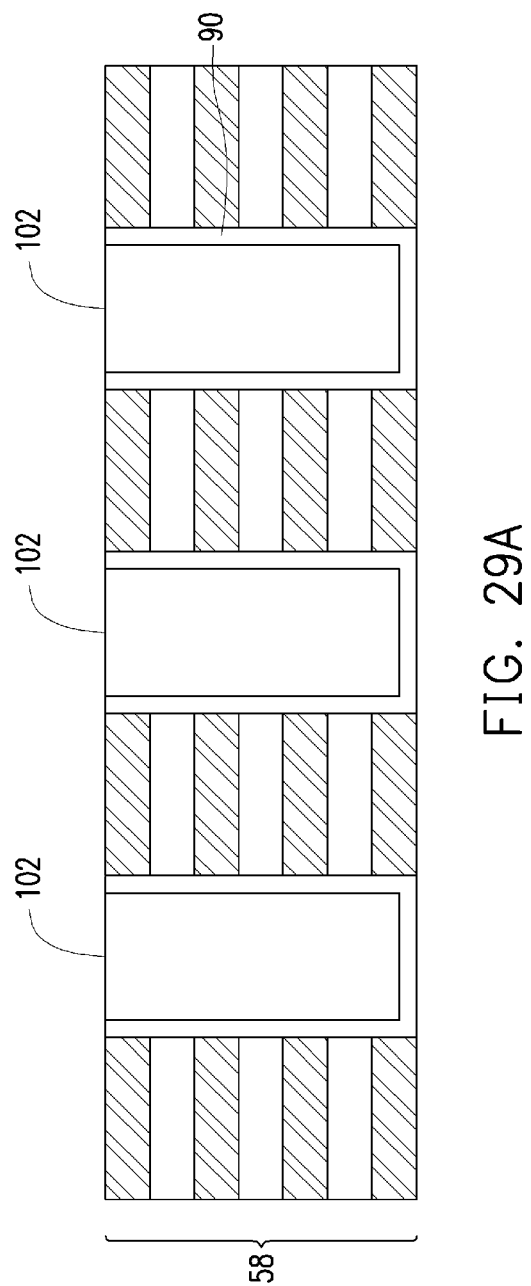
Figure 29B:
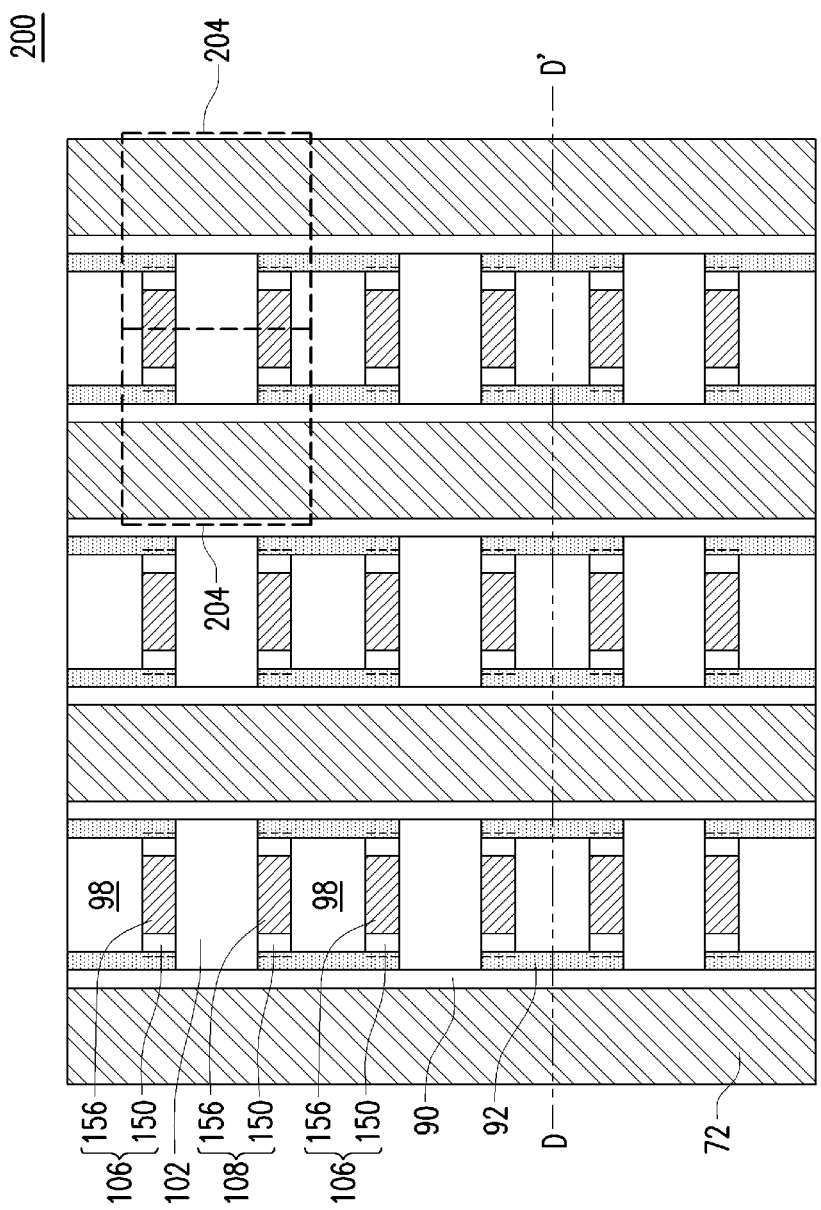

In FIGS. 29A and 29B, a dielectric material 102 is deposited in and fills the trenches 158. FIG. 29B illustrates a cross-section view of line D-D' in FIG. 29A. The dielectric layer 102 may include, for example, silicon oxide, silicon nitride, silicon oxynitride, or the like, which may be deposited by CVD, PVD, ALD, PECVD, or the like. The dielectric layer 102 may extend along sidewalls and a bottom surface of the trenches 86 over the memory film 92. After deposition, a planarization process (e.g., a CMP, etch back, or the like) may be performed to remove excess portions of the dielectric material 102. In the resulting structure, top surfaces of the multi-layer stack 58, the memory film 90, the OS layer 92, the dielectric material 102, and the conductive lines 106/108 may be substantially level (e.g., within process variations).

Thus stacked TFTs 204 may be formed in the memory array 200. Each TFT 204 comprises a gate electrode (e.g., a portion of a corresponding conductive line 72), a gate dielectric (e.g., a portion of a corresponding memory film 90), a channel region (e.g., a portion of a corresponding OS layer 92), and source and drain electrodes (e.g., portions of corresponding conductive lines 106 and 108). The dielectric material 102 isolates adjacent TFTs 204 in a same column and at a same vertical level. The TFTs 204 may be disposed in an array of vertically stacked rows and columns.

Figure 30A:
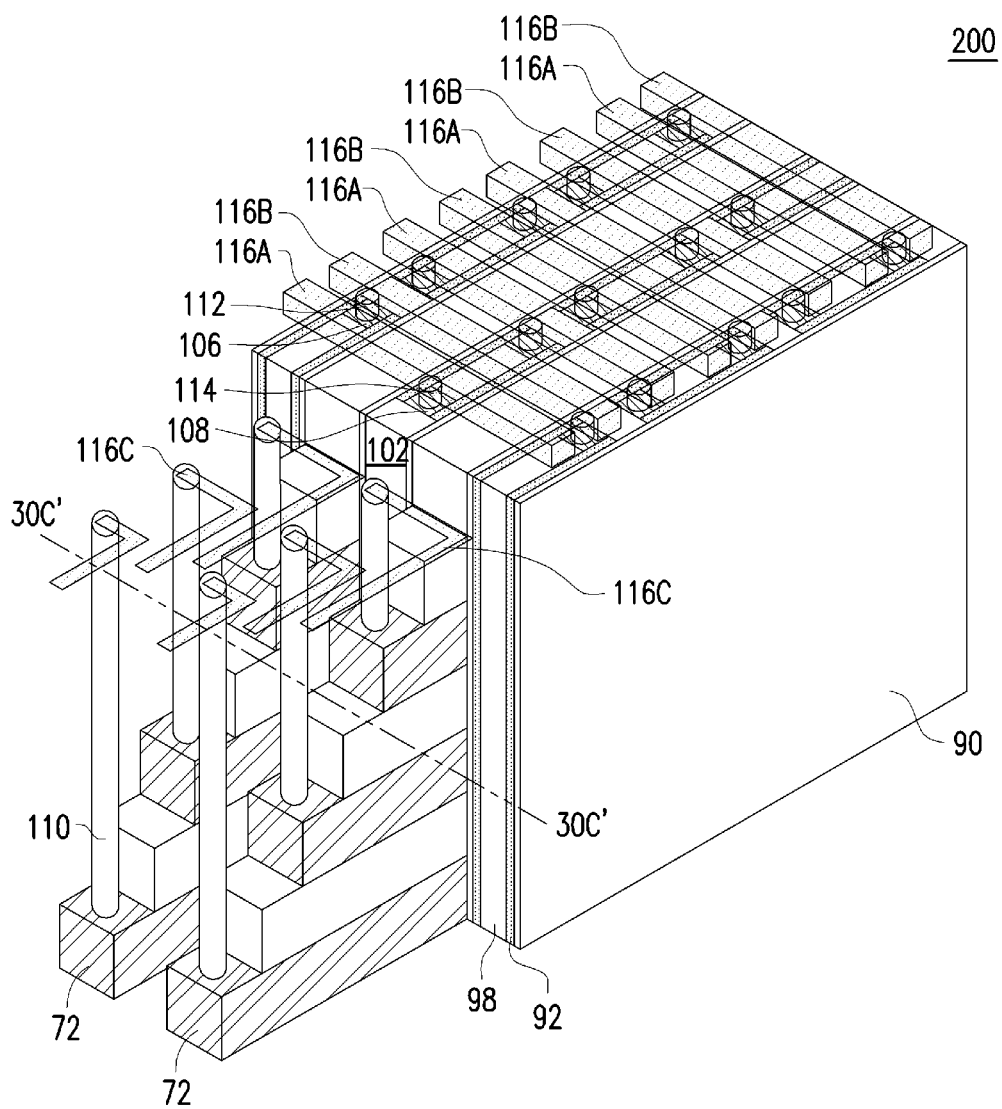
Figure 30B:
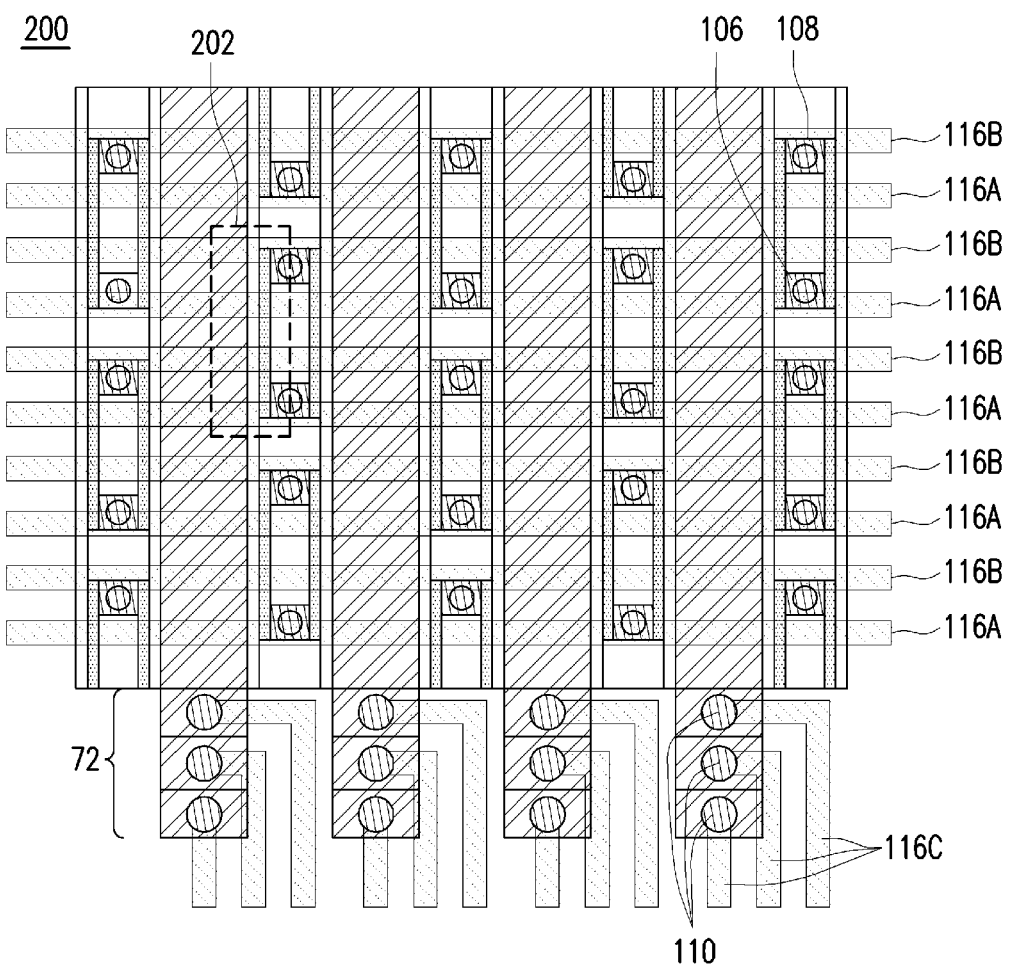
Figure 30C:
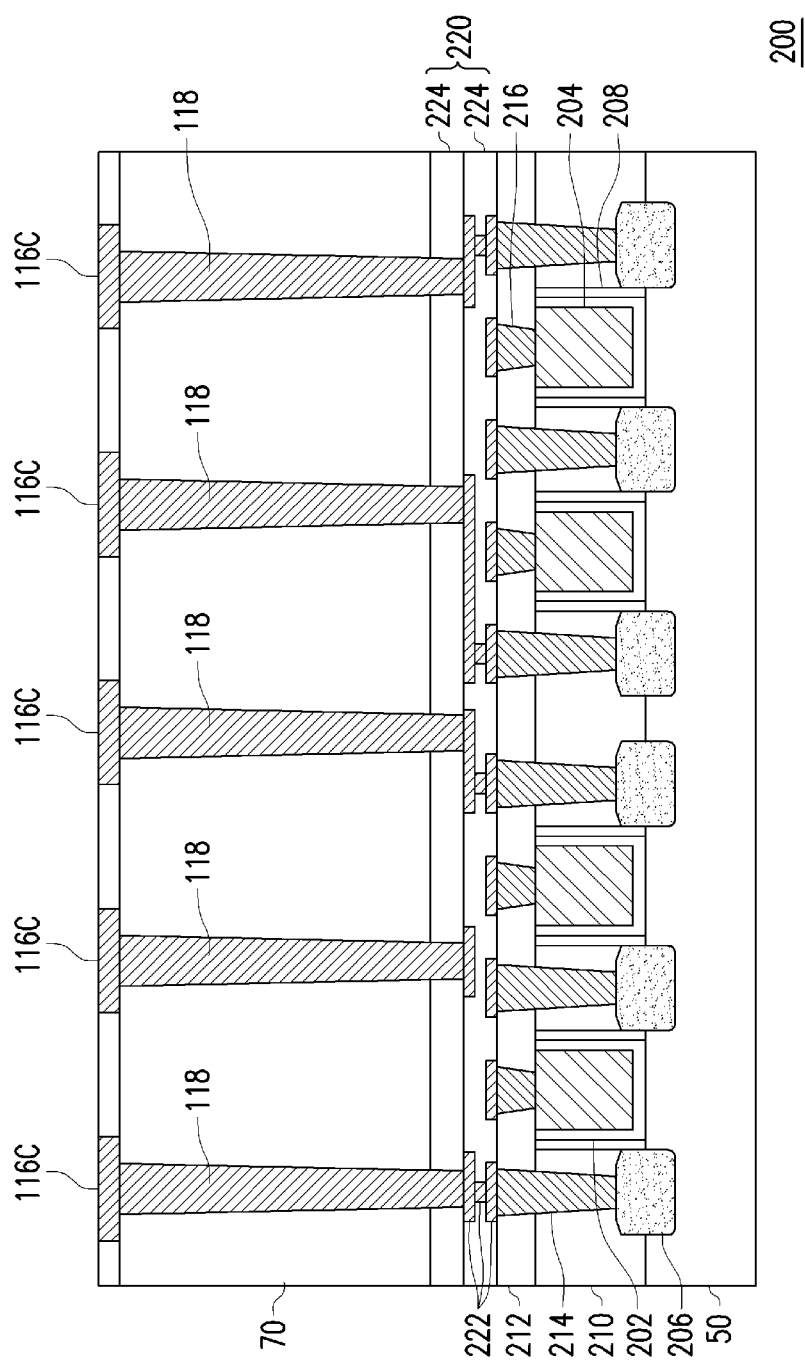
Figure 30D:
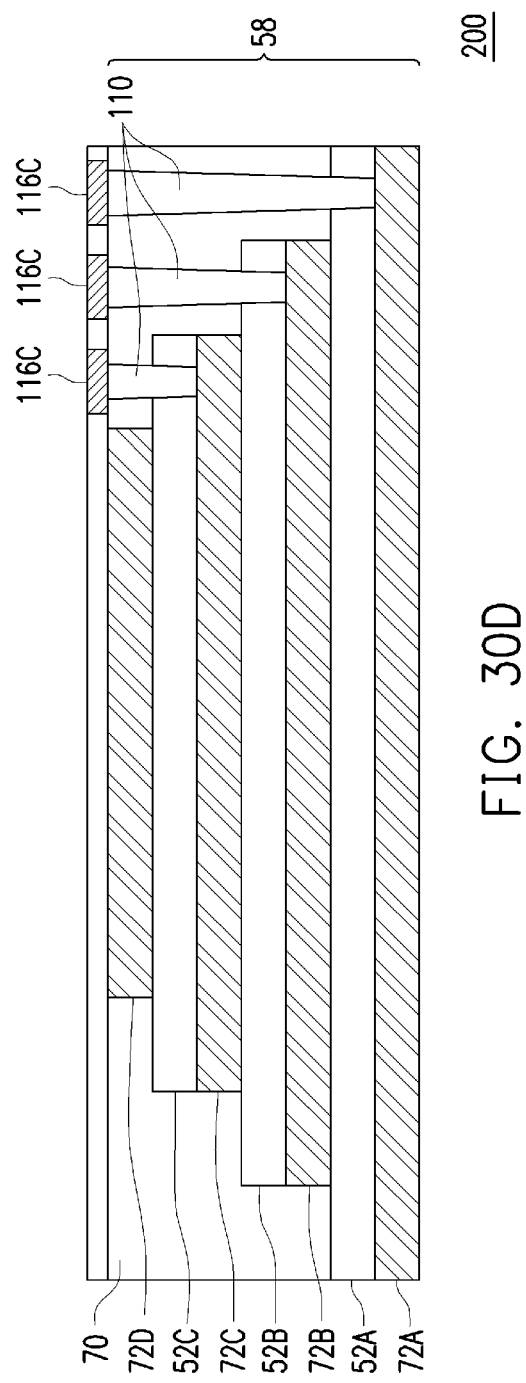

In FIGS. 30A, 30B, 30C, and 30D, contacts 110 are made to the conductive lines 72, the conductive lines 106, and the conductive lines 108. FIG. 30A illustrates a perspective view of the memory array 200; FIG. 30B illustrates a top-down view of the memory array 200; FIG. 30C illustrates a cross-sectional view of the device and underlying substrate alone the line 30C'-30C' of FIG. 28A; and FIG. 30D illustrates a cross-sectional view of the device along line B-B' of FIG. 1A. In some embodiments, the staircase shape of the conductive lines 72 may provide a surface on each of the conductive lines 72 for the conductive contacts 110 to land on. Forming the contacts 110 may include patterning openings in the IMD 70 and the dielectric layers 52 to expose portions of the conductive layers 54 using a combination of photolithography and etching, for example. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the IMD 70. The remaining liner and conductive material form the contacts 110 in the openings.

As also illustrated by the perspective view of FIG. 30A, conductive contacts 112 and 114 may also be made to the conductive lines 106 and the conductive lines 108, respectively. The conductive contacts 110, 112, and 114 may be electrically connected to conductive lines 116A, 116B, and 116C, respectively, which connect the memory array to an underlying/overlying circuitry (e.g., control circuitry) and/or signal, power, and ground lines in the semiconductor die. For example, conductive vias 118 may extend through the IMD 70 to electrically connect conductive lines 116C to the underlying circuitry of the interconnect structure 220 and the active devices on the substrate 50 as illustrated by FIG. 30C. Other conductive vias may be formed through the IMD 70 to electrically connect the conductive lines 116A and 116B to the underlying circuitry of the interconnect structure 220. In alternate embodiments, routing and/or power lines to and from the memory array may be provided by an interconnect structure formed over the memory array 200 in addition to or in lieu of the interconnect structure 220. Accordingly, the memory array 200 may be completed.

FIGS. 31A, 31B, and 31C illustrate cross-sectional view of a memory array 220 according to alternate embodiments. FIG. 31A illustrates a cross-sectional view along cross-section C-C' of FIGS. 1A and 31B; FIG. 31B illustrates a corresponding top down view, and FIG. 31C illustrates a cross-sectional view alone cross-section D-D' of FIGS. 1A and 31B. The memory array 200 may be substantially similar to the memory array where like reference numerals indicate like elements formed by like processes. However, in the memory array 220, the conductive material 156 (see FIG. 29B) and the steps illustrated in FIGS. 26A through 27B are omitted. As a result, the conductive lines 106 and 108 are made of the low work function, conductive material 150. The conductive material 150 may be similar as described above with a low work function (e.g., less than 4.6) for reduced resistivity between the conductive lines 106/108 and the OS layer 92. Further, a poly-crystalline region 92' may be formed in the OS layer 92 at the boundary with the conductive material 150 by an annealing process, for example.

FIGS. 32A through 35C illustrate intermediate steps of forming the conductive lines 106 and 108 in a memory array 250 according to some alternate embodiments. The memory array 200 may be similar to the memory array 200 where like reference numerals indicate like elements formed by like processes unless otherwise noted. In FIGS. 32A through 35C, figures ending in "A" illustrate a 3D view; figures ending in "B" illustrate a top down view, and figures ending in "C" illustrate a corresponding cross-sectional view parallel to line C-C' of FIG. 1A.

Figure 32A:
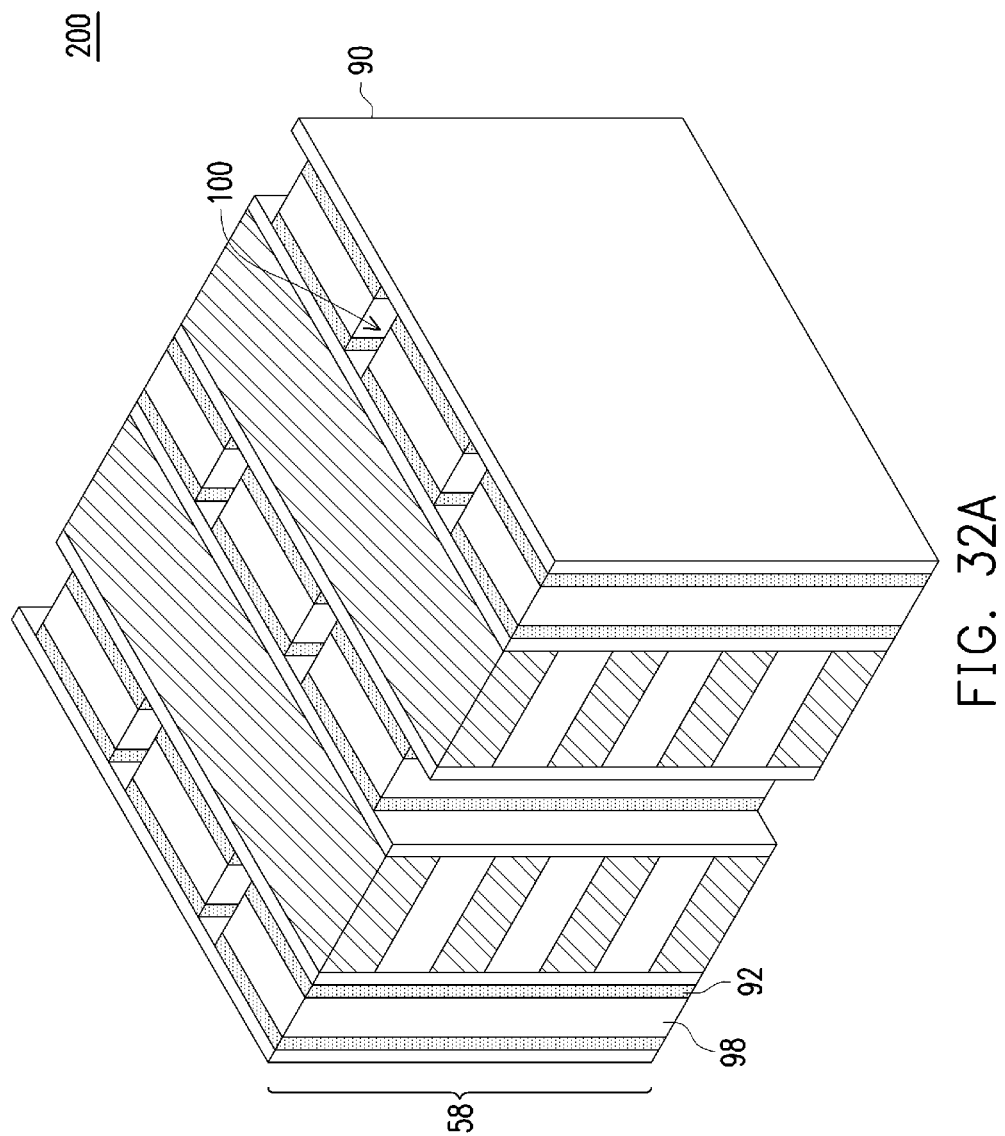
FIGS. 32A, 32B, 32C, 33A, 33B, 33C, 34A, 34B, 34C, 35A, 35B, and 35C illustrates illustrate a memory array in accordance with some embodiments.
Figure 32B:
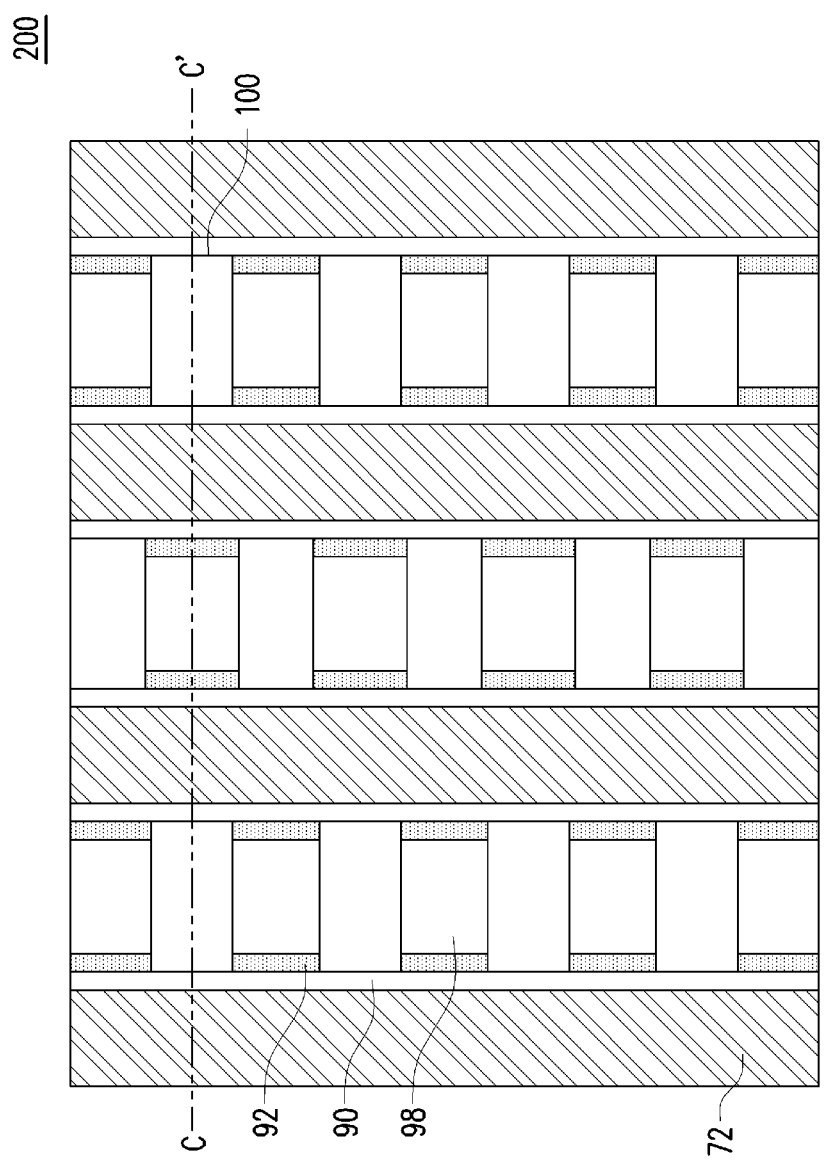
Figure 32C:
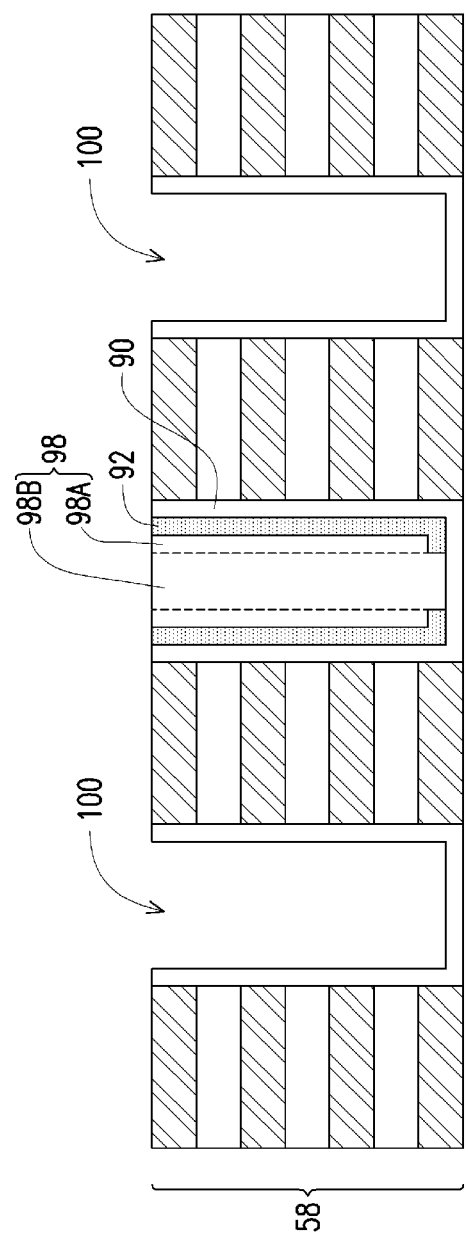

In FIGS. 32A, 32B, and 32C, the trenches 100 are patterned through the OS layer 92 and the dielectric material 98 (including the dielectric material 98A and the dielectric material 98B). FIG. 32C illustrates a cross-sectional view of line C-C' in FIG. 32B. Patterning the trenches 100 may be performed through a combination of photolithography and etching, for example. The trenches 100 may be disposed between opposing sidewalls of the memory film 90, and the trenches 100 may physically separate adjacent stacks of memory cells in the memory array 200 (see FIG. 1A). Further, the trenches 100 may be have a staggered configuration in a top down view (see FIG. 32B). Alternatively, the trenches 100 may be aligned in a similar manner as illustrated above for memory array 200.

Figure 33A:
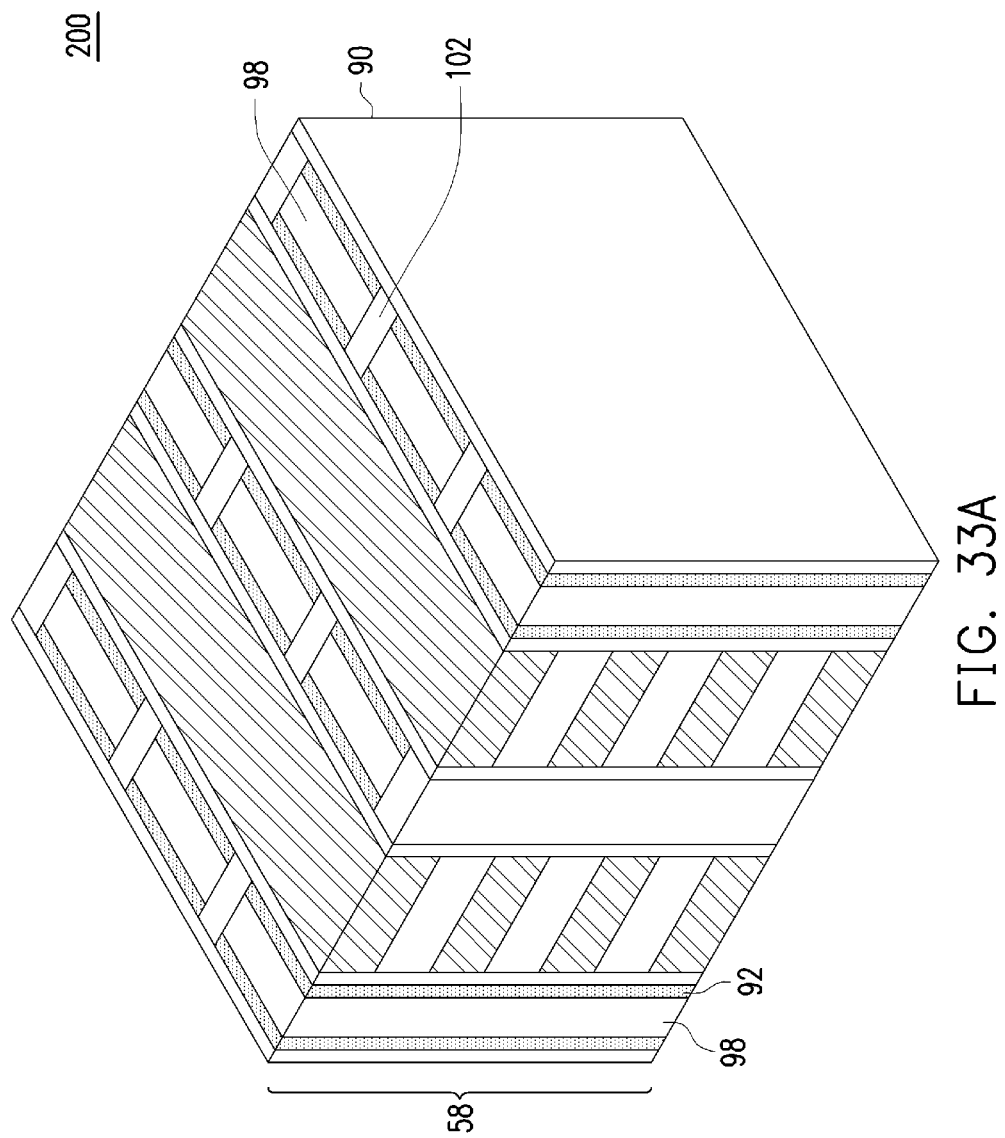
Figure 33B:
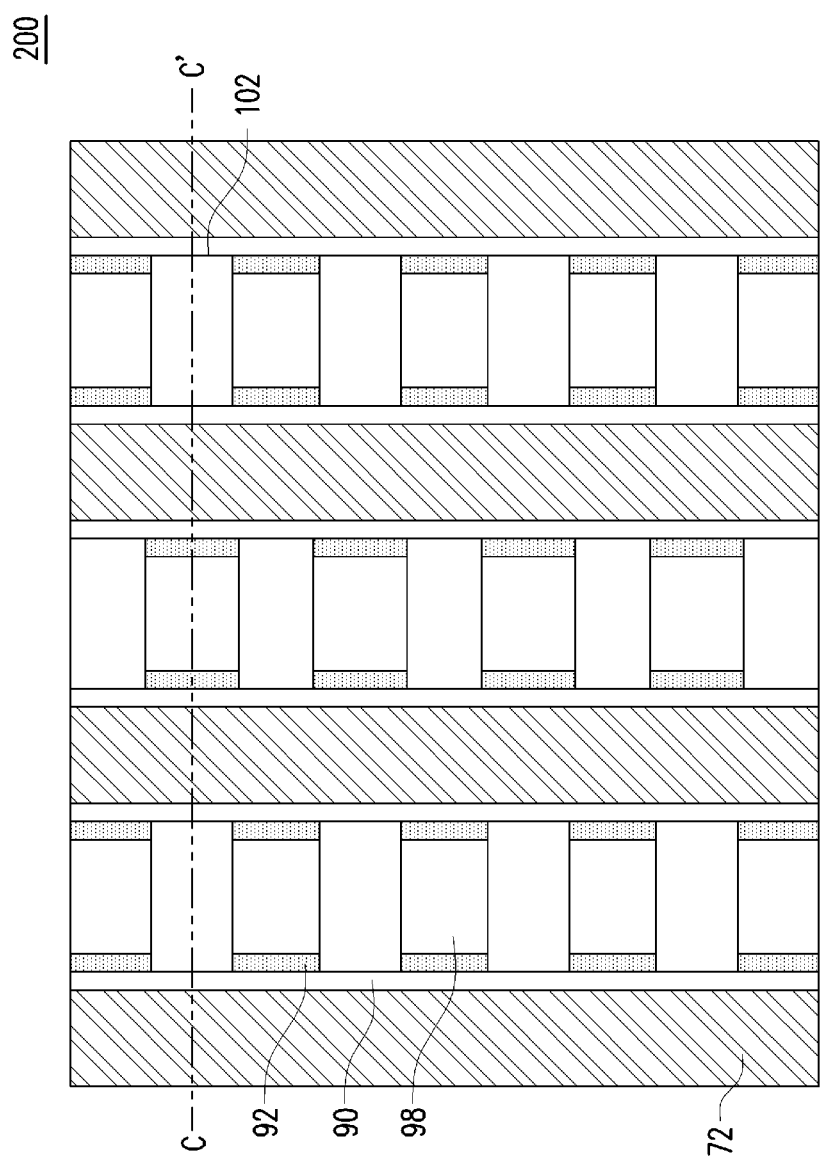
Figure 33C:
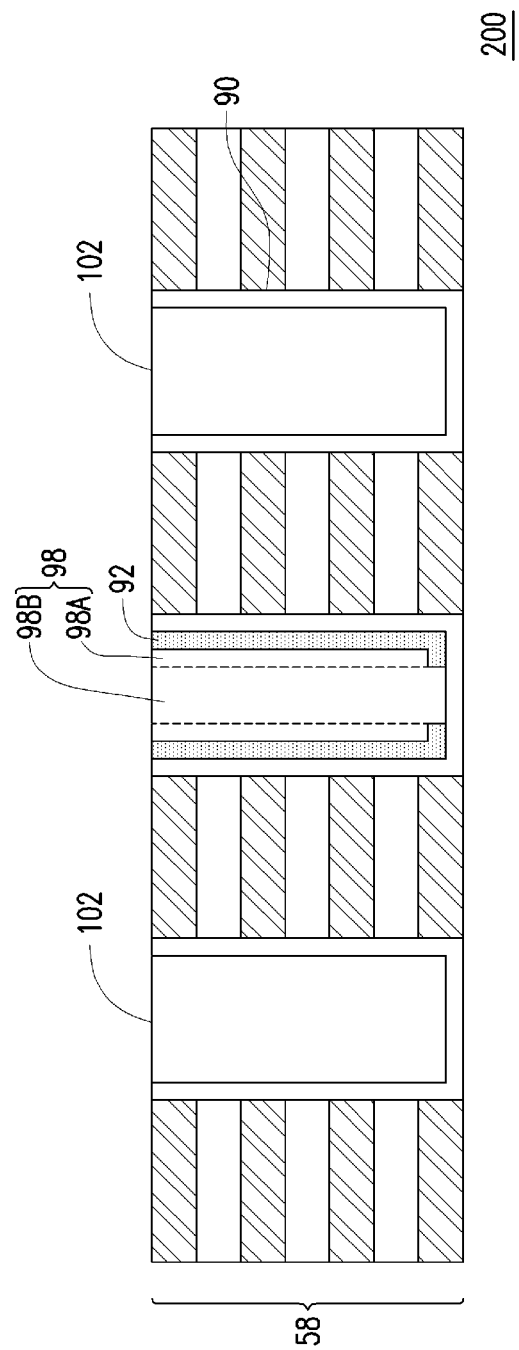

In FIGS. 33A, 33B, and 33C, a dielectric material 102 is deposited in and fills the trenches 100. FIG. 33C illustrates a cross-section view of line C-C' in FIG. 33B. The dielectric layer 102 may include, for example, silicon oxide, silicon nitride, silicon oxynitride, or the like, which may be deposited by CVD, PVD, ALD, PECVD, or the like. The dielectric layer 102 may extend along sidewalls and a bottom surface of the trenches 86 over the OS layer 92. After deposition, a planarization process (e.g., a CMP, etch back, or the like) may be performed to remove excess portions of the dielectric material 102. In the resulting structure, top surfaces of the multi-layer stack 58, the memory film 90, the OS layer 92, and the dielectric material 102 may be substantially level (e.g., within process variations). In some embodiments, materials of the dielectric materials 98 and 102 may be selected so that they may be etched selectively relative each other. For example, in some embodiments, the dielectric material 98 is an oxide and the dielectric material 102 is a nitride. In some embodiments, the dielectric material 98 is a nitride and the dielectric material 102 is an oxide. Other materials are also possible.

Figure 34A:
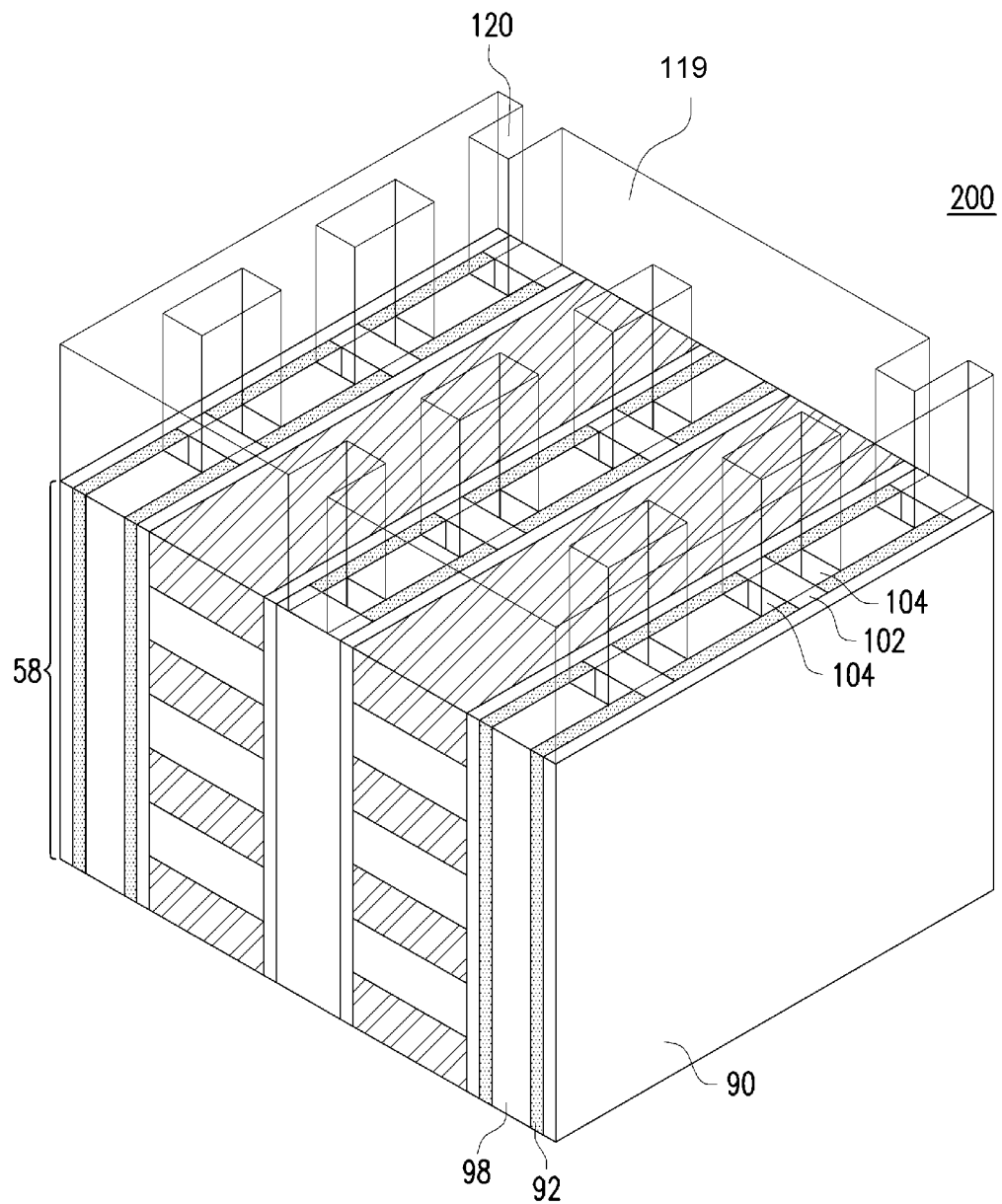
Figure 34B:
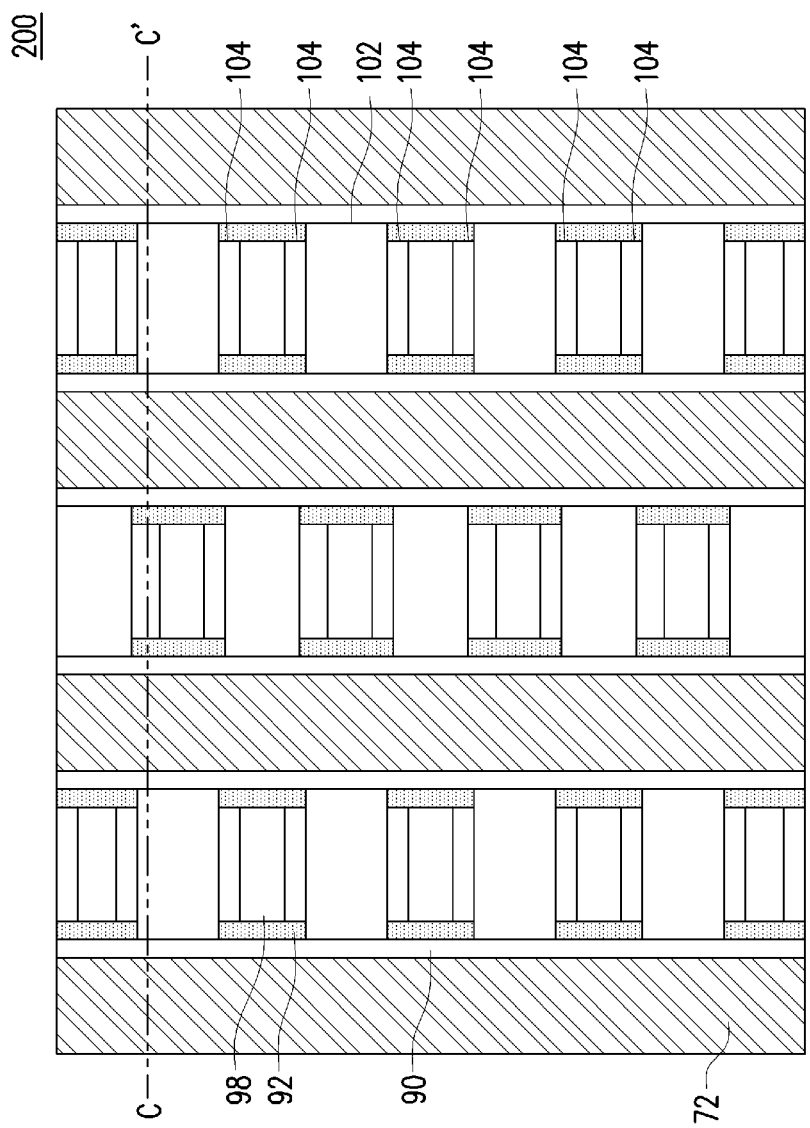
Figure 34C:
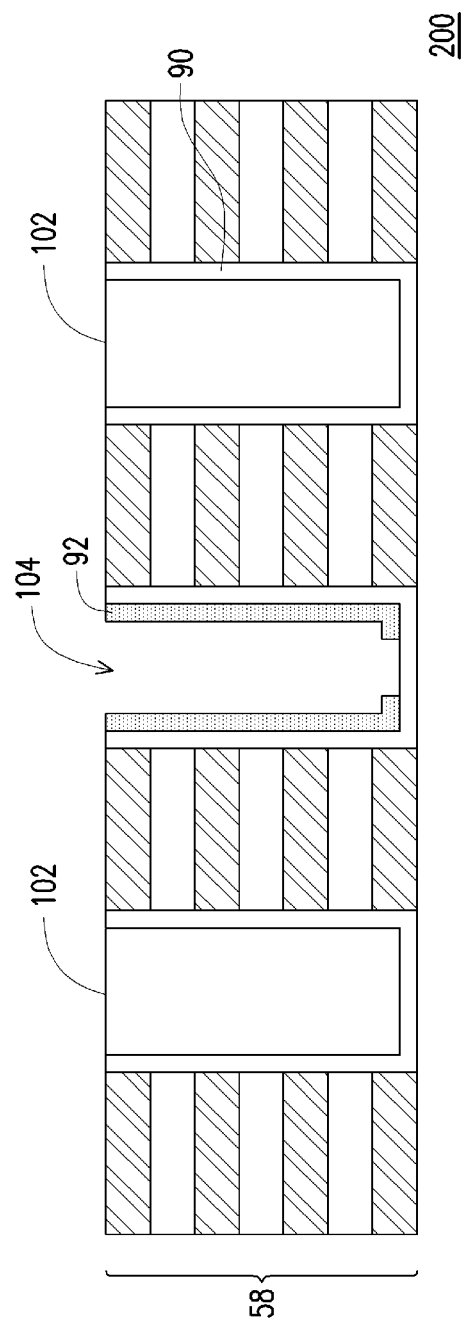

In FIGS. 34A, 34B, and 34C, trenches 104 are patterned for the conductive lines 106 and 108. FIG. 34C illustrates a cross-sectional view of line C-C' in FIG. 34B. The trenches 104 are patterned by patterning the dielectric material 98 (including the dielectric material 98A and the dielectric material 98C) using a combination of photolithography and etching, for example.

For example, a photoresist 119 may be deposited over the multi-layer stack 58, the dielectric material 98, the dielectric material 102, the OS layer 92, and the memory film 90. The photoresist 119 can be formed by using a spin-on technique, for example. The photoresist 82 is patterned to define openings 120. Each of the openings 120 may overlap a corresponding region of the dielectric material 102, and each of the openings 120 may further partially expose two separate regions of the dielectric material 98. For example, each opening 120 may expose a region of the dielectric material 102; partially expose a first region of the dielectric material 98; and partially expose a second region of the dielectric material 98 that is separated from the first region of the dielectric material 98 by the region of the dielectric material 102. In this way, each of the openings 120 may define a pattern of a conductive line 106 and an adjacent conductive line 108 that are separated by the dielectric material 102. The photoresists can be patterned using acceptable photolithography techniques. For example, the photoresist 82 be exposed to light for patterning. After the exposure process, the photoresist 82 may be developed to remove exposed or unexposed portions of the photo resist depending on whether a negative or positive resist is used, thereby defining a patterning of the form openings 120.

Subsequently, portions of the dielectric material 98 exposed by the openings 120 may be removed by etching, for example. The etching may be any acceptable etch process, such as by wet or dry etching, a reactive ion etch (RIE), neutral beam etch (NBE), the like, or a combination thereof. The etching may be anisotropic. The etching process may use an etchant that etches the dielectric material 98 without significantly etching the dielectric material 102. As a result, even though the openings 120 expose the dielectric material 102, the dielectric material 102 may not be significantly removed. A pattern of the trenches 104 may correspond to the conductive lines 106 and 108 (see FIGS. 35A, 35B, and 35C). For example, a portion of the dielectric material 98 may remain between each pair of the trenches 104, and the dielectric material 102 may be disposed between adjacent pairs of the trenches 104. After the trenches 104 are patterned, the photoresist 119 may be removed by ashing, for example.

Figure 35A:
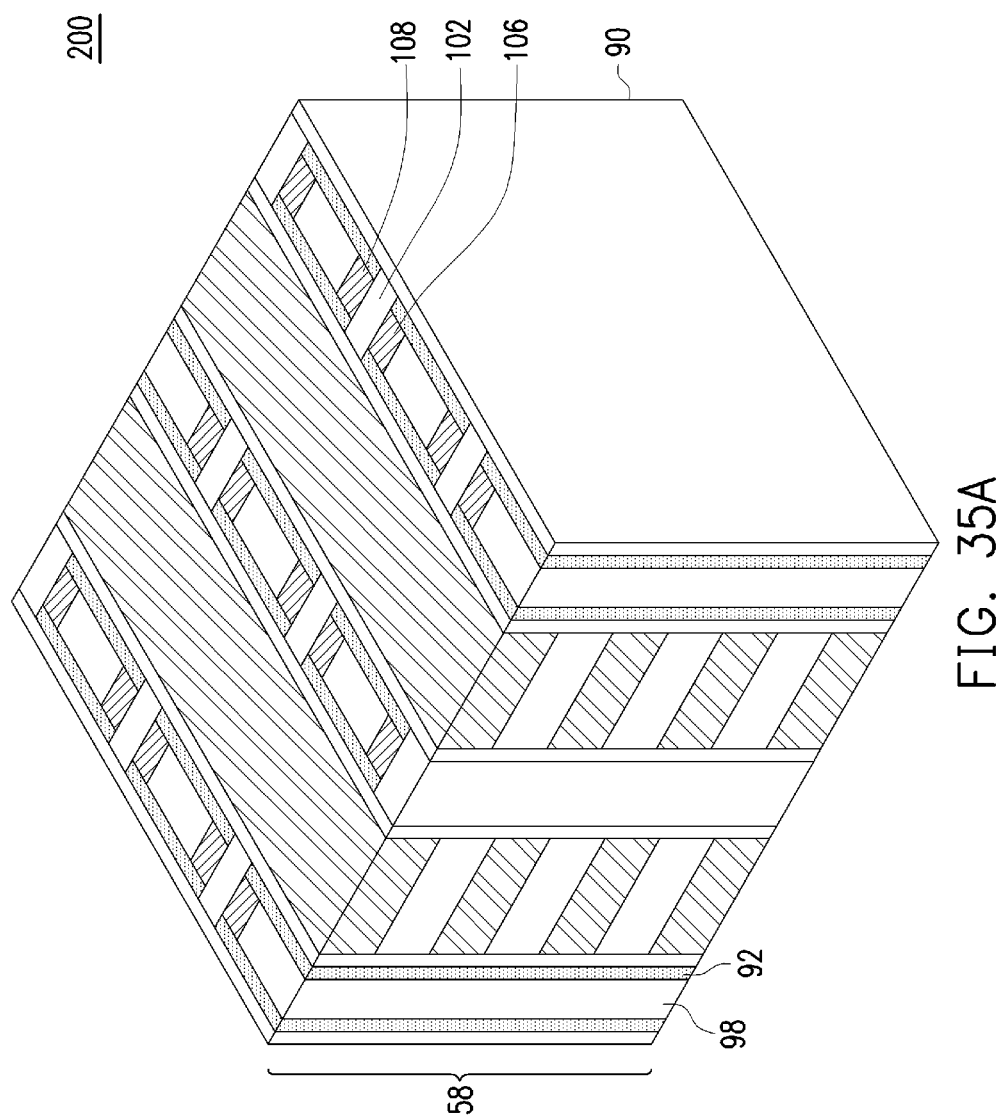
Figure 35B:
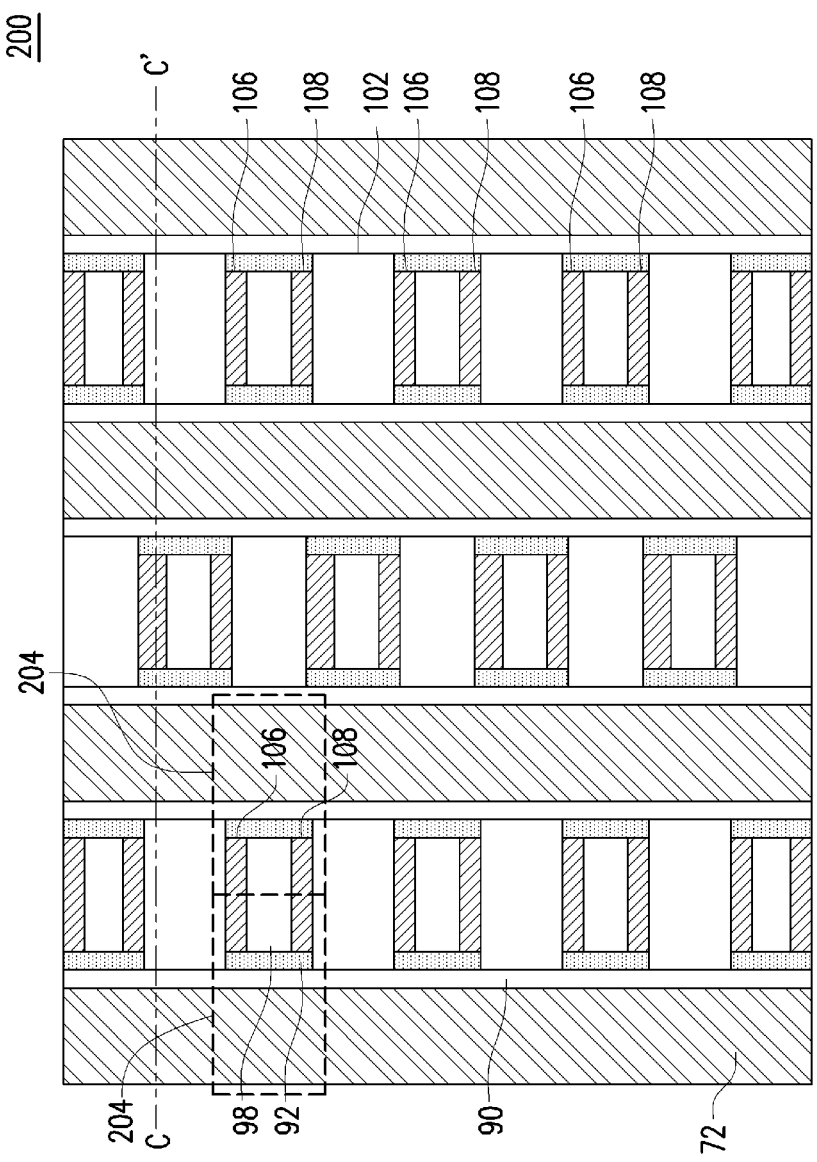
Figure 35C:
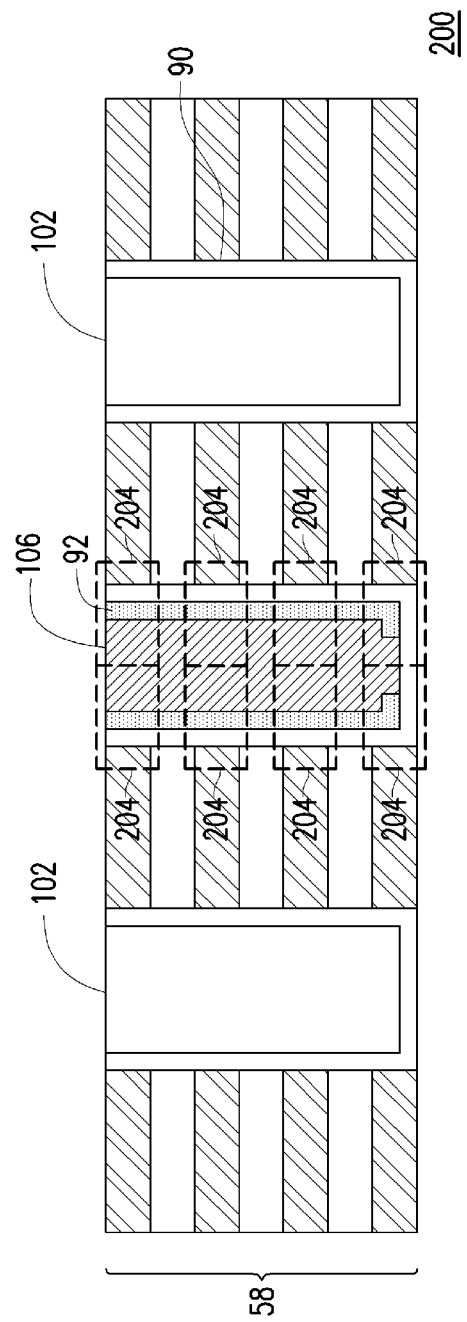

In FIGS. 35A, 35B, and 35C the trenches 104 are filled with a conductive material to form the conductive lines 106 and 108. FIG. 35C illustrates a cross-sectional view of line C-C' in FIG. 35B. The conductive lines 106 and 108 may each comprise a conductive material, such as, a copper-based alloy or a copper-aluminum-based alloy with a minor metal having high oxidibility (e.g., Zn, Si, Mg, Ca, Ni, Co, Mo, Ti, W). For example, in some embodiments, the conductive lines 106 and 108 may comprise an alloy of Cu (or CuAl) and Zn, Si, Mg, Ca, Ni, Co, Mo, Ti, W, or the like. A percentage of the minor metal in the conductive lines 106 and 108 may be in a range of about 0.1 at % to about 10 at %. It has been observed that by including the minor metal in the above amount, the conductive lines 106 and 108 may maintain a low resistivity (e.g., less than about 10 mil per cm) even after annealing at a temperature of about 300° C. to about 500° C. in a nitrogen ($N_2$) environment for an hour. As such, the conductive lines 106 and 108 may be more robust and capable of sustaining subsequent processing due to their material being less susceptible to oxidation or copper diffusion than pure metal. The copper based alloy may further improve current driving in the TFTs 204.

After the conductive lines 106 and 108 are deposited, a planarization (e.g., a CMP, etch back, or the like) may be performed to remove excess portions of the conductive material, thereby forming the conductive lines 106 and 108. In the resulting structure, top surfaces of the multi-layer stack 58, the memory film 90, the OS layer 92, the conductive lines 106, and the conductive lines 108 may be substantially level (e.g., within process variations). The conductive lines 106 may correspond to bit lines in the memory array, and the conductive lines 108 may correspond to source lines in the memory array 200. Although FIG. 35C illustrates a cross-sectional view that only shows the conductive lines 106, a cross-sectional view of the conductive lines 108 may be similar.

Thus stacked TFTs 204 may be formed in the memory array 200. Each TFT 204 comprises a gate electrode (e.g., a portion of a corresponding conductive line 72), a gate dielectric (e.g., a portion of a corresponding memory film 90), a channel region (e.g., a portion of a corresponding OS layer 92), and source and drain electrodes (e.g., portions of corresponding conductive lines 106 and 108). The dielectric material 102 isolates adjacent TFTs 204 in a same column and at a same vertical level. The TFTs 204 may be disposed in an array of vertically stacked rows and columns. Subsequent processing similar to that described above may be performed to form interconnections from the conductive lines 72, 106, and 108 to underlying circuitry of the device and arrive at a similar structure as described above in FIGS. 30A through 30D.

Various embodiments provide a 3D memory array with vertically stacked memory cells. The memory cells each comprise a TFT with a memory film, gate dielectric material and an oxide semiconductor channel region. The TFT comprises source/drain electrodes, which are also source lines and bits lines in the memory array. In some embodiments, the source lines and bit lines in the memory array maybe formed of a material that reduces contact resistance in the memory cells.

For example, in some embodiments, the source lines and bit lines may comprise a low work function material (e.g., less than 4.6). As part of forming the source lines and bit lines, an annealing process may be performed to form a poly-crystalline, metal-comprising region in the channel region at a boundary between the channel region and the source/bit lines. As a result, the poly-crystalline region touching the source/bit lines may be a low resistivity region regardless of the phase (e.g., crystalline or amorphous) of remaining portions of the channel region, thereby reducing contact resistance in the TFTs. In some embodiments, the source/bit lines may comprise a copper-based alloy with a low resistivity with a reduced tendency to oxidize (e.g., less susceptible to oxidation than pure copper). In embodiments where the source and bits lines comprise a copper based alloy with low resistivity, current driving may further be improved.

In some embodiments, a memory cell includes a thin film transistor over a semiconductor substrate, the thin film transistor including: a memory film contacting a word line; and an oxide semiconductor (OS) layer contacting a source line and a bit line, wherein the memory film is disposed between the OS layer and the word line, wherein the source line and the bit line each comprise a first conductive material touching the OS layer, and wherein the first conductive material has a work function less than 4.6. The memory cell further includes a dielectric material separating the source line and the bit line. Optionally, in some embodiments, the first conductive material comprises LaNiO, InSnO, InZnO, CdSnO, Al-doped ZnO, or F—SnO. Optionally, in some embodiments, the source line and the bit line each comprise a second conductive material on an opposing side of the first conductive material as the OS layer, wherein the second conductive material is different from the first conductive material. Optionally, in some embodiments, the second conductive material comprises TiN, W, Ti, MoTi, CuMgAl, Ru, Al, Ta, TaN, CuMn, or CuAlZn. Optionally, in some embodiments, the OS layer comprises: a first poly-crystalline region at an interface between the OS layer and the source line; and a second poly-crystalline region at an interface between the OS layer and the bit line. Optionally, in some embodiments, the first poly-crystalline region comprises a metal oxide, and wherein a metal element of the first poly-crystalline region is the same as a metal element of the first conductive material. Optionally, in some embodiments, a thickness of the first poly-crystalline region is in a range of 1 nm to 10 nm. Optionally, in some embodiments, the first conductive material extends continuously from the OS layer to a second OS layer, the second OS layer is on an opposing side of the first conductive material as the OS layer.

In some embodiments, a device includes a semiconductor substrate; a first memory cell over the semiconductor substrate, the first memory cell comprising a first thin film transistor. The first thin film transistor comprises: a gate electrode comprising a portion of a first word line; a first portion of a ferroelectric material, the first portion of the ferroelectric material being on a sidewall of the first word line; and a first channel region on a sidewall of the ferroelectric material; a source line, wherein a first portion of the source line provides a first source/drain electrode for the first thin film transistor, wherein the source line comprises a copper alloy, and wherein the copper alloy comprises a first metal different than copper; a bit line, wherein a first portion of the bit line provides a second source/drain electrode for the first thin film transistor, and wherein the bit line comprises the copper alloy; and a second memory cell over the first memory cell. Optionally, in some embodiments, the first metal is Zn, Si, Mg, Ca, Ni, Co, Mo, Ti, or W. Optionally, in some embodiments, an amount of the first metal in the copper alloy is in a range of 0.1 at % to 10 at %. Optionally, in some embodiments, the copper alloy further comprises aluminum. Optionally, in some embodiments, a resistivity of the copper alloy is less than 10 mΩ per cm.

In some embodiments, a method includes patterning a first trench extending through a first conductive line; depositing a memory film along sidewalls and a bottom surface of the first trench; depositing an oxide semiconductor (OS) layer over the memory film, the OS layer extending along the sidewalls and the bottom surface of the first trench; depositing a first dielectric material over and contacting the OS layer; patterning a second trench extending through the first dielectric material; depositing a first conductive material in the second trench; and annealing the first conductive material and the OS layer to form a poly-crystalline region at an interface between the OS layer and the first conductive material. Optionally, in some embodiments, the first conductive material comprises TiN, W, Ti, MoTi, CuMgAl, Ru, Al, Ta, TaN, CuMn, or CuAlZn. Optionally, in some embodiments, annealing the first conductive material and the OS layer comprises annealing the first conductive material and the OS layer at a temperature of at least 300° C. Optionally, in some embodiments, annealing the first conductive material and the OS layer causes a reaction between an indium oxide component of the OS layer and a metal component of the first conductive material such that the poly-crystalline region comprises a metal oxide. Optionally, in some embodiments, the method further includes after annealing the first conductive material, patterning a third trench through the first conductive material, wherein remaining portions the first conductive material are disposed on opposing sidewalls of the third trench; and filling the third trench with a second conductive material different form the first conductive material. Optionally, in some embodiments, the second conductive material comprises TiN, W, Ti, MoTi, CuMgAl, Ru, Al, Ta, TaN, CuMn, CuAlZn. Optionally, in some embodiments, the method further includes patterning a fourth trench through the first conductive material; and filling the fourth trench with a second dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell comprising:
   a thin film transistor over a semiconductor substrate, the thin film transistor comprising:
   a memory film contacting a word line; and
   an oxide semiconductor (OS) layer contacting a source line and a bit line, wherein the memory film is disposed between the OS layer and the word line, wherein the source line and the bit line are each physically separated from the memory film by the OS layer, wherein the source line and the bit line each comprise a first conductive material touching the OS layer, and wherein the first conductive material has a work function less than 4.6; and
   a dielectric material separating the source line and the bit line.

2. The memory cell of claim 1, wherein the first conductive material comprises a material selected from the group consisting of LaNiO, InSnO, InZnO, CdSnO, Al- doped ZnO, and F-SnO.

3. The memory cell of claim 1, the source line and the bit line each comprise a second conductive material on side of the first conductive material that is opposite to the OS layer, wherein the second conductive material is different from the first conductive material.

4. The memory cell of claim 3, the second conductive material comprises a material selected from the group consisting of TiN, W, Ti, MoTi, CuMgAl, Ru, Al, Ta, TaN, CuMn, and CuAlZn.

5. The memory cell of claim 1, wherein the OS layer comprises:
   a first poly-crystalline region at an interface between the OS layer and the source line; and
   a second poly-crystalline region at an interface between the OS layer and the bit line.

6. The memory cell of claim 5, wherein the first poly-crystalline region comprises a metal oxide, and wherein a metal element of the first poly-crystalline region is the same as a metal element of the first conductive material.

7. The memory cell of claim 5, wherein a thickness of the first poly-crystalline region is in a range of 1 nm to 10 nm.

8. The memory cell of claim 1, wherein the first conductive material of the source line extends continuously from the OS layer to a second OS layer, the second OS layer is on side of the first conductive material that is opposite to the OS layer, the second OS layer being physically separated from the OS layer by the dielectric material.

9. A device comprising:
   a semiconductor substrate;
   a first memory cell over the semiconductor substrate, the first memory cell comprising a first thin film transistor, wherein the first thin film transistor comprises:
   a gate electrode comprising a portion of a first word line;
   a first portion of a ferroelectric material, the first portion of the ferroelectric material being on a sidewall of the first word line; and
   a first channel region on a sidewall of the ferroelectric material, the first channel region being disposed in an oxide semiconductor (OS) material;
   a source line, wherein a first portion of the source line provides a first source/drain electrode for the first thin film transistor, wherein the source line comprises a copper alloy, and wherein the copper alloy comprises a first metal different than copper, and wherein the source line overlaps the OS material in a cross-sectional view;
   a bit line, wherein a first portion of the bit line provides a second source/drain electrode for the first thin film transistor, and wherein the bit line comprises the copper alloy, wherein the bit line overlaps a lower region of the OS material in a cross-sectional view, and wherein the bit line extends through the lower region of the OS material that is overlapped by the bit line in the cross-sectional view; and
   a second memory cell over the first memory cell.

10. The device of claim 9, wherein the first metal is Zn, Si, Mg, Ca, Ni, Co, Mo, Ti, or W.

11. The device of claim 10, wherein an amount of the first metal in the copper alloy is in a range of 0.1 at % to 10 at %.

12. The device of claim 10, wherein the copper alloy further comprises aluminum.

13. The device of claim 10, wherein a resistivity of the copper alloy is less than 10 mΩ per cm.

14. A device comprising:
a thin film transistor over a semiconductor substrate, the thin film transistor comprising:
  a memory film contacting a word line; and
  an oxide semiconductor (OS) material contacting a source line and a bit line, wherein the memory film is disposed between the OS material and the word line, wherein the source line and the bit line each comprise:
    a first conductive material, wherein a first region of the OS material that contacts the first conductive material has a different phase than a second region of the OS material not contacting the first conductive material; and
    a second conductive material different from the first conductive material; and
a dielectric material insulating the source line from the bit line, wherein a first sidewall of the first conductive material of the bit line is coterminous with a second sidewall of the first conductive material of the source line and a third sidewall of the dielectric material in a top-down view.

15. The device of claim 14, wherein the first conductive material has a work function less than 4.6.

16. The device of claim 15, wherein the first conductive material comprises a material selected from the group consisting of LaNiO, InSnO, InZnO, CdSnO, Al-doped ZnO, and F-SnO.

17. The device of claim 16, wherein second conductive material comprises a material selected from the group consisting of TiN, W, Ti, MoTi, CuMgAl, Ru, Al, Ta, TaN, CuMn, and CuAlZn.

18. The device of claim 14, wherein the first region of the OS material is poly-crystalline, and wherein the second region of the OS material is amorphous.

19. The device of claim 14, wherein a thickness of OS material is in a range of 1 nm to 10 nm.

20. The device of claim 14, wherein a fourth sidewall of the first conductive material of the bit line is coterminous with a fifth sidewall of the second conductive material of the bit line and a sixth sidewall of the OS material in the top-down view.

* * * * *

UNITED STATES PATENT AND TRADEMARK OFFICE
CERTIFICATE OF CORRECTION

PATENT NO. : 11,729,987 B2
APPLICATION NO. : 17/119409
DATED : August 15, 2023
INVENTOR(S) : Kuo-Chang Chiang et al.

It is certified that error appears in the above-identified patent and that said Letters Patent is hereby corrected as shown below:

In the Claims

Claim 2, Column 20, Line 5; delete "Al- doped" and insert --Al-doped--

Claim 3, Column 20, Line 8; delete "on side" and insert --on a side--

Claim 7, Column 20, Line 27; delete "1 nm to 10 nm" and insert --1nm to 10nm--

Claim 8, Column 20, Lines 30-31; delete "on side" and insert --on a side--

Claim 11, Column 20, Lines 66-67; delete "0.1 at % to 10 at %" and insert --0.1 at% to 10 at%--

Claim 19, Column 22, Line 18; delete "1 nm to 10 nm" and insert --1nm to 10nm--

Signed and Sealed this
Seventh Day of November, 2023

Katherine Kelly Vidal
*Director of the United States Patent and Trademark Office*